US011927462B2

(12) United States Patent
Banhegyesi et al.

(10) Patent No.: US 11,927,462 B2
(45) Date of Patent: *Mar. 12, 2024

(54) METERING ASSEMBLY, SWITCHBOARD CASE, ADAPTER CRADLE AND METHOD OF USE

(71) Applicant: Electro Industries/Gauge Tech, Westbury, NY (US)

(72) Inventors: Tibor Banhegyesi, Northport, NY (US); Edward Martinez, Roosevelt, NY (US)

(73) Assignee: EI ELECTRONICS LLC, Westbury, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/689,053

(22) Filed: Mar. 8, 2022

(65) Prior Publication Data
US 2022/0205811 A1 Jun. 30, 2022

Related U.S. Application Data

(63) Continuation of application No. 16/712,224, filed on Dec. 12, 2019, now Pat. No. 11,300,424.
(Continued)

(51) Int. Cl.
G01D 4/00 (2006.01)
G01R 21/133 (2006.01)
H02G 3/08 (2006.01)

(52) U.S. Cl.
CPC .......... *G01D 4/004* (2013.01); *G01R 21/133* (2013.01); *H02G 3/088* (2013.01)

(58) Field of Classification Search
CPC ........ H02G 3/088; H02G 3/14; G01R 21/133; G01R 1/04; G01D 4/004; Y02B 90/20; Y04S 20/30
(Continued)

(56) References Cited

U.S. PATENT DOCUMENTS

D56,045 S 8/1920 White
D76,149 S 2/1924 Olsen
(Continued)

OTHER PUBLICATIONS

BE1-951 Multifunction Protection System, Basler Electric, Sep. 2012 pp. 1-12.
(Continued)

Primary Examiner — John H Le
(74) Attorney, Agent, or Firm — Robinson & Cole LLP

(57) ABSTRACT

A metering assembly, switchboard case, adapter cradle and method of use are provided. A metering assembly of the present disclosure includes an intelligent electronic device (IED) disposed in a switchboard case. The switchboard case includes an enclosure which is connected to an electrical distribution system and a cover. The IED is mounted in a cradle which is removable from the enclosure. The cradle, or adaptor, interconnects electronics of the IED with an electrical circuit of the electrical distribution system. The cover includes a sealing mechanism which prevents removal of the cover and indicates when the cover has been tampered with. The cover further includes a sealed input/output interface which interconnects with input/output means of the IED disposed with the switchboard case. The enclosure and/or the cover have a gasket to seal the cover to the enclosure to making the switchboard case water-tight and enabled for used in outdoor applications.

19 Claims, 44 Drawing Sheets

Related U.S. Application Data

(60) Provisional application No. 62/778,640, filed on Dec. 12, 2018.

(58) Field of Classification Search
USPC .......................................................... 702/61
See application file for complete search history.

(56) References Cited

U.S. PATENT DOCUMENTS

| | | | |
|---|---|---|---|
| 1,705,301 A | 3/1929 | Miller | |
| D187,740 S | 4/1960 | Littlejohn | |
| D199,808 S | 12/1964 | Road | |
| D201,100 S | 5/1965 | Little | |
| 3,408,617 A | 10/1968 | Broyles | |
| D241,006 S | 8/1976 | Wallace | |
| D273,574 S | 4/1984 | Overs | |
| 5,025,526 A | 6/1991 | Ichitsubo et al. | |
| D332,923 S | 2/1993 | Polydoris et al. | |
| D343,786 S | 2/1994 | Hines et al. | |
| D348,019 S | 6/1994 | Kocol et al. | |
| D366,434 S | 1/1996 | Brown, III et al. | |
| 5,581,470 A | 12/1996 | Pawloski | |
| D427,533 S | 7/2000 | Cowan et al. | |
| D429,655 S | 8/2000 | Cowan et al. | |
| D435,471 S | 12/2000 | Simbeck et al. | |
| D439,535 S | 3/2001 | Cowan et al. | |
| D443,541 S | 6/2001 | Hancock et al. | |
| D455,066 S | 4/2002 | Kolinen | |
| D458,863 S | 6/2002 | Harding et al. | |
| D459,259 S | 6/2002 | Harding et al. | |
| 6,476,595 B1 | 11/2002 | Heuell et al. | |
| 6,476,729 B1 | 11/2002 | Liu | |
| 6,745,138 B2 | 6/2004 | Przydatek et al. | |
| 6,751,563 B2 | 6/2004 | Spanier et al. | |
| D499,380 S | 12/2004 | Washino et al. | |
| D525,893 S | 8/2006 | Kagan et al. | |
| D526,920 S | 8/2006 | Kagan et al. | |
| 7,184,904 B2 | 2/2007 | Kagan | |
| D545,181 S | 6/2007 | Kagan et al. | |
| 7,271,996 B2 | 9/2007 | Kagan et al. | |
| 7,417,419 B2 | 8/2008 | Tate | |
| D594,418 S | 6/2009 | Fujino et al. | |
| D595,656 S | 7/2009 | Huang | |
| D614,576 S | 4/2010 | Chiang | |
| 7,747,733 B2 | 6/2010 | Kagan | |
| 7,868,782 B2 | 1/2011 | Ehrke et al. | |
| D634,275 S | 3/2011 | Bower | |
| D642,083 S | 7/2011 | Blanc et al. | |
| 7,994,934 B2 | 8/2011 | Kagan | |
| D653,572 S | 2/2012 | Ohtani et al. | |
| 8,176,174 B2 | 5/2012 | Kagan | |
| D666,933 S | 9/2012 | Hoffman et al. | |
| D670,292 S | 11/2012 | Komatani et al. | |
| 8,310,403 B2 | 11/2012 | Nahar | |
| 8,325,057 B2 | 12/2012 | Salter | |
| D682,720 S | 5/2013 | Kagan et al. | |
| D682,721 S | 5/2013 | Kagan et al. | |
| 8,442,660 B2 | 5/2013 | Kagan | |
| 8,587,949 B2 | 11/2013 | Banhegyesi et al. | |
| D706,659 S | 6/2014 | Banhegyesi et al. | |
| D706,660 S | 6/2014 | Banhegyesi et al. | |
| D708,082 S | 7/2014 | Banhegyesi et al. | |
| D708,533 S | 7/2014 | Banhegyesi et al. | |
| D742,832 S | 11/2015 | Mikawa | |
| 10,754,096 B2 | 8/2020 | Murray et al. | |
| 11,300,424 B2* | 4/2022 | Banhegyesi | H02G 3/088 |
| 2002/0162014 A1 | 10/2002 | Przydatek et al. | |
| 2004/0138786 A1 | 7/2004 | Blackett et al. | |
| 2005/0282431 A1 | 12/2005 | Matthews | |
| 2007/0038394 A1* | 2/2007 | Gagnon | G06Q 50/06 |
| | | | 702/61 |
| 2012/0010831 A1 | 1/2012 | Kagan | |
| 2013/0031201 A1 | 1/2013 | Kagan et al. | |
| 2013/0119974 A1* | 5/2013 | Chamarti | G01R 22/066 |
| | | | 324/110 |
| 2016/0252367 A1 | 9/2016 | Banhegyesi et al. | |
| 2016/0370204 A1 | 12/2016 | Spanier et al. | |

OTHER PUBLICATIONS

Jemstar High Accuracy Revenue Meter For Generation, Transmission, and Industrial Power Measurement, Ametek Power Instruments, 2012, pp. 1-2.

Jemstar Retrofit For Generation, Transmission, and Industrial Power Measurement, Ametek Power Instruments, 2007, pp. 1-2.

Mark-V EMS60 Intelligent Energy Meter, Advanced High-Accuracy Meter With Integrated Data Telemetry Solutions and Power Quality Monitoring, Transdata Energy Metering and Automation, 2010, pp. 1-2.

NEW! SWB3 Switchboard Case for the Nexus 1272/1262 Meter, dated Jul. 17, 2020, [online], [site visited Nov. 30, 2015]. Available fromInternet, URL: https://www.youtube.com/watch?v=XRjk5E60GUg (Year: 2020).

Powerlogic ION8650, Schneider Electric, 2011, pp. 1-12.

Replacing GE OS 64 with ION 7300 (Schneider) using SUSI Adapter, dated Jan. 22, 2013, [online], [site visited Nov. 30, 2015]. Availablefrom Internet, U RL: https://www.youtube.com/watch?v=dtvLOjEeQy4&list=U UGGMUcRPnbYjpuLidz7L4Eg (Year: 2013).

Replacing JEMSTAR with an ION 8650 Schneider Meter, dated Dec. 22, 2015, [online], [site visited Nov. 30, 2015]. Available fromInternet, U RL: https://www.youtube.com/watch?v=apNBjAjipNc (Year: 2015).

Shark 270 Draw Out Switchboard Case Energy Meter—SWB3, No date available, [online], [site visited Nov. 30, 2015]. Available fromInternet, U RL: https://www.electroi nd .com/products/shark-270-draw-out-switchboard-case-energy-meter -swb3/ (Year: 2020).

Nexus 1262/1272 High Performance Utility Billing Meters With Communication & Advanced Power Quality, Electro Industries/Gaugetech, Jun. 21, 2012, pp. 1-12.

Nexus 1262/1272 Switchboard Meter Quick Start, Electro Industries-Gaugetech, Aug. 31, 2012, pp. 1-4.

* cited by examiner

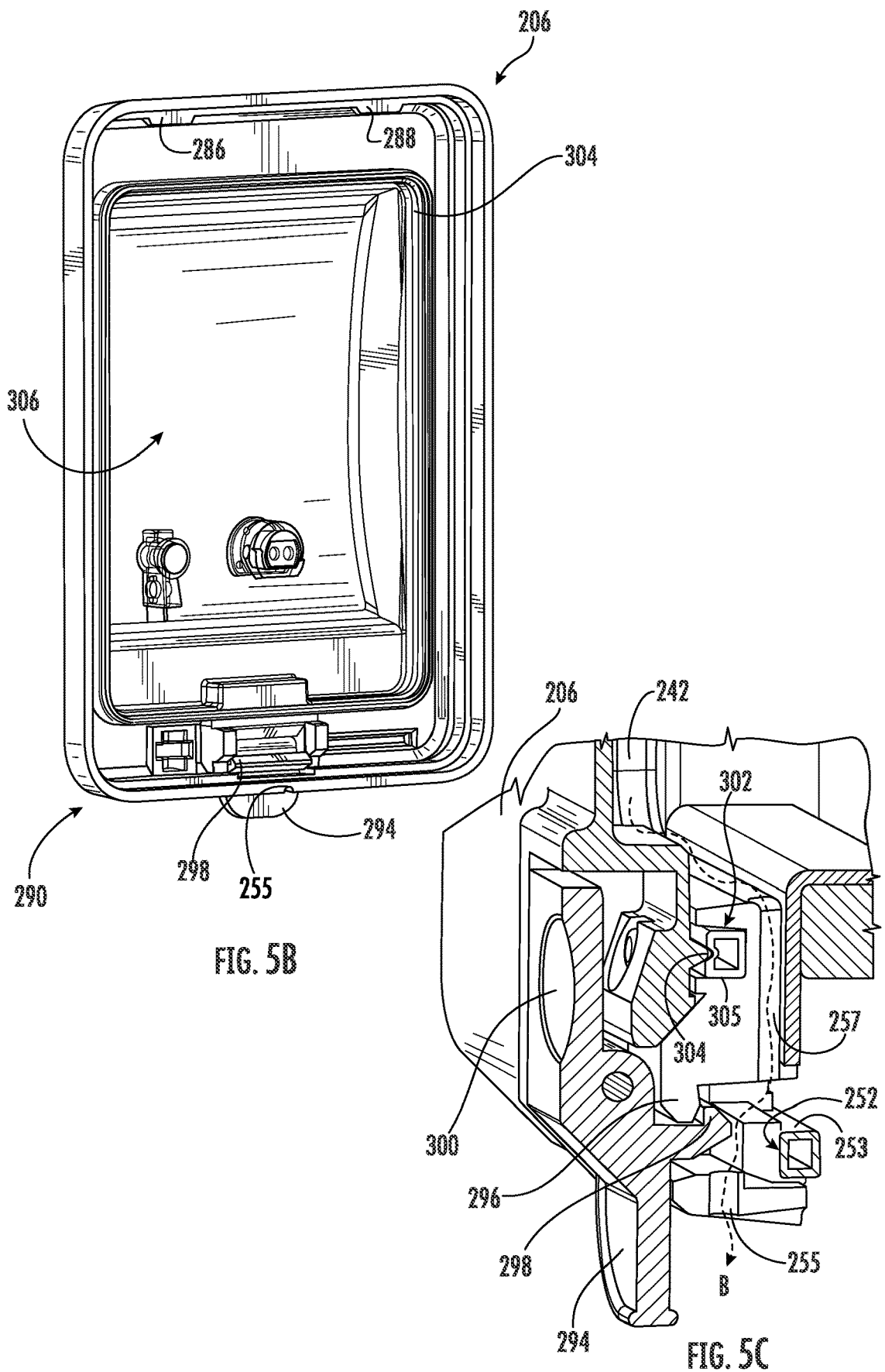

METERING ASSEMBLY, SWITCHBOARD CASE, ADAPTER CRADLE AND METHOD OF USE

PRIORITY

This application is a continuation application of U.S. application Ser. No. 16/712,224, filed Dec. 12, 2019, now U.S. Pat. No. 11,300,424, which claims priority to U.S. Provisional Patent Application Ser. No. 62/778,640, filed Dec. 12, 2018, the contents of which are hereby incorporated by reference in its entirety.

BACKGROUND

Field

The present disclosure relates generally to intelligent electronic devices (IEDs), such as electrical metering devices, and more particularly, to a metering assembly, meter switchboard case, adapter cradle and method of use.

Description of the Related Art

Monitoring of electrical energy by consumers and providers of electric power is a fundamental function within any electric power distribution system. Electrical energy may be monitored for purposes of usage, equipment performance and power quality. Electrical parameters that may be monitored include volts, amps, watts, vars, power factor, harmonics, kilowatt hours, kilovar hours and any other power related measurement parameters. Typically, measurement of the voltage and current at a location within the electric power distribution system may be used to determine the electrical parameters for electrical energy flowing through that location.

Devices that perform monitoring of electrical energy may be electromechanical devices, such as, for example, a residential billing meter or may be an intelligent electronic device ("IED"). Intelligent electronic devices typically include some form of a processor. In general, the processor is capable of using the measured voltage and current to derive the measurement parameters. The processor operates based on a software configuration. A typical consumer or supplier of electrical energy may have many intelligent electronic devices installed and operating throughout their operations. IEDs may be positioned along the supplier's distribution path or within a customer's internal distribution system. IEDs include revenue electric watt-hour meters, protection relays, programmable logic controllers, remote terminal units, fault recorders and other devices used to monitor and/or control electrical power distribution and consumption. IEDs are widely available that make use of memory and microprocessors to provide increased versatility and additional functionality. Such functionality includes the ability to communicate with remote computing systems, either via a direct connection, e.g., a modem, a wireless connection or a network. IEDs also include legacy mechanical or electromechanical devices that have been retrofitted with appropriate hardware and/or software allowing integration with the power management system.

Typically, an IED is associated with a particular load or set of loads that are drawing electrical power from the power distribution system. The IED may also be capable of receiving data from or controlling its associated load. Depending on the type of IED and the type of load it may be associated with, the IED implements a power management function that is able to respond to a power management command and/or generate power management data. Power management functions include measuring power consumption, controlling power distribution such as a relay function, monitoring power quality, measuring power parameters such as phasor components, voltage or current, controlling power generation facilities, computing revenue, controlling electrical power flow and load shedding, or combinations thereof.

SUMMARY

A metering assembly, meter switchboard case, adapter cradle and method of use are provided.

A metering assembly of the present disclosure includes an intelligent electronic device (IED) or meter disposed in a switchboard case. The switchboard case includes an enclosure which is physically mounted and connected to an electrical distribution system and a cover. The IED or meter is mounted in a cradle which is removable from the switchboard enclosure. The cradle, or adaptor, interconnects electronics of the IED or meter with an electrical circuit of the electrical distribution system. The cradle contains electrical connections on the bottom which mate with matching electrical connectors inside the enclosure when the cradle is slid into place. The cover completely seals the meter electronics inside the enclosure. The cover further includes a sealing mechanism which prevents removal of the cover and indicates when the cover has been tampered with. The cover further includes a sealed input/output interface which interconnects with input/output means of the meter electronics disposed with the switchboard case. The switchboard enclosure and/or the cover have a gasket to seal the cover to the enclosure to making the switchboard case water-tight and enabled for used in outdoor applications.

According to one aspect of the present disclosure, a metering assembly is provided that includes an enclosure having at least one first electrical connection disposed on an inner surface thereof, the at least one electrical connection coupled to at least one second electrical connection disposed on an outer surface of the enclosure, the at least one second electrical connection configured to be coupled to an electrical power distribution service; a cradle configured for housing an intelligent electronic device (IED) and for being disposed in the enclosure, the cradle including at least one third electrical connection for coupling to the at least one first electrical connection, the at least one third electrical connection being coupled to at least one component of the IED; and a cover configured to couple to an open end of the enclosure to enclose the IED in the enclosure.

In another aspect, the IED is at least one of a Programmable Logic Controller (PLC), a Remote Terminal Units (RTU), an electric power meter, a panel meter, a protective relay, a fault recorder, a phase measurement unit, a serial switch, and a smart input/output device.

In a further aspect of the metering assembly, the enclosure further includes an alignment mechanism for aligning a portion of the cradle within the enclosure.

In another aspect, the alignment mechanism is a board having a first surface and a second surface, the first surface including at least one alignment member that aligns with at least one aperture on the cradle and at least one first connector that couples with a complementary connector on the cradle, the second surface including at least one second connector coupled to the at least one first connector, wherein the at least one second connector extending through a rear surface of the enclosure.

In yet another aspect, the at least one first connector is a RJ45 plug.

In still another aspect, the at least one aperture and the complementary connector are disposed on a connection frame of the cradle, the connection frame configured to move within the cradle when the at least one alignment member interacts with the at least one aperture to align the at least one first connector to the complementary connector.

In a further aspect, the connection frame includes at least one spring arm that enables the connection frame to move within a plane of a surface of the cradle.

In one aspect, the complimentary connector is coupled to at least one component of the IED.

In yet another aspect, the at least one component of the IED includes at least one function module disposed in the IED.

In a further aspect, the at least one component of the IED includes at least one communication module disposed in the IED.

According to another aspect of the present disclosure, a connection paddle is configured to be disposed between the enclosure and the cradle for electrically coupling the at least one first electrical connection to the at least one third electrical connection.

In one aspect, the connection paddle includes a pivoting handle, wherein the pivoting handle is configured to extend beyond a plane of the enclosure when disposed in the enclosure to facilitate removal.

In another aspect, the connection paddle includes at least one grasping aperture configured to receive at least one member to grasp the connection paddle to facilitate removal of the connection paddle when disposed in the enclosure.

In a further aspect, the cradle further includes at least one gripping member to facilitate removal of the cradle from the enclosure.

In yet another aspect, the enclosure further includes a plate extending from the periphery of an open end of the enclosure including a first surface and a second surface, the second surface of the plate configured to make contact and secure the enclosure to a panel after the enclosure is disposed in a cutout of the panel, the second surface includes a channel configured to receive a gasket that prevents water from reaching the enclosure when secured to the panel.

In still another aspect, the enclosure further includes at least one mounting bracket coupled to a side wall of the enclosure, the at least one mounting bracket configured to receive a screw that makes contact with a rear surface of the panel causing the at least one mounting bracket and the enclosure to move away from the rear surface of the panel securing the plate to the opposite surface of the panel.

In one aspect, the first surface of the plate includes a channel that surrounds the opening to the enclosure and the cover further includes a corresponding lip configured on an inner surface of the cover so when the cover is placed on the plate the lip is disposed in the channel, wherein a gasket is disposed in the channel so when the cover is mounted on the plate, the gasket is compressed between the channel and the corresponding lip forming a water-tight seal preventing water or any other substance from entering the enclosure.

In another aspect, the cover further includes a one-button release mechanism to facilitate removing the cover from the enclosure.

In a further aspect, the cover further includes a sealing mechanism to prevent access to the IED disposed in the enclosure and to indicate tampering.

In yet another aspect of the metering assembly, a retaining member disposed on the cradle and configured to maintain the at least one third electrical connection of the cradle at an appropriate position so that when the cradle is disposed in the enclosure the at least one third electrical connection of cradle does not make contact with the at least one first electrical connection of the enclosure.

BRIEF DESCRIPTION OF THE DRAWINGS

These and other objects, features and advantages of the present disclosure will be apparent from a consideration of the following Detailed Description considered in conjunction with the drawing Figures, in which:

FIG. 5B is a rear, perspective view of the cover shown in FIG. 4.

FIG. 5C is a cross sectional view of a lower portion of the cover disposed on a plate of the enclosure according to an embodiment of the present disclosure.

FIG. 7A is a perspective view of the connection paddle, FIG. 7B is a perspective view of the connection paddle with a handle extended, FIG. 7C is a top view of the connection paddle; FIG. 7D is a top view of the connection paddle with a handle extended, FIG. 7E is a bottom view of the connection paddle; FIG. 7F is a bottom view of the connection paddle with a handle extended and FIG. 7G is a side view of the connection paddle.

FIG. 7H is a perspective view of the connection paddle, FIG. 7I is a top view of the connection paddle and FIG. 7J is a side view of the connection paddle.

DETAILED DESCRIPTION

Embodiments of the present disclosure will be described herein below with reference to the accompanying drawings. In the following description, well-known functions or constructions are not described in detail to avoid obscuring the present disclosure in unnecessary detail. The word "exemplary" is used herein to mean "serving as an example, instance, or illustration." Any configuration or design described herein as "exemplary" is not necessarily to be construed as preferred or advantageous over other configurations or designs. Herein, the phrase "coupled" is defined to mean directly connected to or indirectly connected with through one or more intermediate components. Such intermediate components may include both hardware and software based components.

It is further noted that, unless indicated otherwise, all functions described herein may be performed in either hardware or software, or some combination thereof. In one embodiment, however, the functions are performed by at least one processor, such as a computer or an electronic data processor, digital signal processor or embedded microcontroller, in accordance with code, such as computer program code, software, and/or integrated circuits that are coded to perform such functions, unless indicated otherwise.

It should be appreciated that the present disclosure can be implemented in numerous ways, including as a process, an apparatus, a system, a device, a method, or a computer readable medium such as a computer readable storage medium or a computer network where program instructions are sent over optical or electronic communication links.

As used herein, intelligent electronic devices ("IEDs") can be any device that senses electrical parameters and computes data including, but not limited to, Programmable Logic Controllers ("PLC's"), Remote Terminal Units ("RTU's"), electric power meters, panel meters, protective relays, fault recorders, phase measurement units, serial switches, smart input/output devices and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power that they are metering.

Figure 1:
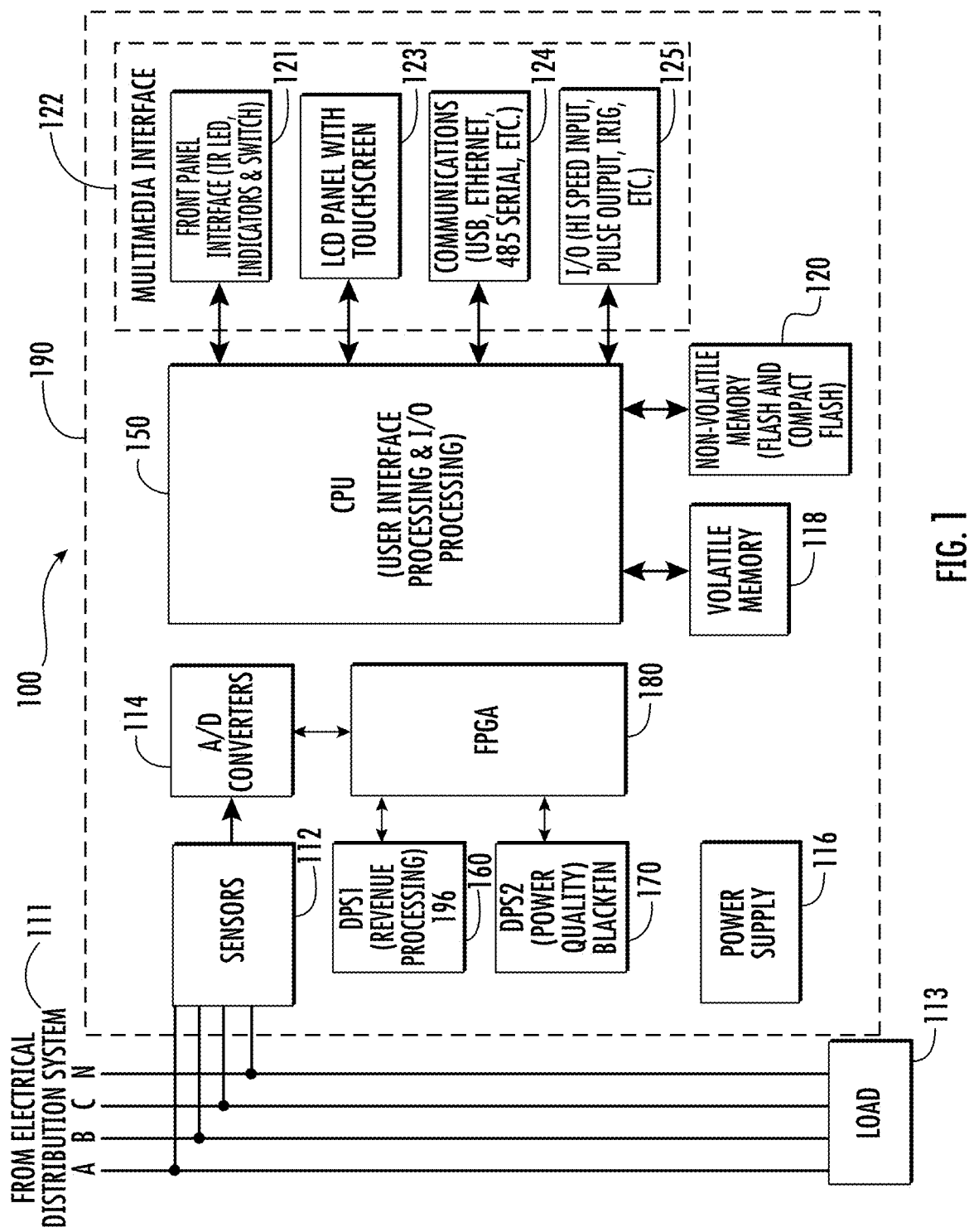
FIG. 1 is a block diagram of an intelligent electronic device (IED) according to an embodiment of the present disclosure.

FIG. 1 is a block diagram of an intelligent electronic device (IED) 10 for monitoring and determining power usage and power quality for any metered point within a power distribution system and for providing a data transfer system for faster and more accurate processing of revenue and waveform analysis.

The IED 100 of FIG. 1 includes a plurality of sensors 112 coupled to various phases A, B, C and neutral N of an electrical distribution system 111, a plurality of analog-to-digital (A/D) converters 114, including inputs coupled to the sensor 112 outputs, a power supply 116, a volatile memory 118, a non-volatile memory 120, a multimedia user interface 122, and a processing system that includes at least one of a central processing unit (CPU) 150 (or host processor) and/or one or more digital signal processors, two of which are shown, i.e., DSP1 160 and DSP2 170. The IED 100 also includes a Field Programmable Gate Array 180 which performs a number of functions, including, but not limited to, acting as a communications gateway for routing data between the various processors 150, 160, 170, receiving data from the A/D converters 114, performing transient detection and capture and performing memory decoding for CPU 150 and/or the DSP processor 160. In one embodiment, the FPGA 180 is internally comprised of two dual port memories to facilitate the various functions. It is to be appreciated that the various components shown in FIG. 1 are contained within housing 190.

The plurality of sensors 112 sense electrical parameters, e.g., voltage and current, on incoming lines, (i.e., phase A, phase B, phase C, neutral N), from an electrical power distribution system 111 e.g., an electrical circuit, that are coupled to at least one load 113 that consumes the power provided. In one embodiment, the sensors 112 may include current transformers and potential/voltage transformers, wherein one current transformer and one voltage transformer may be coupled to each phase of the incoming power lines. A primary winding of each transformer may be coupled to the incoming power lines and a secondary winding of each transformer may output a voltage representative of the sensed voltage and current. The output of each transformer may be coupled to the A/D converters 114 configured to convert the analog output voltage from the transformer to a digital signal that can be processed by the CPU 150, DSP1 160, DSP2 170, FPGA 180 or any combination thereof.

A/D converters 114 are respectively configured to convert an analog voltage output to a digital signal that is transmitted to a gate array, such as Field Programmable Gate Array (FPGA) 180. The digital signal is then transmitted from the FPGA 180 to the CPU 150 and/or one or more DSP processors 160, 170 to be processed in a manner to be described below.

The CPU 150 and/or DSP Processors 160, 170 are configured to operatively receive digital signals from the A/D converters 114 (see FIG. 1) to perform calculations necessary to determine power usage and to control the overall operations of the IED 100. In some embodiments, CPU 150, DSP1 160, DSP2 170 and FPGA 180 may be combined into a single processor, serving the functions of each component. In some embodiments, it is contemplated to use an Erasable Programmable Logic Device (EPLD) or a Complex Programmable Logic Device (CPLD) or any other programmable logic device in place of the FPGA 180. In some embodiments, the digital samples, which are output from the A/D converters 114, are sent directly to the CPU 150 and/or DSP processors 160, 170, effectively bypassing the FPGA 180 as a communications gateway, thus eliminating the need for FPGA 180 in certain embodiments.

The power supply 116 provides power to each component of the IED 100. In one embodiment, the power supply 116 is a transformer with its primary windings coupled to the incoming power distribution lines 111 and having windings to provide a nominal voltage, e.g., 5 VDC, +12 VDC and −12 VDC, at its secondary windings. In other embodiments, power may be supplied from an independent power source to the power supply 116. For example, power may be supplied from a different electrical circuit or an uninterruptible power supply (UPS).

In one embodiment, the power supply 116 may be a switch mode power supply in which the primary AC signal will be converted to a form of DC signal and then switched at high frequency, such as, for example, 100 Khz, and then brought through a transformer to step the primary voltage down to, for example, 5 Volts AC. A rectifier and a regulating circuit may then be used to regulate the voltage and provide a stable DC low voltage output. Other embodiments, such as, but not limited to, linear power supplies or capacitor dividing power supplies are also contemplated to be within the scope of the present disclosure.

The multimedia user interface 122 is shown coupled to the CPU 150 in FIG. 1 for interacting with a user and for communicating events, such as alarms and instructions to the user. The multimedia user interface 122 may include a display 123 for providing visual indications to the user and a front panel interface 121 including indictors, switches and various inputs. The display 123 may be embodied as a touch screen, a liquid crystal display (LCD), a plurality of LED number segments, individual light bulbs or any combination. The display may provide information to the user in the form of alpha-numeric lines, computer-generated graphics, videos, animations, etc. The multimedia user interface 122 further includes a speaker or audible output means for audibly producing instructions, alarms, data, etc. The speaker is coupled to the CPU 150 via a digital-to-analog converter (D/A) for converting digital audio files stored in a memory 118 or non-volatile memory 120 to analog signals playable by the speaker. An exemplary interface is disclosed and described in commonly owned U.S. Pat. No. 8,442,660, entitled "INTELLIGENT ELECTRONIC DEVICE HAVING AUDIBLE AND VISUAL INTERFACE", which claims priority to expired U.S. Provisional Patent Appl. No. 60/731,006, filed Oct. 28, 2005, the contents of which are hereby incorporated by reference in their entireties.

It is to be appreciated that the display and/or user interface 122 of the present disclosure is programmable and may be configured to meet the needs of a specific user and/or utility. An exemplary programmable display and/or user interface 122 is disclosed and described in commonly owned U.S. Patent Application Publication No. 2012/0010831, the contents of which are hereby incorporated by reference in its entirety. U.S. Patent Application Publication No. 2012/0010831 provides for defining screens of a display on a revenue-based energy meter, an intelligent electronic device, etc. In one embodiment, a method utilizes Modbus registers and defines a programming technique wherein a user can custom make any desired screen for every application based on what a user needs. The programming utilizes Modbus registers maps to allow for the customizable screens. Moreover, the display interface allows for customized labeling to provide notice and information to users as to measured parameters other than electricity that the meter might be accumulating such as steam, water, gas or other type of commodity.

The IED 100 will support various file types including, but not limited to, Microsoft Windows Media Video files (.wmv), Microsoft Photo Story files (.asf), Microsoft Windows Media Audio files (.wma), MP3 audio files (.mp3), JPEG image files (.jpg, .jpeg, .jpe, .jfif), MPEG movie files (.mpeg, .mpg, .mpe, .m1v, .mp2v .mpeg2), Microsoft Recorded TV Show files (.dvr-ms), Microsoft Windows Video files (.avi) and Microsoft Windows Audio files (.wav).

An input/output (I/O) interface 125 may be provided for receiving inputs generated externally from the IED 100 and for outputting data, e.g., serial data, a contact closure, etc., to other devices. In one embodiment, the I/O interface 125 may include a connector for receiving various cards and/or modules that increase and/or change the functionality of the IED 100. Such cards and/or module will be further described below.

The IED 100 further comprises a volatile memory 118 and a non-volatile memory 120. In addition to storing audio and/or video files, volatile memory 118 may store the sensed and generated data for further processing and for retrieval when called upon to be displayed at the IED 100 or from a remote location. The volatile memory 118 includes internal storage memory, e.g., random access memory (RAM), and the non-volatile memory 120 includes non-removable and removable memory such as magnetic storage memory; optical storage memory, e.g., the various types of CD and DVD media; solid-state storage memory, e.g., a CompactFlash card, a Memory Stick, SmartMedia card, MultiMediaCard (MMC), SD (Secure Digital) memory; or any other memory storage that exists currently or will exist in the future. By utilizing removable memory, an IED can be easily upgraded as needed. Such memory may be used for storing historical trends, waveform captures, event logs including time-stamps and stored digital samples for later downloading to a client application, web-server or PC application.

In a further embodiment, the IED 100 may include a communication device 124, also know as a network interface, for enabling communications between the IED or meter, and a remote terminal unit, programmable logic controller and other computing devices, microprocessors, a desktop computer, laptop computer, other meter modules, etc. The communication device 124 may be a modem, network interface card (NIC), wireless transceiver, etc. The communication device 124 may perform its functionality by hardwired and/or wireless connectivity. The hardwire connection may include but is not limited to hard wire cabling, e.g., parallel or serial cables, RS232, RS485, USB cable, Firewire (1394 connectivity) cables, Ethernet, and the appropriate communication port configuration. The wireless connection may operate under any of the various wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols, communication architecture or systems currently existing or to be developed for wirelessly transmitting data including spread spectrum 900 MHz, or other frequencies, Zigbee, WiFi, or any mesh enabled wireless communication.

The IED 100 may communicate to a server or other computing device such as a client via the communication device 124. The client may comprise any computing device, such as a server, mainframe, workstation, personal computer, hand held computer, laptop, telephony device, network appliance, other IED, Programmable Logic Controller, Power Meter, Protective Relay etc. The IED 100 may be connected to a communications network, e.g., the Internet, by any means, for example, a hardwired or wireless connection, such as dial-up, hardwired, cable, DSL, satellite, cellular, PCS, wireless transmission (e.g., 802.11a/b/g), etc. It is to be appreciated that the network may be a public or private intranet, an extranet, a local area network (LAN), wide area network (WAN), the Internet or any network that couples a plurality of computers to enable various modes of communication via network messages. Furthermore, the server may communicate using various protocols such as Transmission Control Protocol/Internet Protocol (TCP/IP), File Transfer Protocol (FTP), Hypertext Transfer Protocol (HTTP), etc. and secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, etc. Communications may also include IP tunneling protocols such as those that allow virtual private networks coupling multiple intranets or extranets together via the Internet. The server may further include a storage medium for storing a database of instructional videos, operating manuals, etc.

In an additional embodiment, the IED 100 may also have the capability of not only digitizing waveforms, but storing the waveforms and transferring that data upstream to a central computer, e.g., a remote server, when an event occurs such as a voltage surge or sag or a current short circuit. This data may be triggered and captured on an event, stored to memory, e.g., non-volatile RAM, and additionally transferred to a host computer within the existing communication infrastructure either immediately in response to a request from a remote device or computer to receive said data or in response to a polled request. The digitized waveform may also allow the CPU 150 to compute other electrical parameters such as harmonics, magnitudes, symmetrical components and phasor analysis. Using the harmonics, the IED 100 may also calculate dangerous heating conditions and can provide harmonic transformer derating based on harmonics found in the current waveform.

In a further embodiment, the IED 100 may execute an e-mail client and may send e-mails to the utility or to the customer direct on an occasion that a power quality event occurs. This allows utility companies to dispatch crews to repair the condition. The data generated by the meters are used to diagnose the cause of the condition. The data may be transferred through the infrastructure created by the electrical power distribution system. The email client may utilize a POP3 or other standard mail protocol. A user may program the outgoing mail server and email address into the meter. An exemplary embodiment of said metering is available in U.S. Pat. No. 6,751,563, which all contents thereof are incorporated by reference herein. In the U.S. Pat. No. 6,751,563, at least one processor of the IED or meter is configured to collect the at least one parameter and generate data from the sampled at least one parameter, wherein the at least one processor is configured to act as a server for the IED or meter and is further configured for presenting the collected and generated data in the form of web pages.

In a further embodiment, the IED 100 of the present disclosure may communicate data from an internal network to a server, client, computing device, etc. on an external network through a firewall, as disclosed and described in commonly owned U.S. Patent Application Publication No. 2013/0031201, the contents of which are hereby incorporated by reference in its entirety.

It is to be understood that the present disclosure may be implemented in various forms of hardware, software, firmware, special purpose processors, or a combination thereof. The IED 100 also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, or firmware, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

Furthermore, it is to be appreciated that the components and devices of the IED 100 of FIG. 1 may be disposed in various housings depending on the application or environment.

Referring to FIGS. 2A-8H, a metering assembly 200 of the present disclosure includes an IED or meter disposed in a switchboard case 202. The switchboard case 202 includes an enclosure 204 which is physically mounted and connected to the electrical distribution system and a cover 206. The IED or meter is mounted in cradle 208 which is removable from the switchboard enclosure 204. The cradle 208, or adaptor, interconnects electronics of the IED or meter with the electrical circuit. The cradle 208 contains electrical connections 332 (See FIG. 8C) on the bottom which mate with matching electrical connectors 330 (see FIG. 6B) inside the enclosure 204 when the cradle 208 is slid into the enclosure 204. The cover 206 completely seals the meter electronics inside the enclosure 204. The cover further includes a sealing mechanism 210 which prevents removal of the cover 206 and indicates when the cover 206 has been tampered with. The cover 206 further includes a sealed input/output interface 212 which interconnects with input/output means of the meter electronics.

Switchboard cases are used for mounting devices, such as power relays and switchboard meters, in switchboard panels. As will be understood by those skilled in the art, the switchboard case 202 is mounted on the switchboard panel 264, and the switchboard case is wired to the service located behind the switchboard panel via connections or lugs 265, e.g., voltage and current connections or lugs. A device, such as a switchboard meter or power relay is mounted in the switchboard cradle 208, and then the switchboard cradle 208 is slid into the switchboard enclosure 204. There are a series of contact strips 330 at the bottom of the switchboard enclosure 204, and there are similar contact strips 332 at the bottom of the cradle 208. When the switchboard cradle 208 is slid into the enclosure 204, there is a space 334 below the switchboard cradle 208 (See, FIG. 6D) between the connection strips 330, 332, which prevents them from making contact with each other. As illustrated, the upper and lower cradle bars 214, 216 also include latches 218, 220 which are used to retain the cradle 208 in the enclosure 204. It is to be appreciated that in certain embodiments only one cradle bar may be employed, e.g., cradle bar 214 may be employed while cradle bar 216 may be eliminated. As shown in FIG. 6C, a connection paddle 222 is then inserted in the space 334. The connection paddle 222 has a series of connection strips 336 which wrap around their distal end for making electrical contact between the connection strips 330, in the enclosure 204, and the connection strips 332, in the switchboard cradle 208, whereby the electrical device (e.g., the meter or relay) in the switchboard cradle 208 is electrically connected to the service when the connection paddle 222 is inserted.

Referring to FIGS. 2A-3C, the switchboard case 202 includes enclosure 204 and cover 206. The enclosure 204 is generally rectangular and includes a top wall 230, a right side wall 232, a left side wall 234, a bottom wall 236 and a rear wall 238. The walls of the enclosure 204 define a cavity 240 for which the cradle 208 is to be disposed in. The enclosure 204 further includes a rectangle plate 242 disposed on the open end 246 of the enclosure 204. The plate 242 includes an aperture 244 substantially the same size of the cavity 240 defined by walls 230, 232, 234 and 236. The plate 242 extends from periphery of the open end of the enclosure 204 in a perpendicular manner from each of walls 230, 232, 234 and 236. When mounted in a switchboard panel 264, a closed end 248 of the enclosure 204 is slid into an appropriate sized cutout 266 in the panel 264 until a rear surface 250 of the plate 242 comes into contact with a surface of the panel 264. The rear surface 250 of the plate 242 further includes a channel 252 configured to receive a gasket 253 (as shown in FIG. 5C). When the enclosure 204 is secured to the panel 264, the gasket disposed in channel 252 will prevent water from reaching the enclosure 204.

It is to be appreciated that the enclosure 204 may be secured to the switchboard panel in at least two ways. In one embodiment, the plate 242 includes a plurality of mounting holes 254 configured to receive screws 256, wherein the screws 256 fasten the plate 242, and thus the enclosure 204, to the switchboard panel 264. In another embodiment, at least one mounting bracket 258 is coupled to a side wall of the enclosure, for example, side walls 232, 234. The mounting bracket 258, e.g., a DIN bracket, is configured to receive a screw 260. As the screw 260 is rotated clockwise, an end 262 of the screw 260 makes contact with a rear surface 268 of the panel 264. Once the end 262 makes contact with the panel 264, further rotation of the screw 260 causes the mounting bracket 258, and thus the enclosure 204, to move away from the panel (as indicated by arrow A) securing the plate 242 to the opposite surface of the switchboard panel 264. It is to be appreciated that other ways to secure the case 202 to a switchboard panel is contemplated to be within the scope of the present disclosure. Regardless of the mounting method, it is to be appreciated that the gasket disposed in the channel 252 is compressed between the plate 242 and the panel 264 to prevent water or other substances from reaching the enclosure 204.

Referring to FIGS. 2A, 4 and 5A-5B, the switchboard case 202 includes cover 206 with a transparent face 270 to allow a meter display 272 to be read and the user interface 212 to be interacted with by the user. The transparent meter cover 206 permits the viewing of the meter display 272 without having to remove the meter cover 206. Further, the meter cover 206 may also provide mechanisms 274, 276 for interacting with the when the meter cover 206 is in place. Such mechanisms 274, 276 include scroll buttons, reset switches or other input devices, and optical couplers, infrared emitters or other output devices. In one embodiment, mechanism 274 is optical coupler port that enables a computing device to communicate with the meter electronics or to test the meter 364 using a watthour LED test pulse that pulses proportional to the watthours generated by the meter 364. In another embodiment, the mechanism 276 is a reset switch for resetting demand.

Figure 5A:
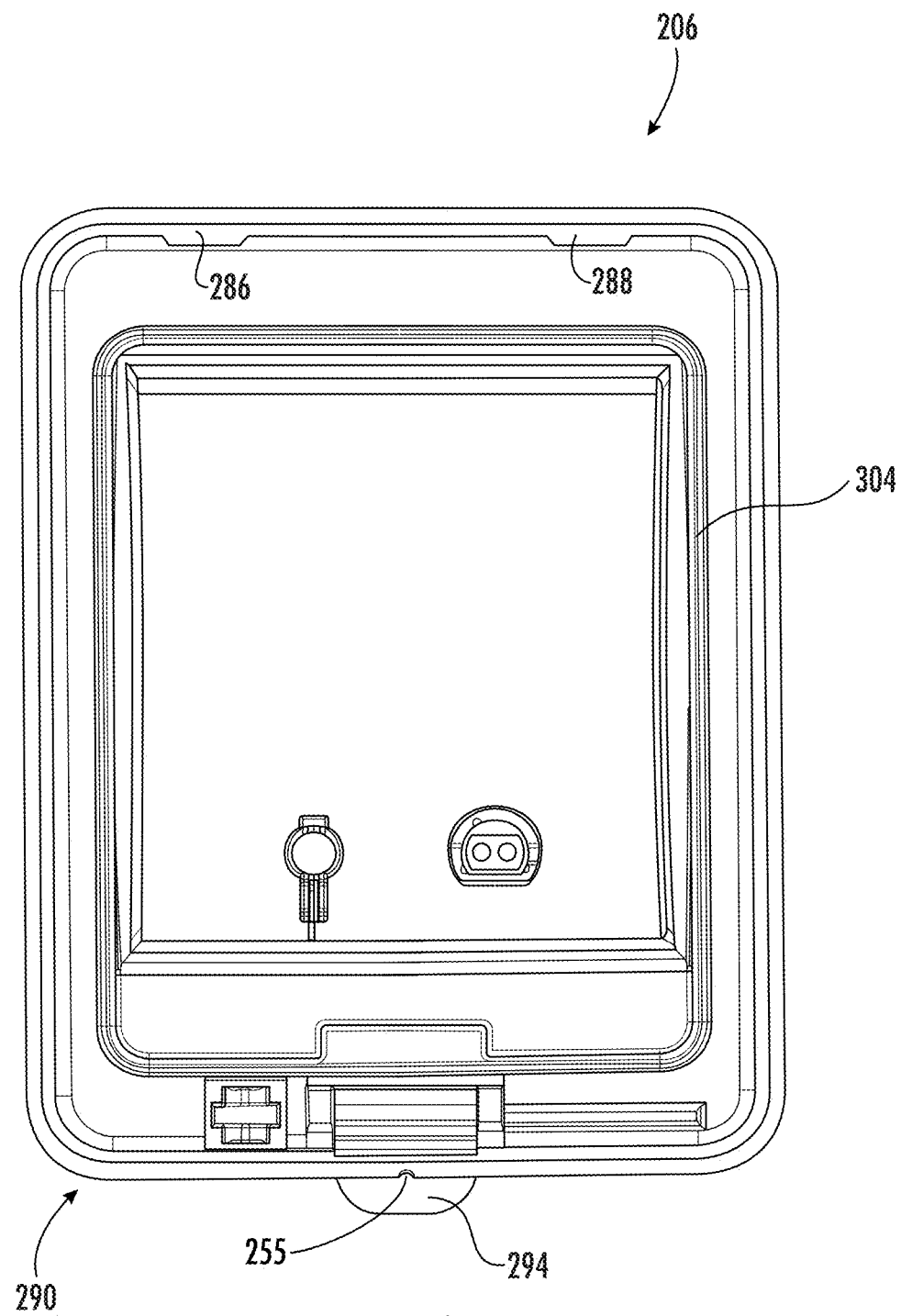
FIG. 5A is a rear view of the cover shown in FIG. 4.

A front surface of the plate 242 of the enclosure 204 includes two receiving members 280, 282 and a retaining member 284 to facilitate mounting the cover 206 to the plate 242. Referring to FIGS. 5A and 5B, the cover 206 includes two tabs 286, 288 extending from an upper, inner peripheral portion of the cover 206. When mounting the cover 206 to the plate 242, the tabs 286, 288 are disposed in the receiving members 280, 288 and a lower portion 290 of the cover 206 is brought into contact with a lower portion 292 of the plate 242. A latch 294 of the cover 206 engages the retaining member 284 to set the cover 206 in place. As can be best seen in FIG. 6C, the retaining member 284 includes a downward extending edge 296. The latch 294 includes an upwardly extending edge 298, as can be best seen in FIG. 5B. When the lower portion 290 of the cover 206 is brought into contact with a lower portion 292 of the plate 242, latch 294 pivots to enable edge 298 to slide under edge 296 and then pivot to its normal position so edge 298 engages edge 296. To remove the cover 206, a button portion 300 of latch 294 is actuated or pressed, wherein the latch 294 pivots so edge 298 is positioned below edge 296 to allow the lower portion 290 of the cover 206 to be moved away from the plate 242. The cover 206 may then be lifted so the tabs 286, 288 are disengaged from the receiving members 280, 282 and the cover 206 is removed. In this manner, the cover 206 employs a one-button release to facilitate removing the cover 206 from the plate 242 of the enclosure 204.

The plate 242 includes a channel 302 that surrounds the opening to the enclosure 204. A corresponding lip 304 is configured on the inner surface 306 of the cover so when the cover 206 is placed on the plate 242, the lip 304 is disposed in the channel 302. Additionally, a gasket 305 (as shown FIG. 5C) may be disposed in the channel 302 so when the cover 206 is mounted on the plate 242, the gasket is compressed between the channel 302 and lip 304 forming a water-tight seal preventing water or any other substance from entering the enclosure 204. In light of the above, the case 202 conforms to the NEMA 4× rated waterproof standard.

Figure 3A:
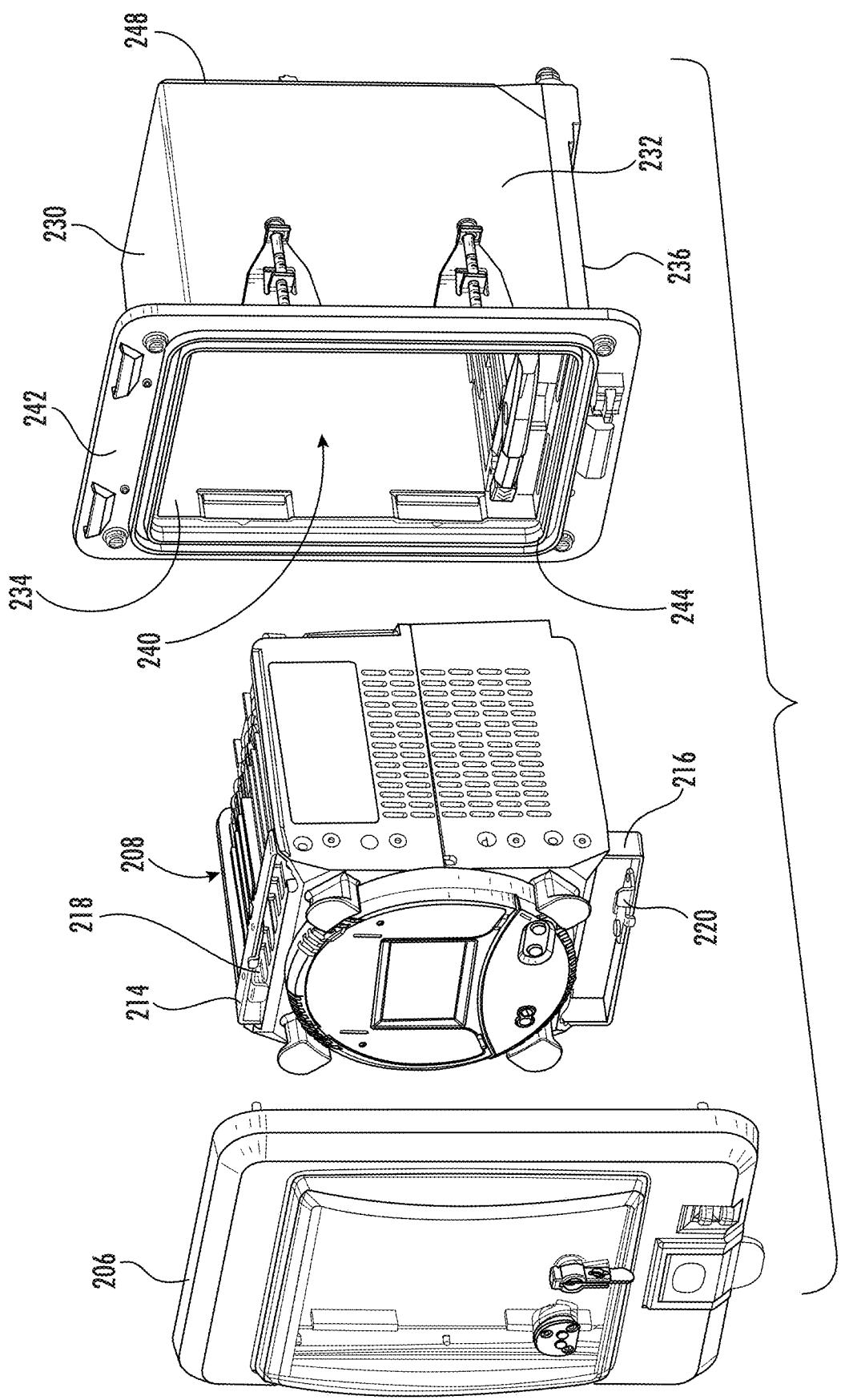
FIG. 3A is a perspective, exploded view of the metering assembly shown in FIG. 2A.
Figure 3B:
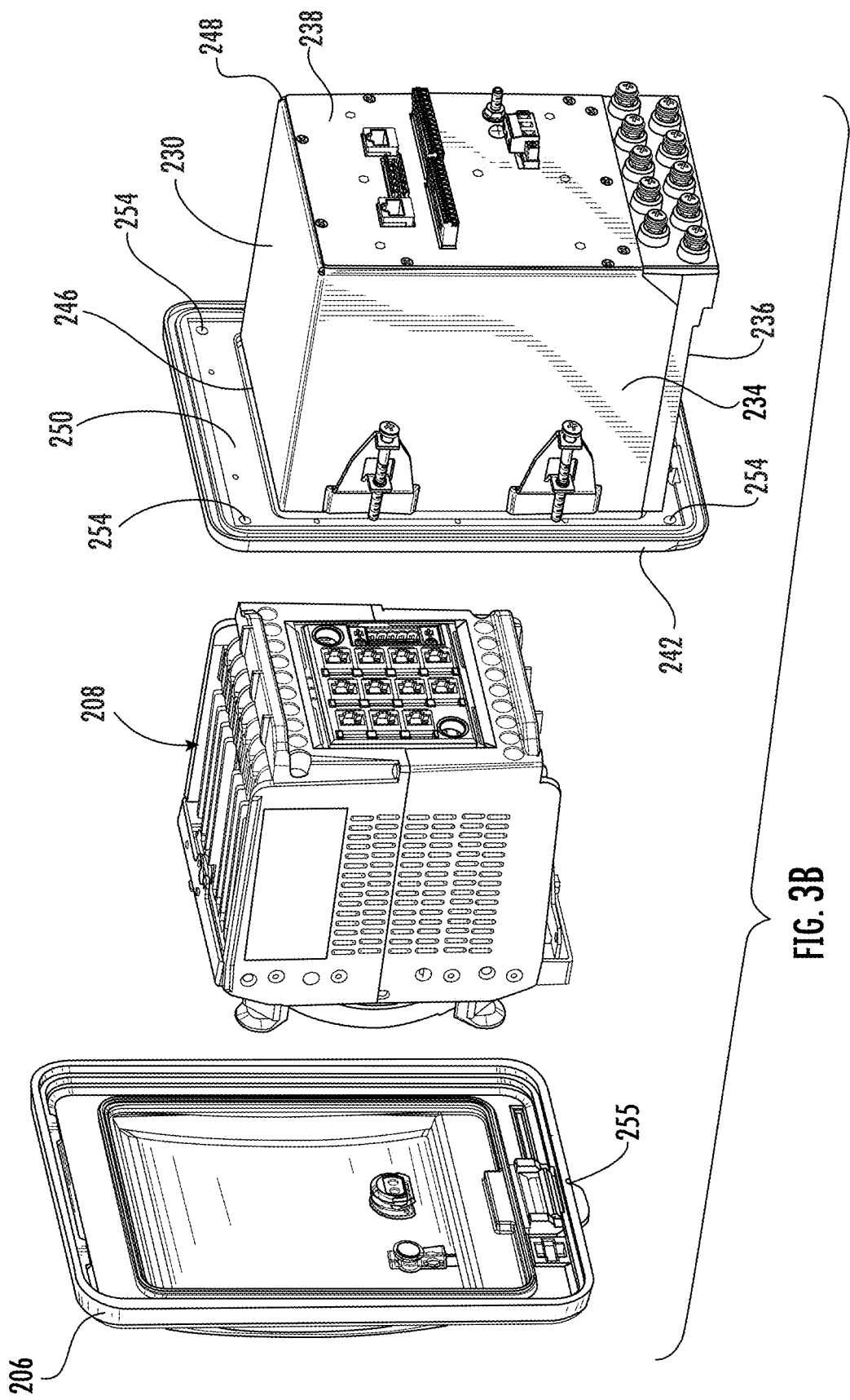
FIG. 3B is a rear perspective view of the metering assembly shown in FIG. 3B.
Figure 3C:
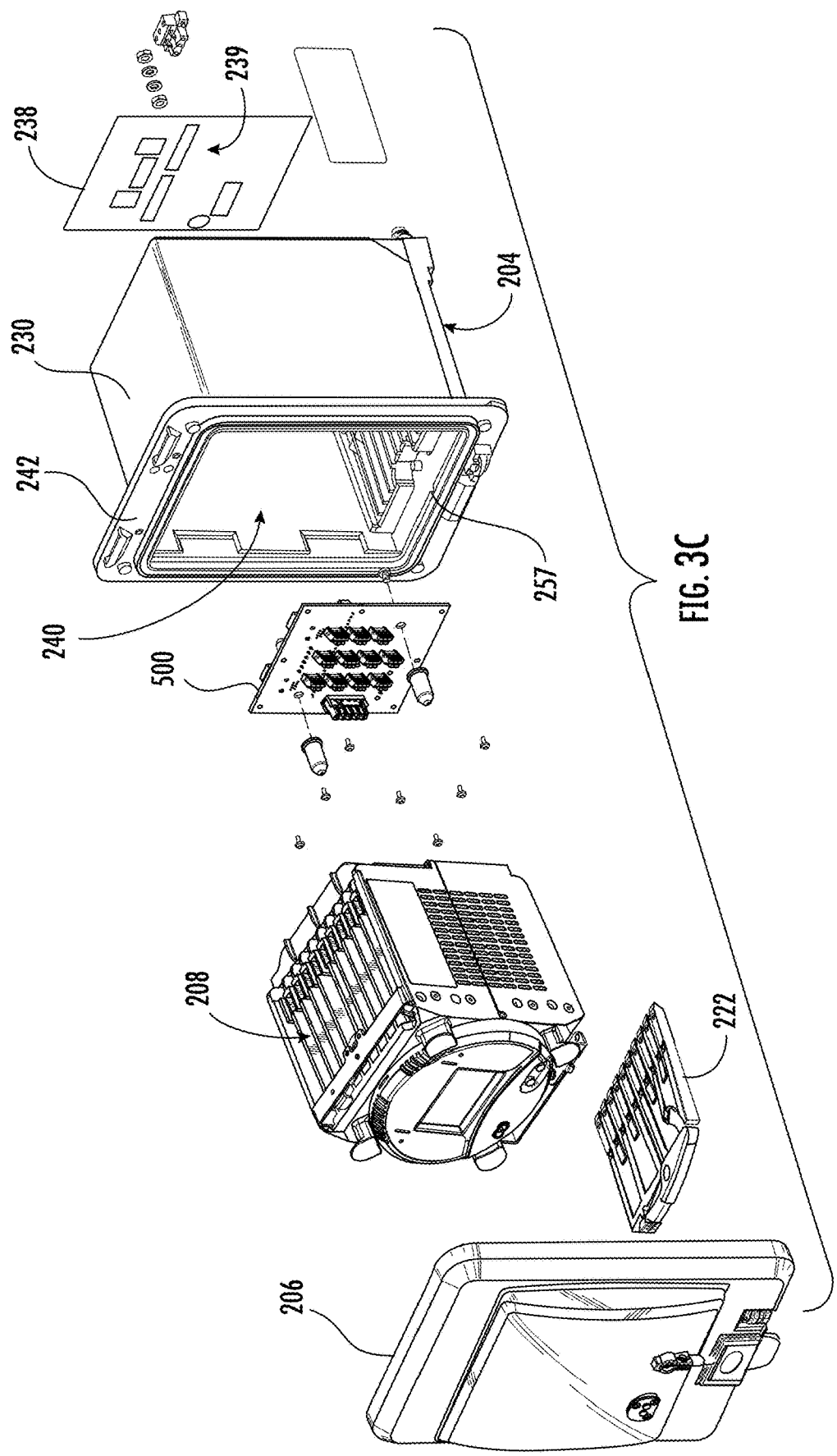
FIG. 3C is another exploded view of the metering assembly shown in FIG. 2A.

In certain embodiments, the case 202 includes a draining system that may drain or channel any moisture and/or water formed on the inner surface 306 of the cover 206. In certain scenarios, the case 202 may be mounted in a humid environment where heat generated by the meter and/or other devices inside a particular panel may cause condensation to form on the inner 306 of the cover 206. The cover 206 includes a first draining channel 255 disposed on the bottom of the cover, as illustrated in FIGS. 2E, 2G, 3B, 5A and 5B. A second draining channel 257 is disposed on a lower portion of plate 242, as illustrated in FIGS. 3C and 6B. Referring to FIG. 5C, a cross sectional view of the lower portion of the cover 206 disposed on the plate 242 is provided. As illustrates in FIG. 5C, the second draining channel 257 of the plate generally aligns with the first draining channel 255 of the cover 206 so that any condensation formed on the inner surface 306 of the cover 206 may collect at the bottom of the cover 206 and drain through channel 257 and channel 255 to exit the case 202, i.e., the condensation will follow the path designated by dashed arrow B.

The cover 206 also has a sealing mechanism 210 to prevent unauthorized access. The sealing mechanism on the cover 206 includes two semi-circular members 278 and 280, which extend outward and are spaced apart a predetermined distance. When the cover 206 is mounted to the plate 242, members 278 and 280 receive a third semi-circular member 282 therebetween, as can best be seen in FIG. 2A. Each semi-circular member includes an aperture. When the cover 206 is fully seated to the plate 242, the members 278, 280 and 282 align enabling a wire seal to be disposed through the aperture of the aligned semi-circular members 278, 280 and 282. Once sealed, the cover 206 can only be removed by removing the seal (e.g., by cutting the seal) indicating that the meter has been tampered with.

Figure 6A:
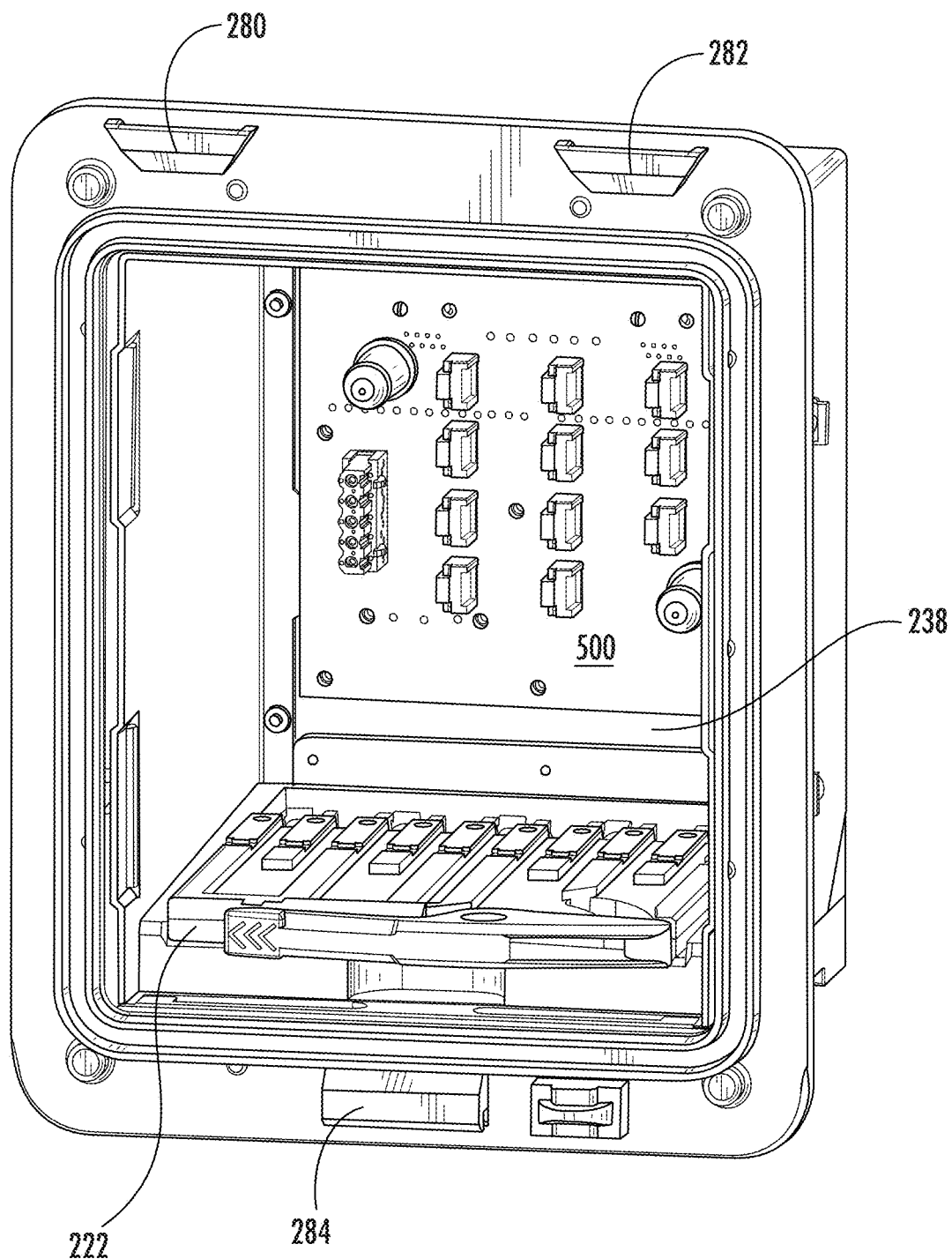
FIG. 6A is a perspective view of the enclosure of the switchboard case shown in FIG. 4.
Figure 6B:
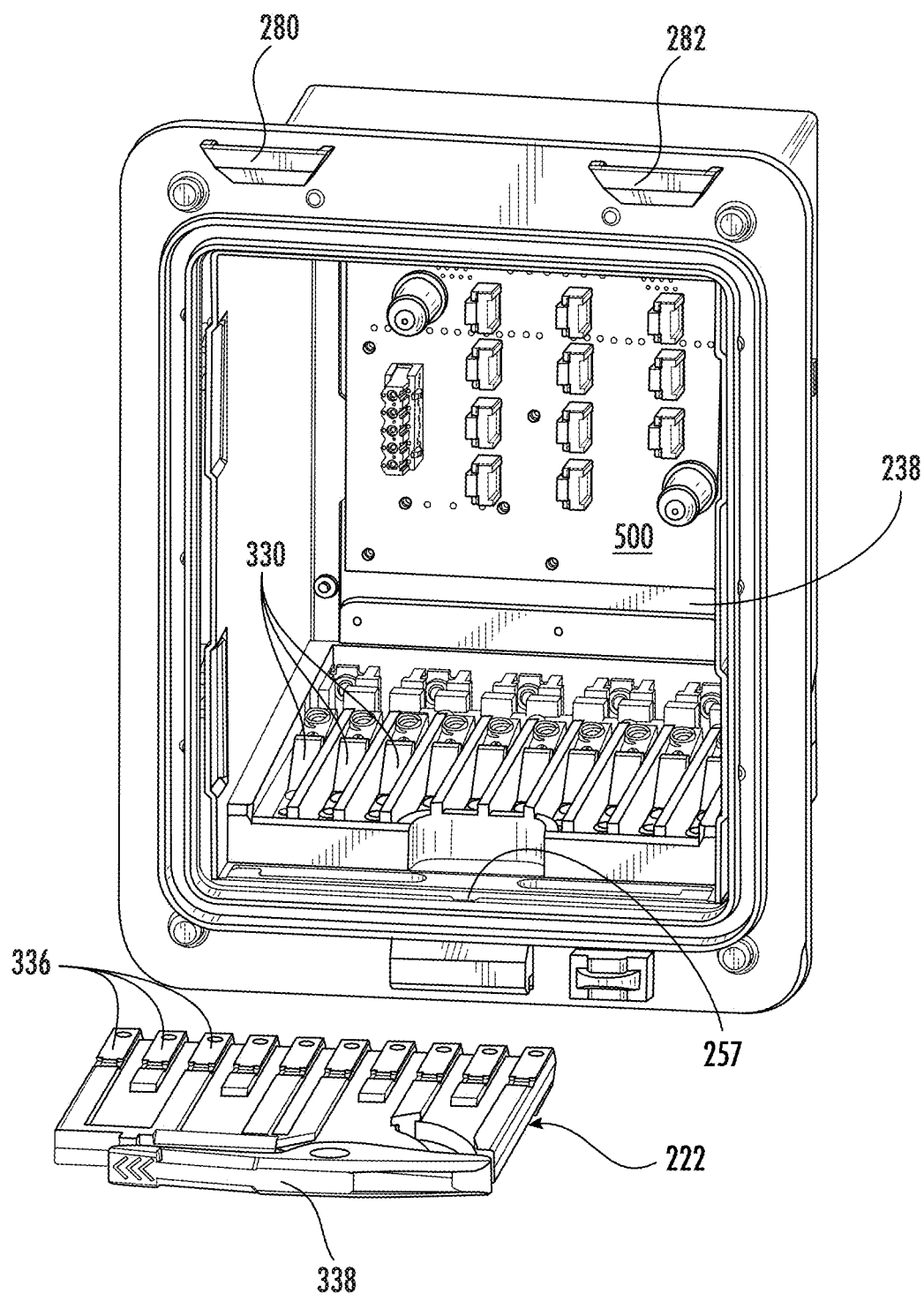
FIG. 6B is a perspective view of the enclosure shown in FIG. 6A with a connection paddle removed.
Figure 6C:
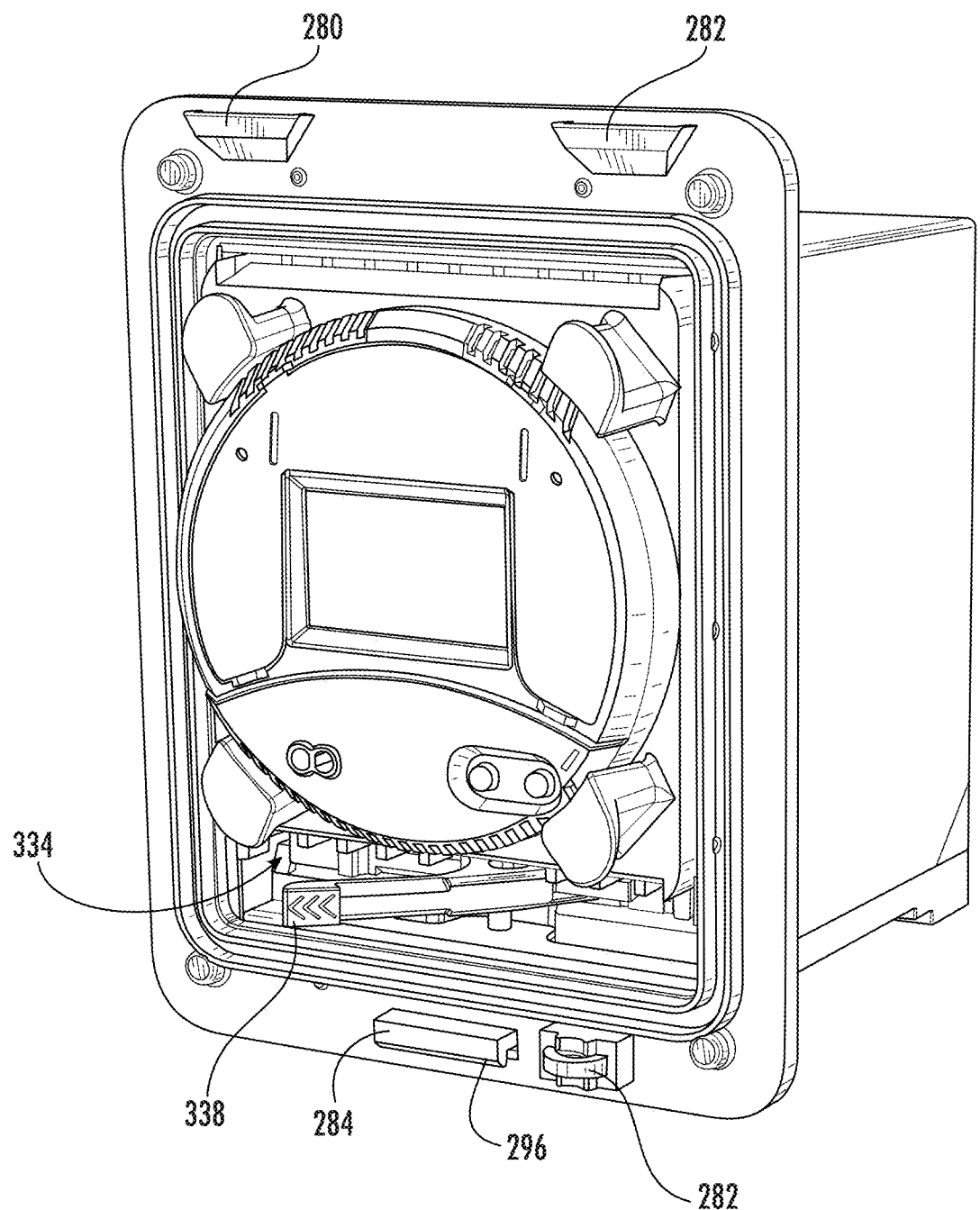
FIG. 6C is a perspective view of the enclosure of FIG. 4 with a cradle including meter electronics disposed therein.
Figure 6D:
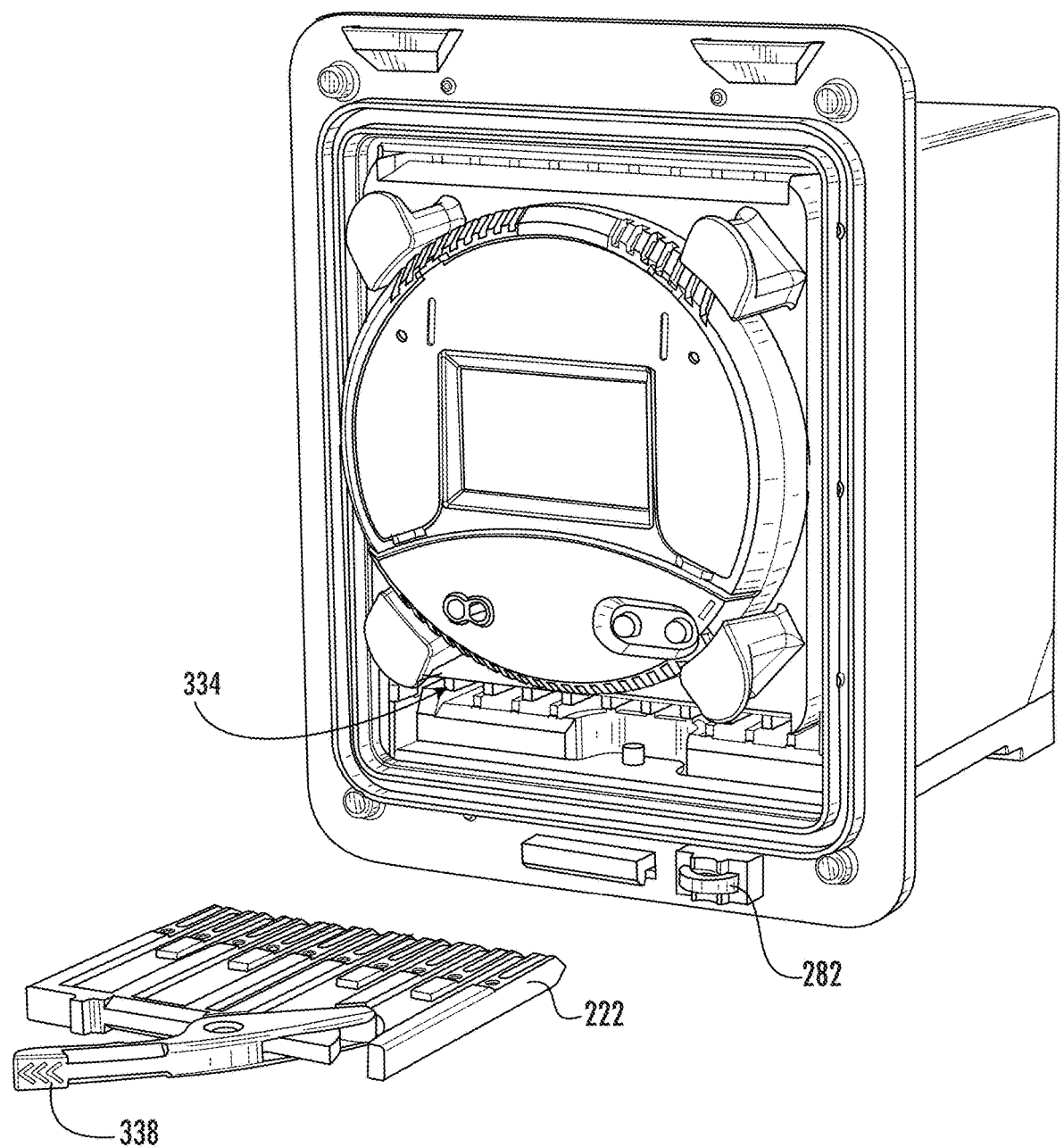
FIG. 6D illustrates the cradle and enclosure of FIG. 6C with the connection paddle removed according to an embodiment of the present disclosure.

Referring to FIGS. 6A and 6B, the enclosure 204 is illustrated with the cradle 208 removed in FIG. 6A and the connection paddle 222 removed in 6B. As mentioned above, there are a series of contact strips 330 at the bottom of the switchboard enclosure 204 (see FIG. 6B), and there are similar contact strips 332 at the bottom of the cradle 208, as shown in FIG. 8C. When the switchboard cradle 208 is slid into the enclosure 204, there is a space 334 below the switchboard cradle 208 (See, FIG. 6D) between the connection strips 330, 332, which prevents them from making contact with each other. Connection paddle 222 includes a top surface 335 and a bottom surface 331 with a series of contact strips 336 configured on one end of the paddle to provide an electrical connection between the top surface 335 and bottom surface 331. As can be seen from FIGS. 7A-7G, the series of contact strips 336 wrap around the end of the connection paddle 222 to provide the electrical connection between the top surface 335 and bottom surface 331. The connection paddle 222 is inserted into the space 334 creating by the enclosure 204 and cradle 208 to complete the connection between connection strips 330, 332. Additionally, the paddle 222 includes a pivoting handle 338 to facilitate removing the paddle from the space 334. The handle 338 includes a first end 340 and a second end 342. The paddle include slot 344 so when the handle pivots about point 346, the second end 342 travels in the slot 344 and the first end 340 extends away from the enclosure.

When the cover 206 is removed, the cradle 208 may be removed from the enclosure 204 by removing the connection paddle 222 first. As shown in FIG. 6C, the paddle 222 is disposed in the space 334. The handle 338 of the paddle 222 may be extended outward by grasping the first end 340 and moving the first end 340 in a direction away from the face of the enclosure 204 so to extend beyond a plane of the enclosure created by the plate 242. The second end 342 of the handle 338 will travel in the slot 344 allowing the first end 340 to extend outward. The first end 340 of the handle 338 may then be grasped to remove the paddle 222.

Figure 7A:
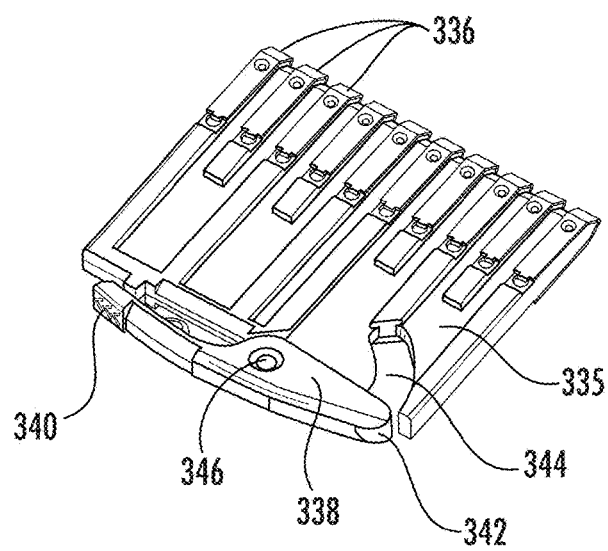
FIGS. 7A-7G illustrates various views of a connection paddle according to an embodiment of the present disclosure, where
Figure 7B:
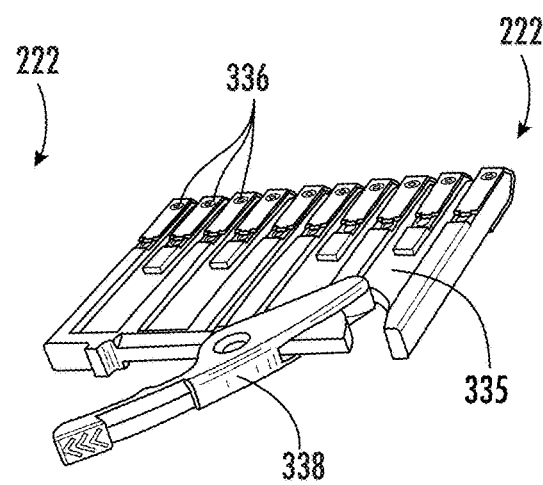
Figure 7C:
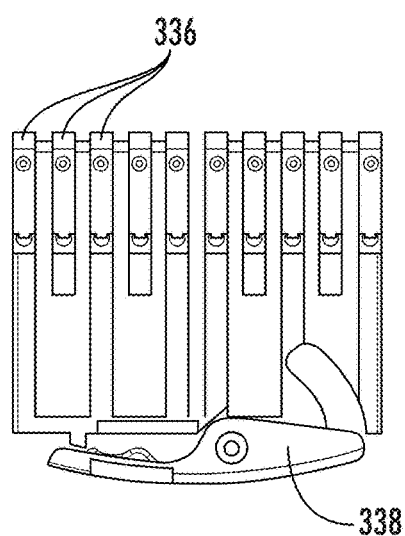
Figure 7D:
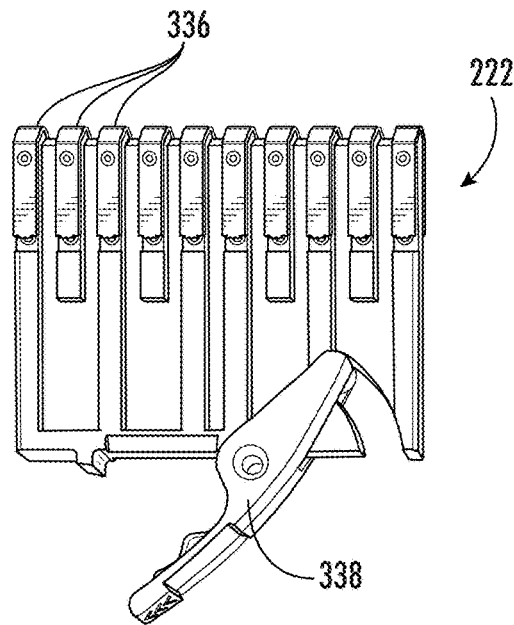
Figure 7E:
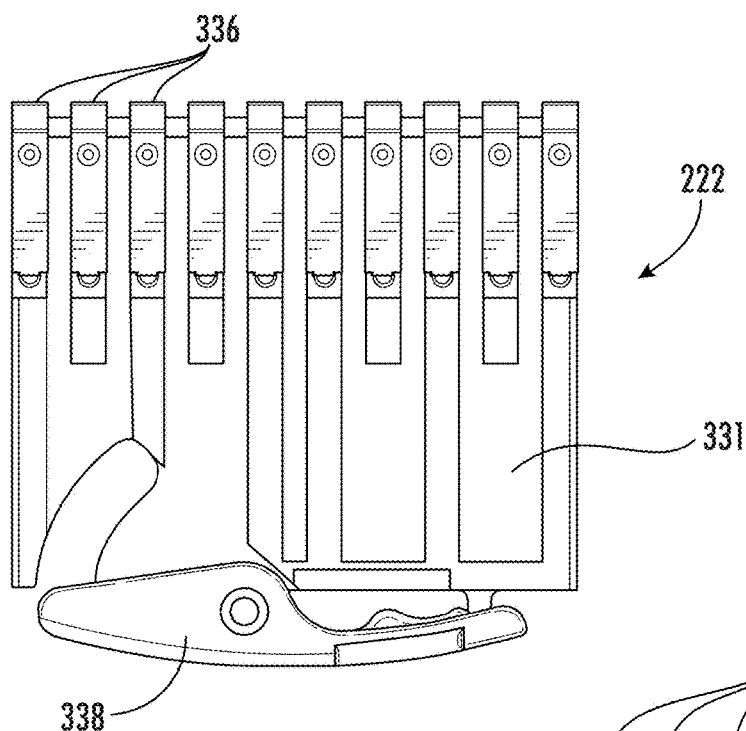
Figure 7G:
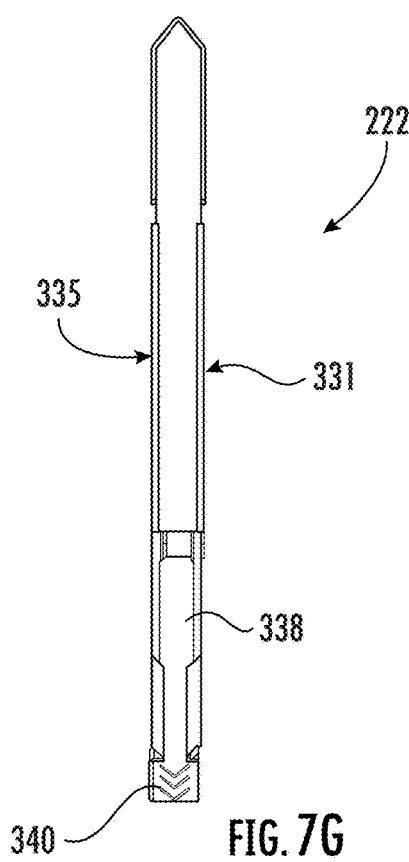
Figure 7F:
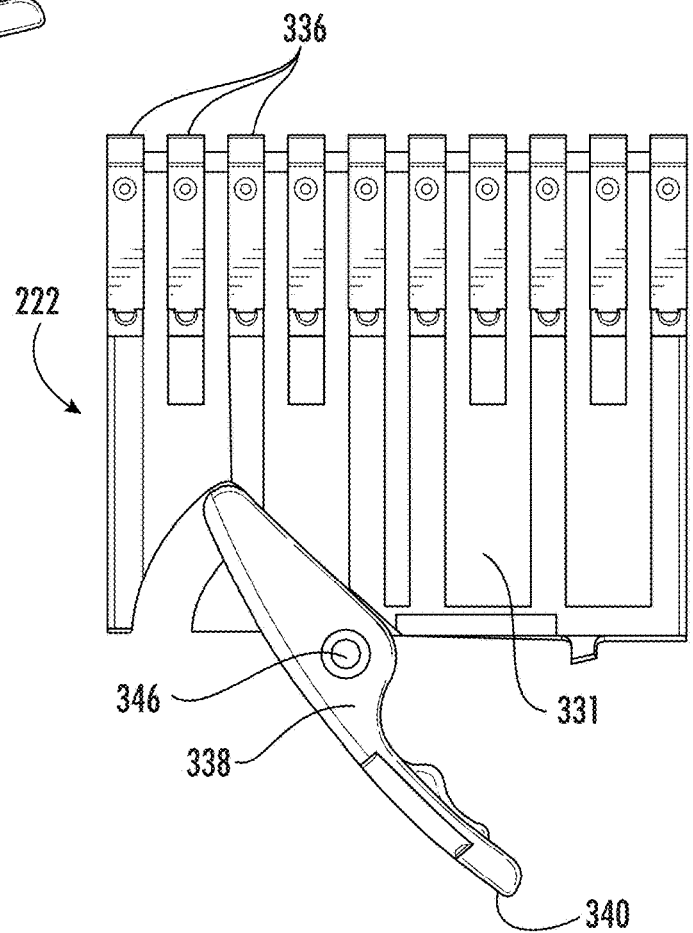
Figure 7H:
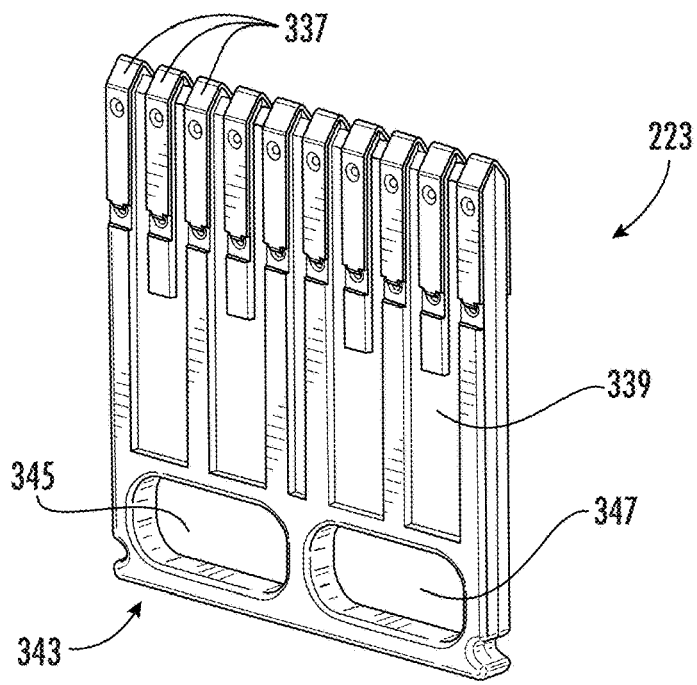
FIGS. 7H-7J illustrates various views of a connection paddle according to another embodiment of the present disclosure, where
Figure 7I:
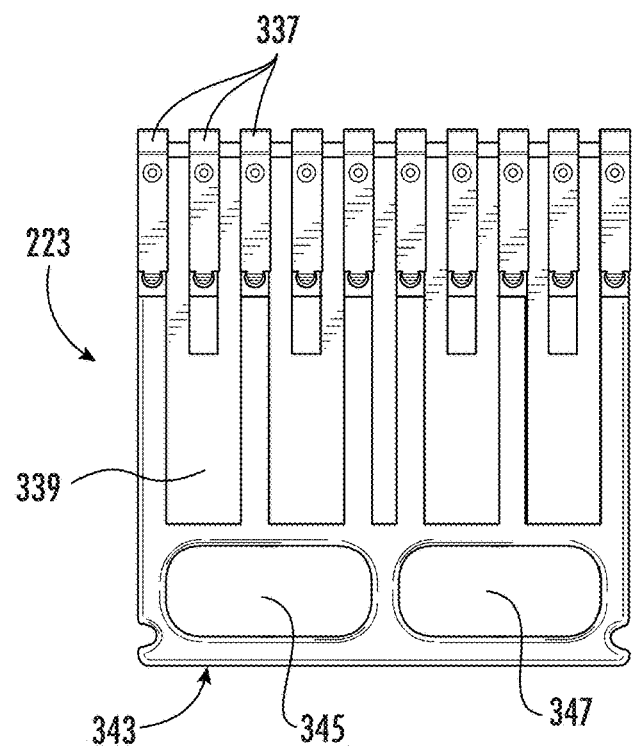
Figure 7J:
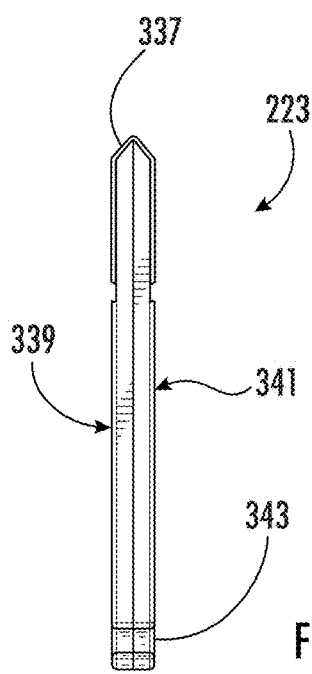

FIGS. 7H-7J illustrate a connection paddle 223 according to another embodiment of the present disclosure, where FIG. 7H is a perspective view of the connection paddle 223, FIG. 7I is a top view of the connection paddle 223 and FIG. 7J is a side view of the connection paddle 223. Connection paddle 223 includes a top surface 339 and a bottom surface 341 with a series of contact strips 337 configured on one end of the paddle to provide an electrical connection between the top surface 339 and bottom surface 341. As described above, the connection paddle 223 is inserted into the space 334 to complete the connection between connection strips 330, 332. Additionally, the paddle 223 includes a handle 343 including grasping apertures 345, 347 to facilitate grasping the connection paddle 223 when removing the paddle 223 from the space 334. The grasping apertures 345, 347 may be appropriately sized to receive, for example, at least one finger of an operator, a tool, or other removal member. It is to be appreciated that the bottom surface 341 is a mirror image of the top surface 339 shown in FIG. 7I.

Figure 8A:
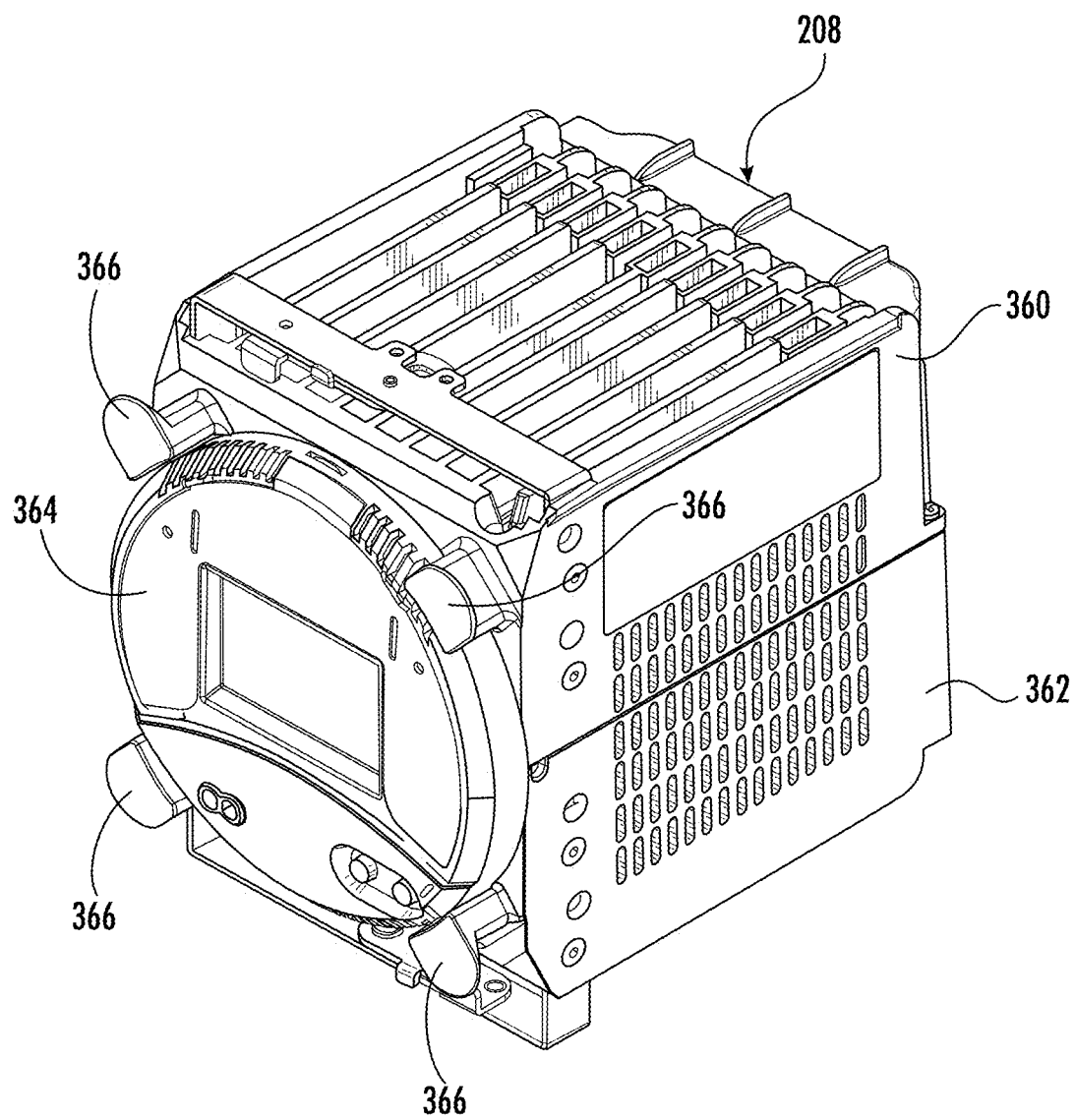
FIG. 8A is a perspective view of a cradle including meter electronics disposed therein according to an embodiment of the present disclosure.
Figure 8B:
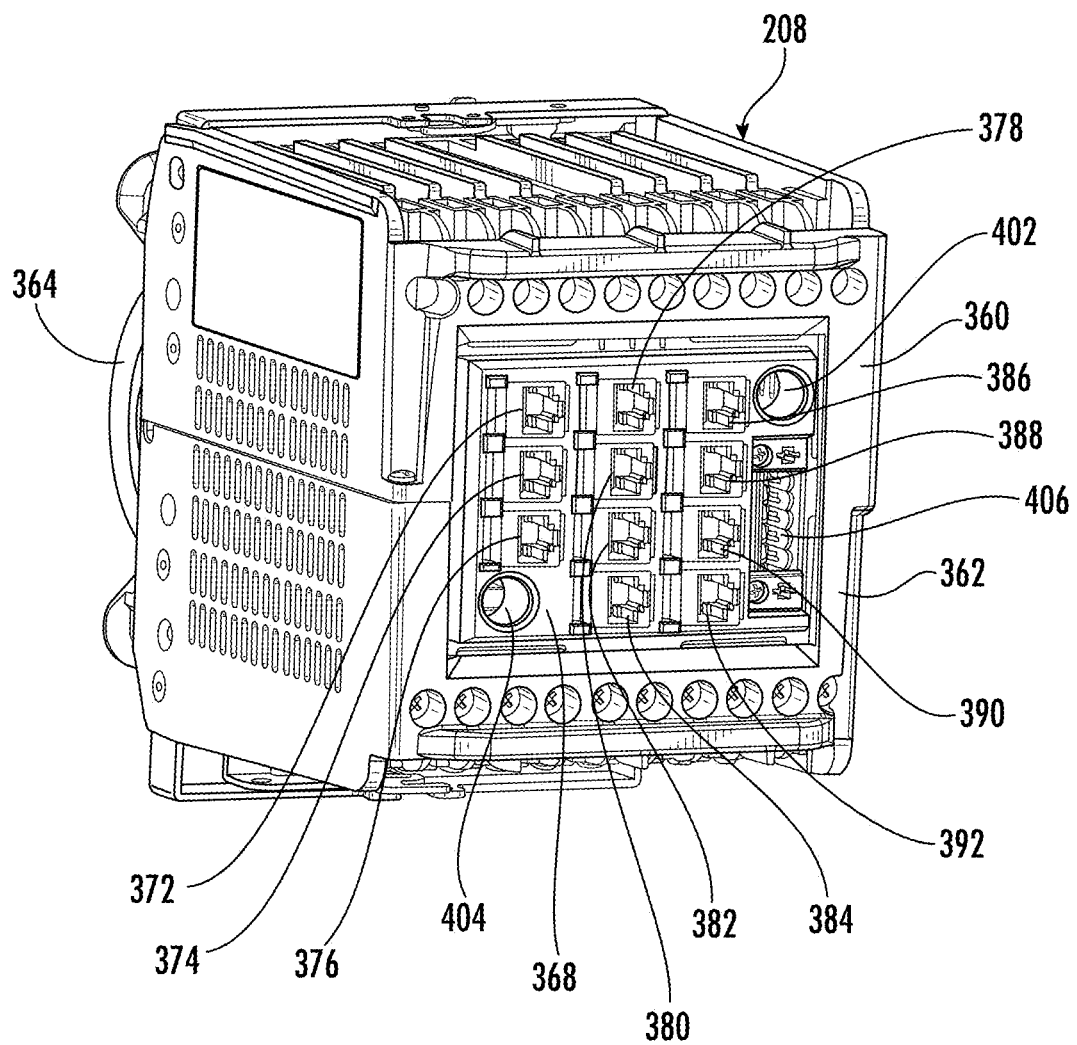
FIG. 8B is a rear, perspective view of the cradle including meter electronics shown in FIG. 8A.
Figure 8C:
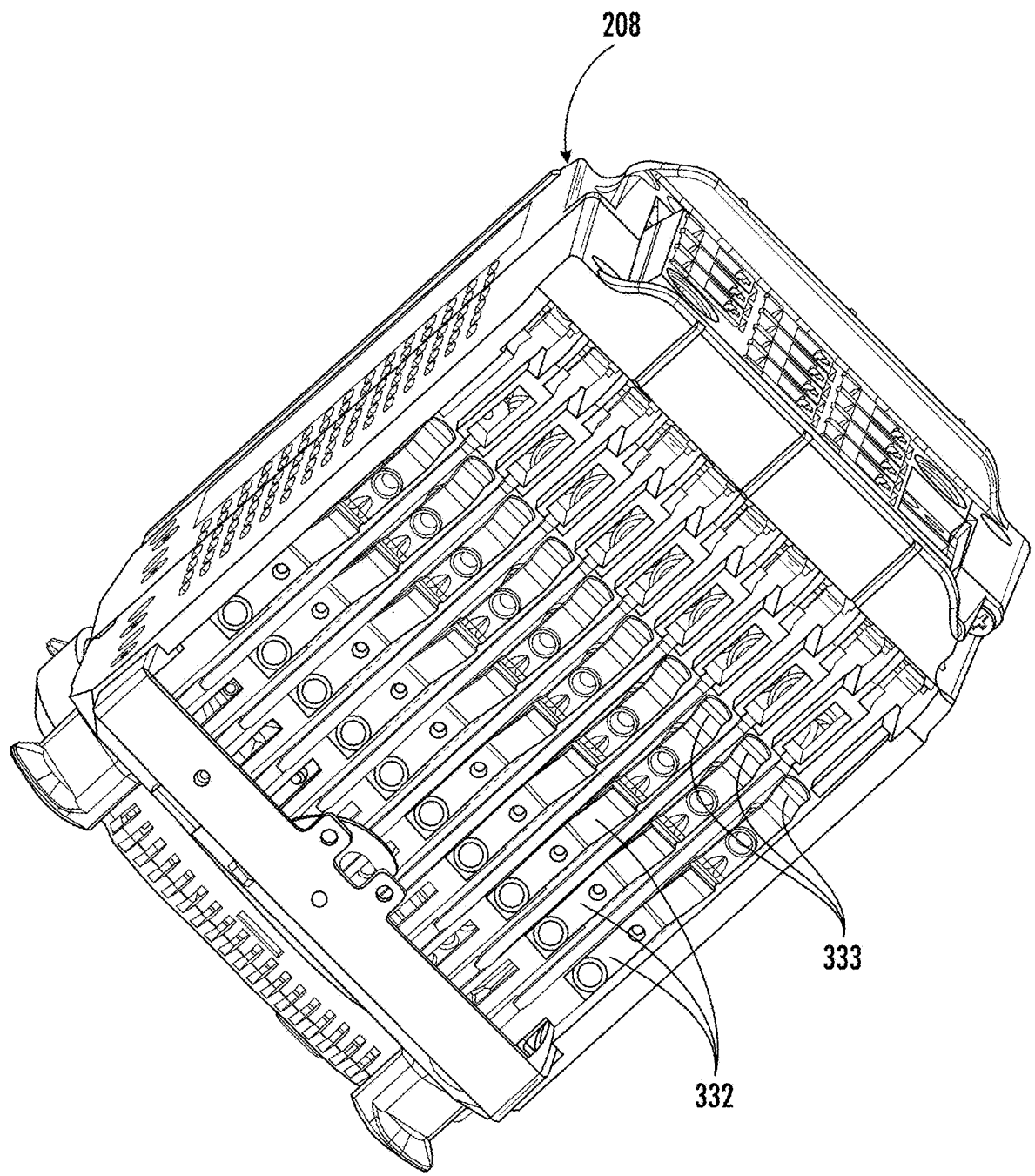
FIG. 8C is bottom view of the cradle shown in FIG. 8A.
Figure 8D:
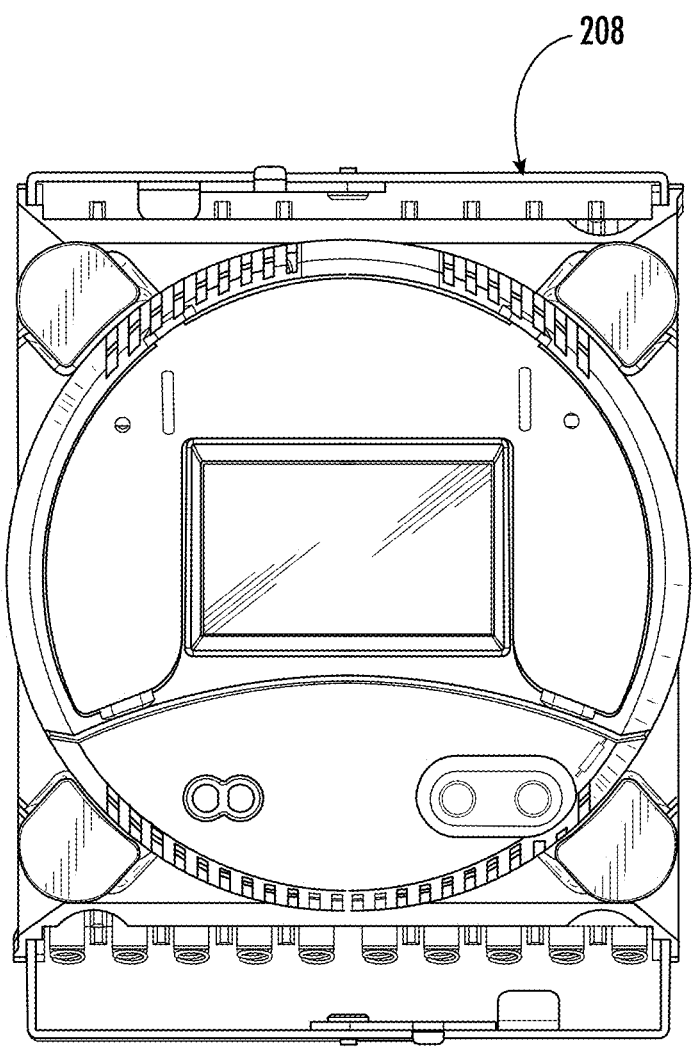
FIG. 8D is front plan view of the cradle shown in FIG. 8A.
Figure 8E:
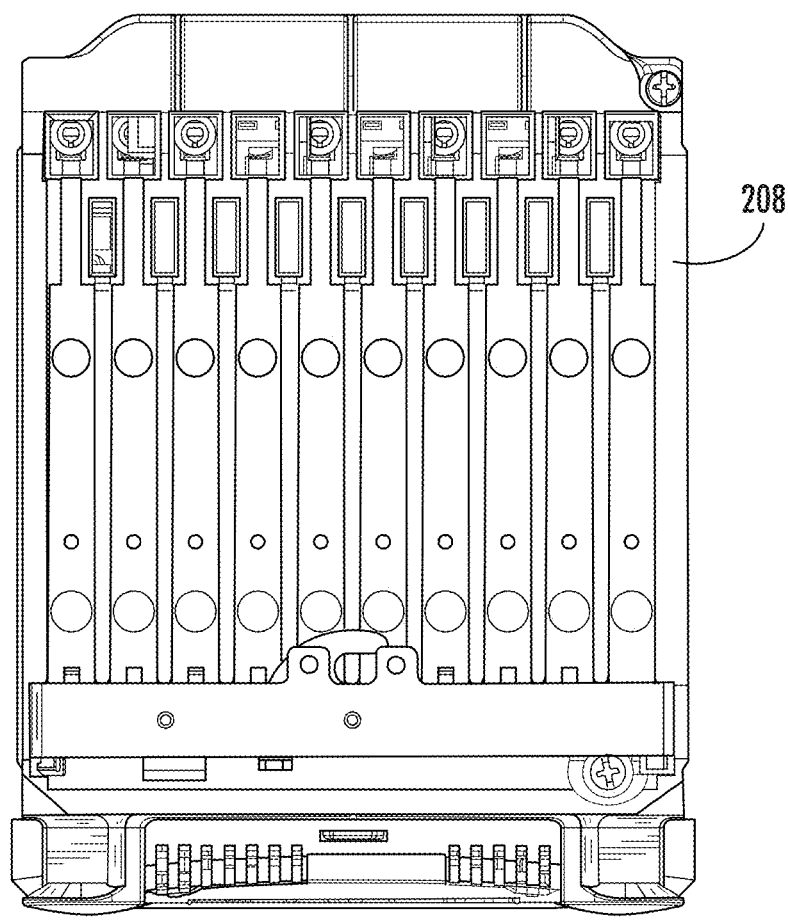
FIG. 8E is top plan view of the cradle shown in FIG. 8A.

Referring to FIGS. 8A-8C, a cradle in accordance with the present disclosure is illustrated, where FIG. 8A is a front, perspective view of a cradle 208, FIG. 8B is a rear perspective view and FIG. 8C is a bottom view. Cradle 208 is generally rectangular and includes an upper half portion 360 and a lower half portion 362. The upper half portion 360 and lower half portion 362 are configured to house metering electronics, e.g., a revenue meter 364. Each of the upper half portion 360 and lower half portion 362 includes at least one gripping member 366 to facilitate removal of the cradle 208 from the enclosure 204 after the paddle 222 is removed. The cradle 208 further includes a connection frame 368 sandwiched between the upper half portion 360 and lower half portion 362, as shown in FIG. 8B. The connection frame 368 includes a plurality of apertures 369 (see FIG. 9C) for receiving a connector in each aperture. The cradle 208 employs quick connectors for coupling wires from the meter 364 to the connection frame 368. Connection frame 368 includes apertures 369, where a connector 372, 374, 376, 378, 380, 382, 384, 386, 388, 390 and 392 is disposed in each aperture. In one embodiment, the connectors 372, 374, 376, 378, 380, 382, 384, 386, 388, 390 and 392 disposed in apertures 369 include RJ-45 receptacles. Additionally, connector 406 is employed for an external power source for meter 364. The other connectors can be internally coupled to various communication modules and/or input/output modules disposed in the meter 364. The connection frame 368 further includes alignment aperture 402, 404, which will be described in more detail below.

Figure 9A:
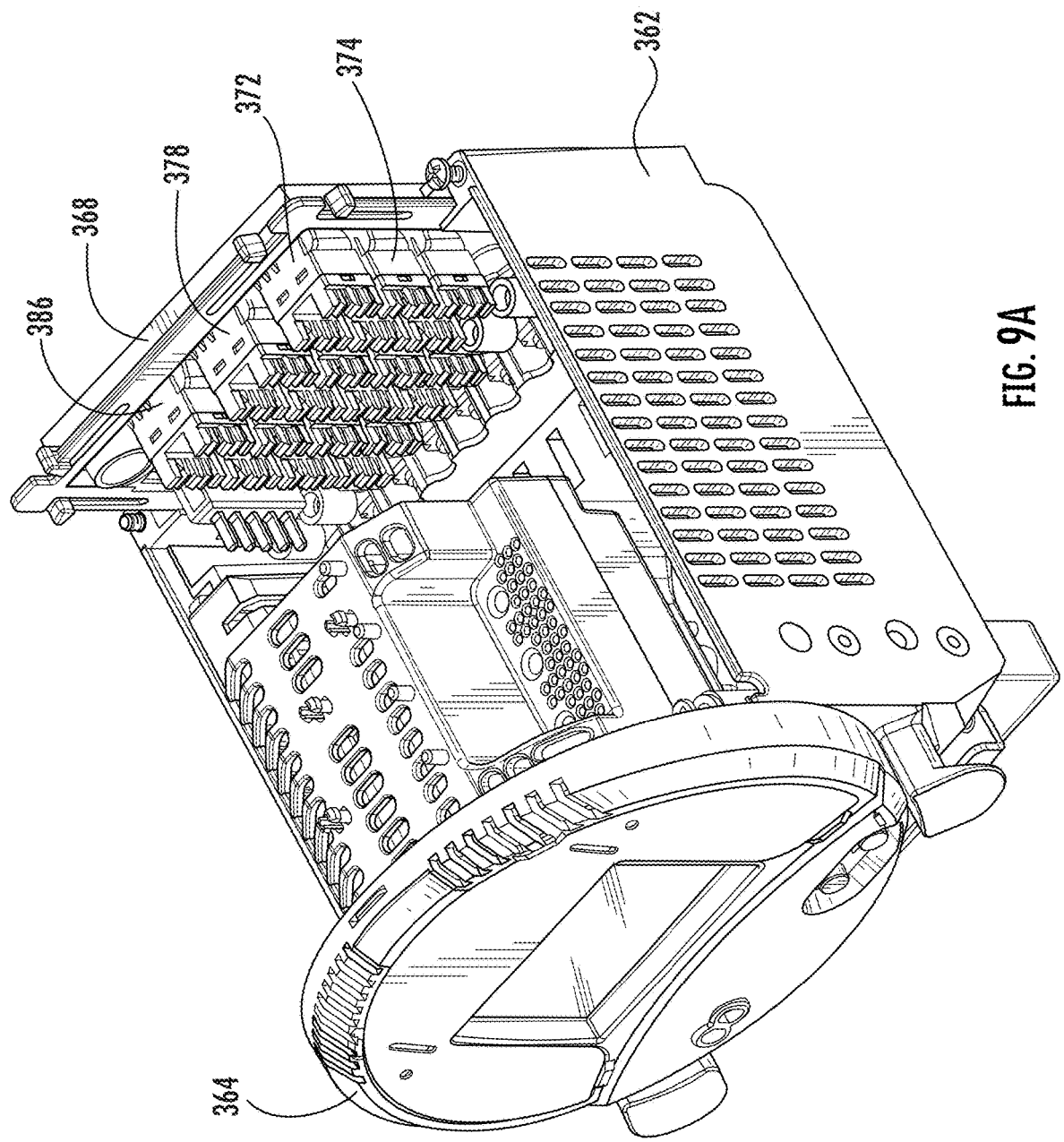
FIG. 9A illustrates the cradle including meter electronics with an upper portion of the cradle removed.
Figure 9B:
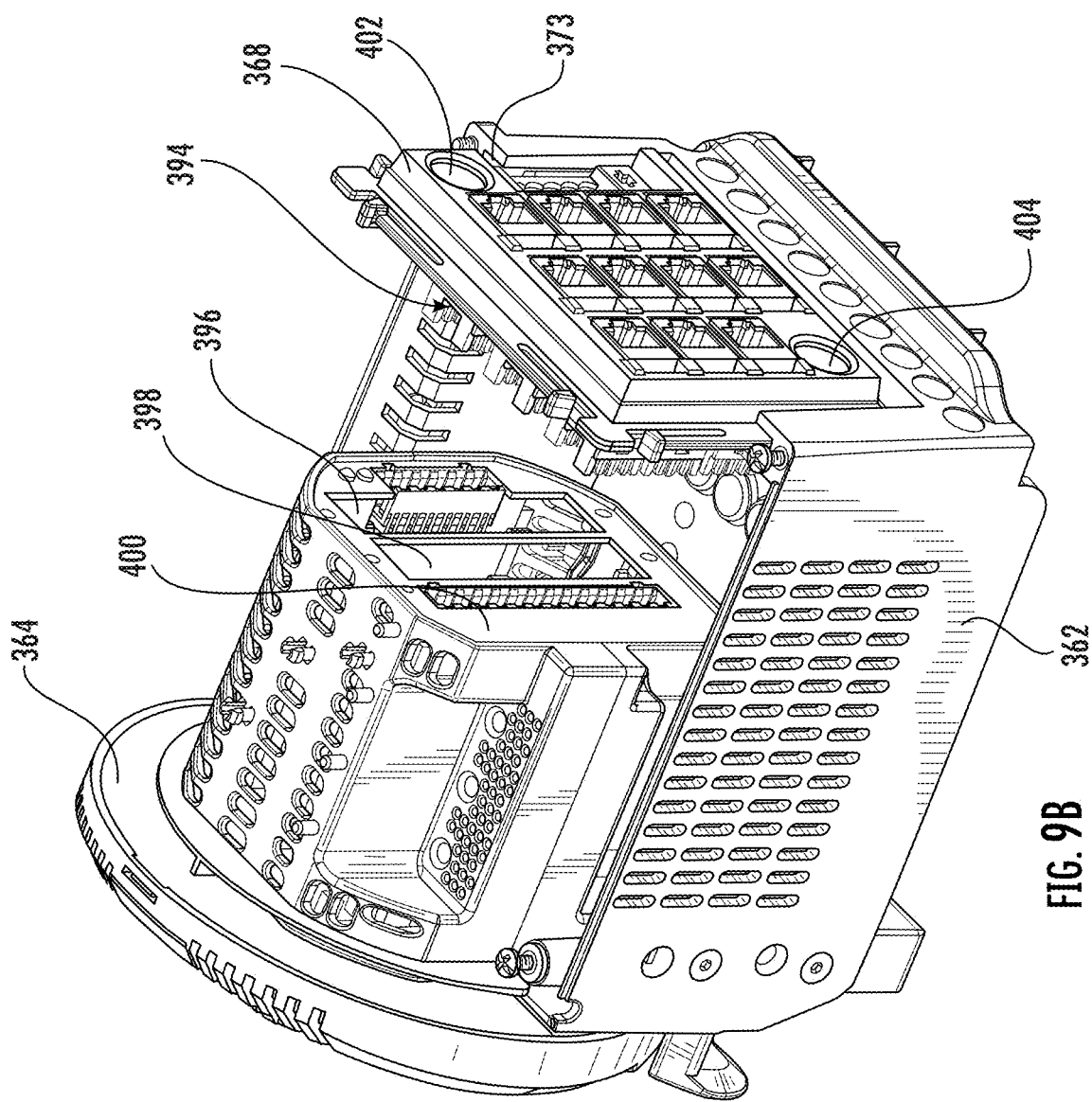
FIG. 9B is a rear, perspective view of the cradle with meter electronics shown in FIG. 9A.
Figure 9C:
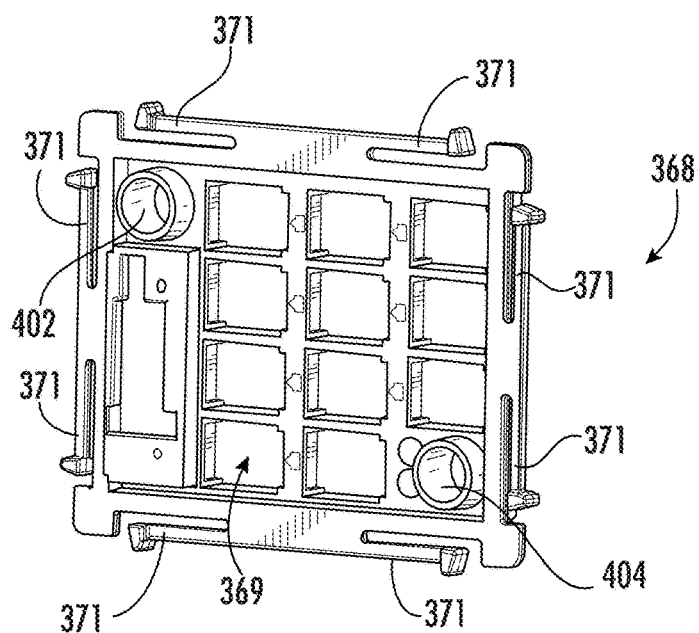
FIG. 9C is a rear perspective view of a connection frame according to an embodiment of the present disclosure.
Figure 9D:
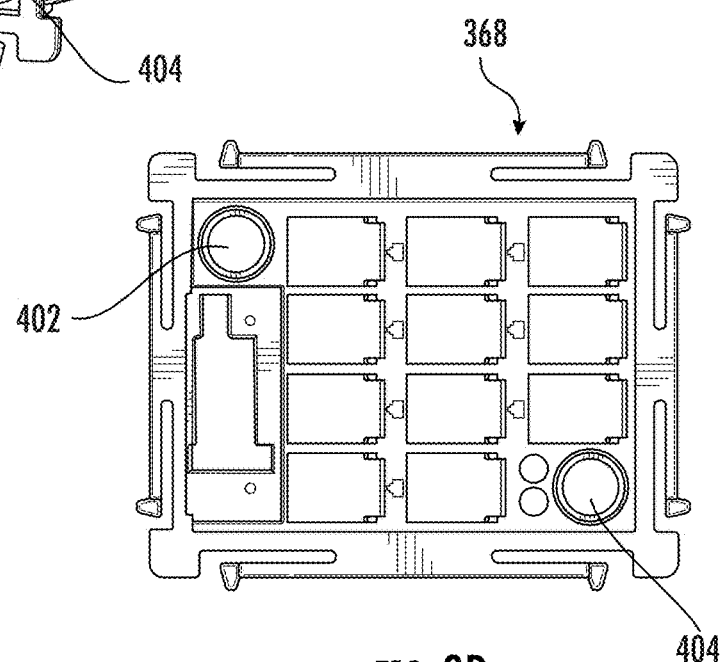
FIG. 9D is a rear view of the connection frame shown in FIG. 9C
Figure 9E:
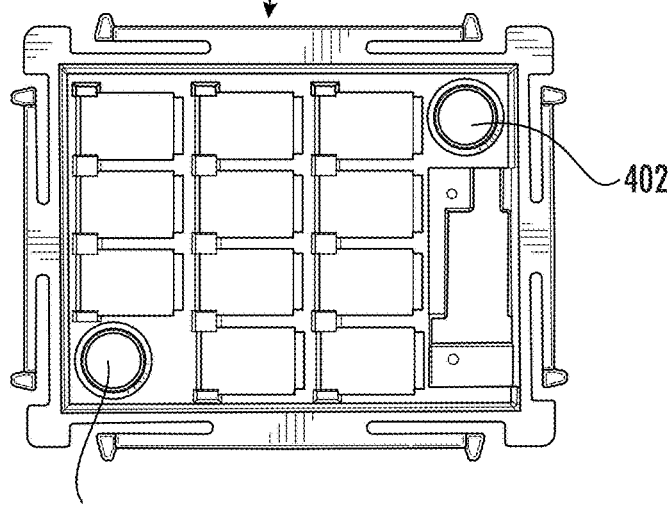
FIG. 9E is a front view of the connection frame shown in FIG. 9C.
Figure 9F:
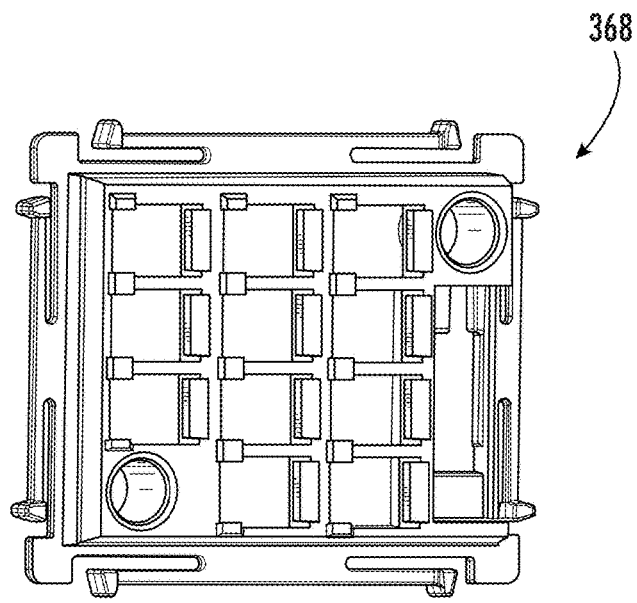
FIG. 9F is a front perspective view of the connection frame shown in FIG. 9C.
Figure 9G:
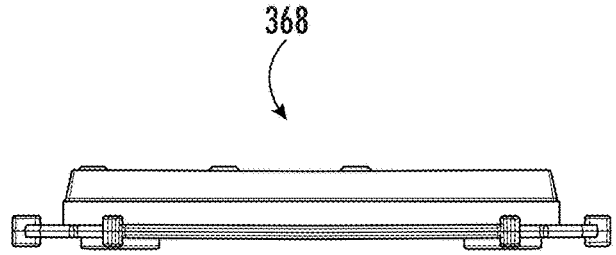
FIG. 9G is a top view of the connection frame shown in FIG. 9C where the bottom view is a mirror image and FIG. 9H is a left side view of the connection frame shown in FIG. 9C where the right side view is a mirror image.
Figure 9H:
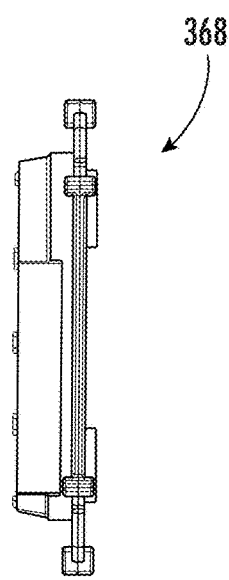
Figure 10A:
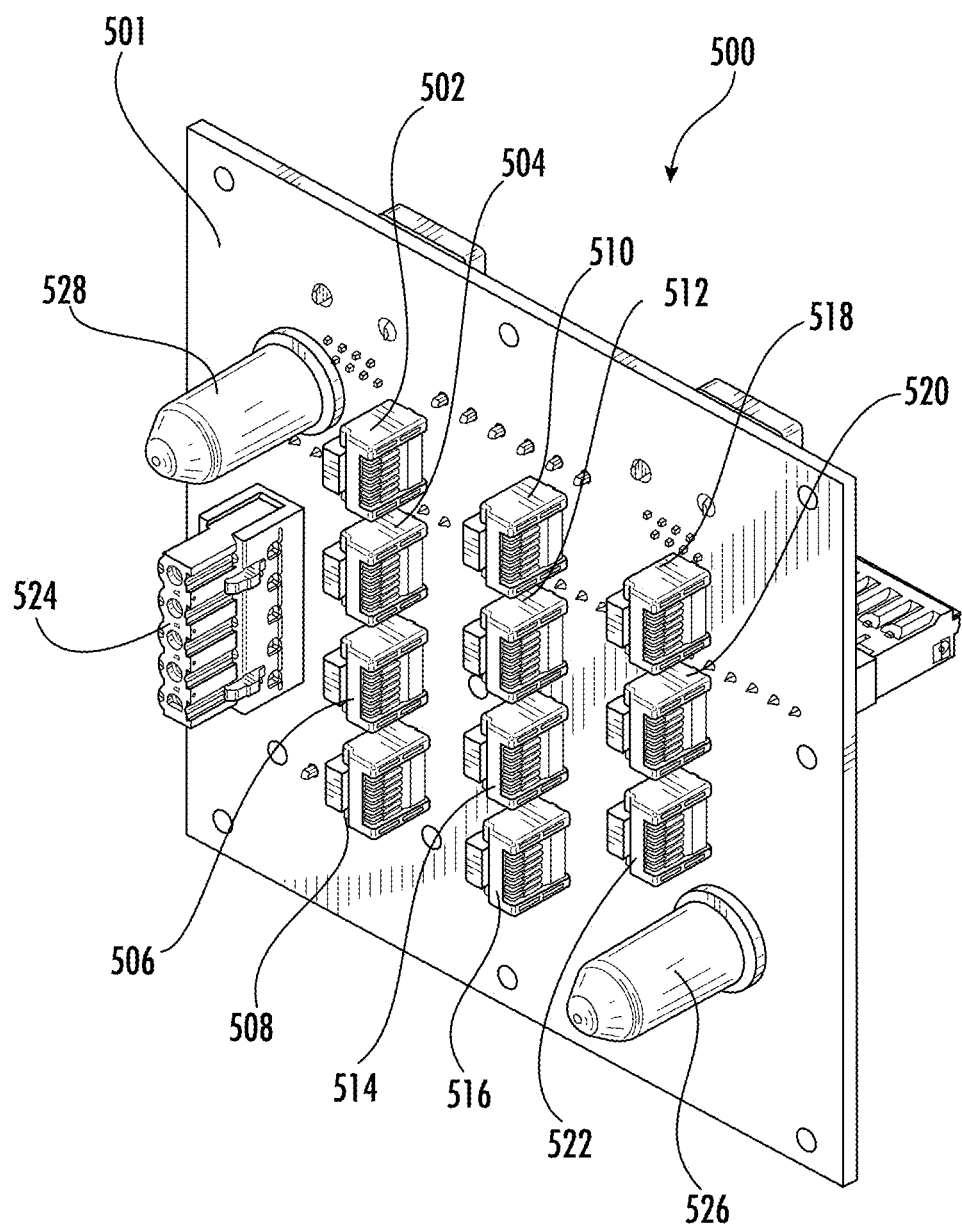
FIG. 10A is a perspective view of a connector board according to an embodiment of the present disclosure.
Figure 10B:
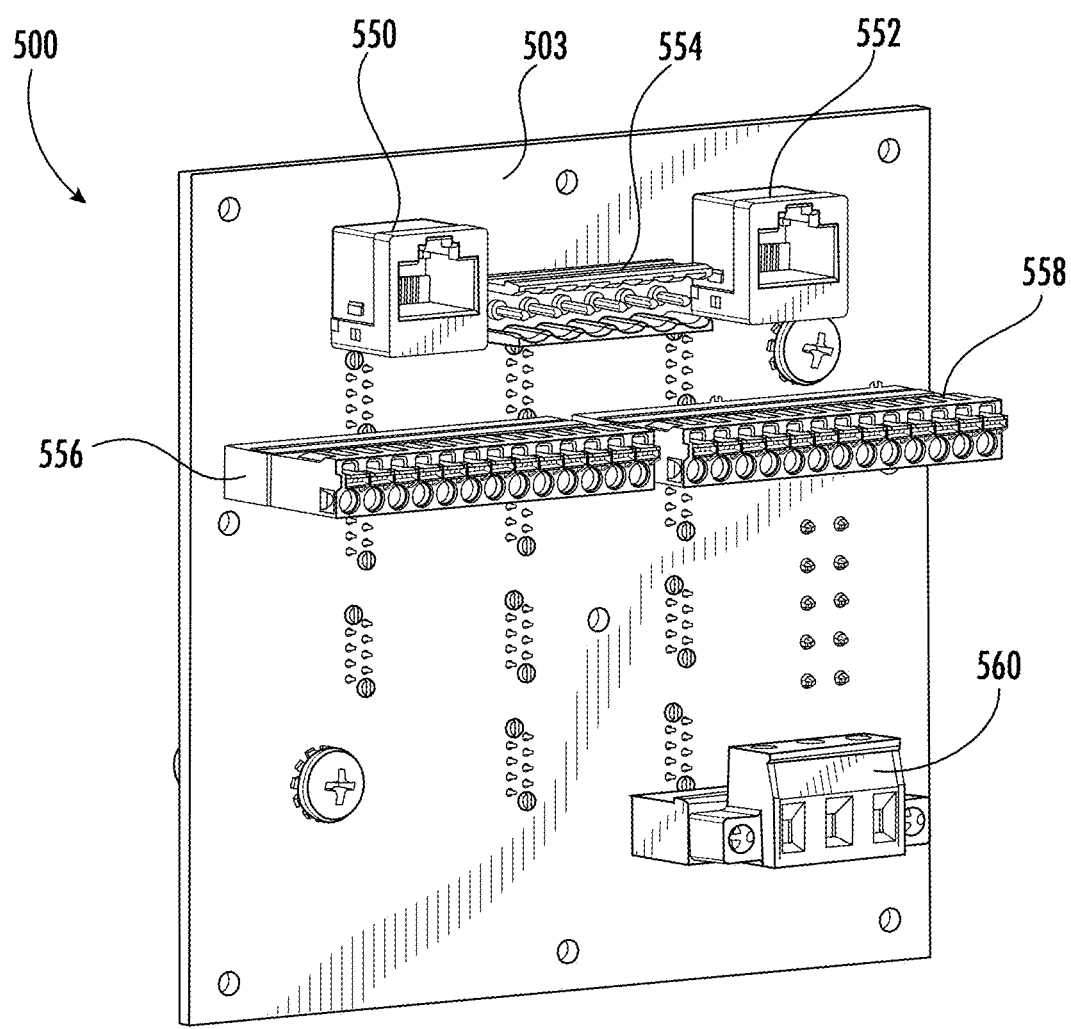
FIG. 10B is a rear, perspective view of the connector board shown in FIG. 10A.
Figure 10C:
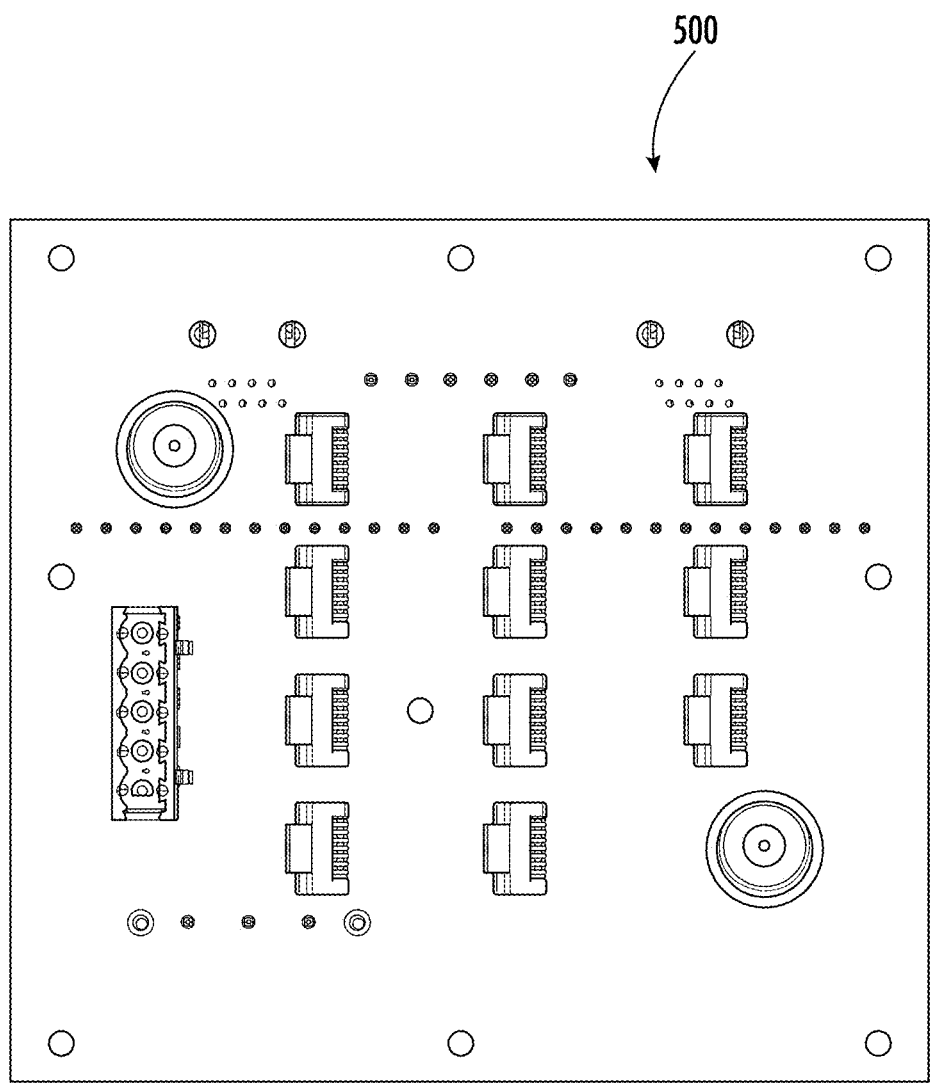
FIG. 10C is a front plan view of the connector board shown in FIG. 10A.
Figure 10D:
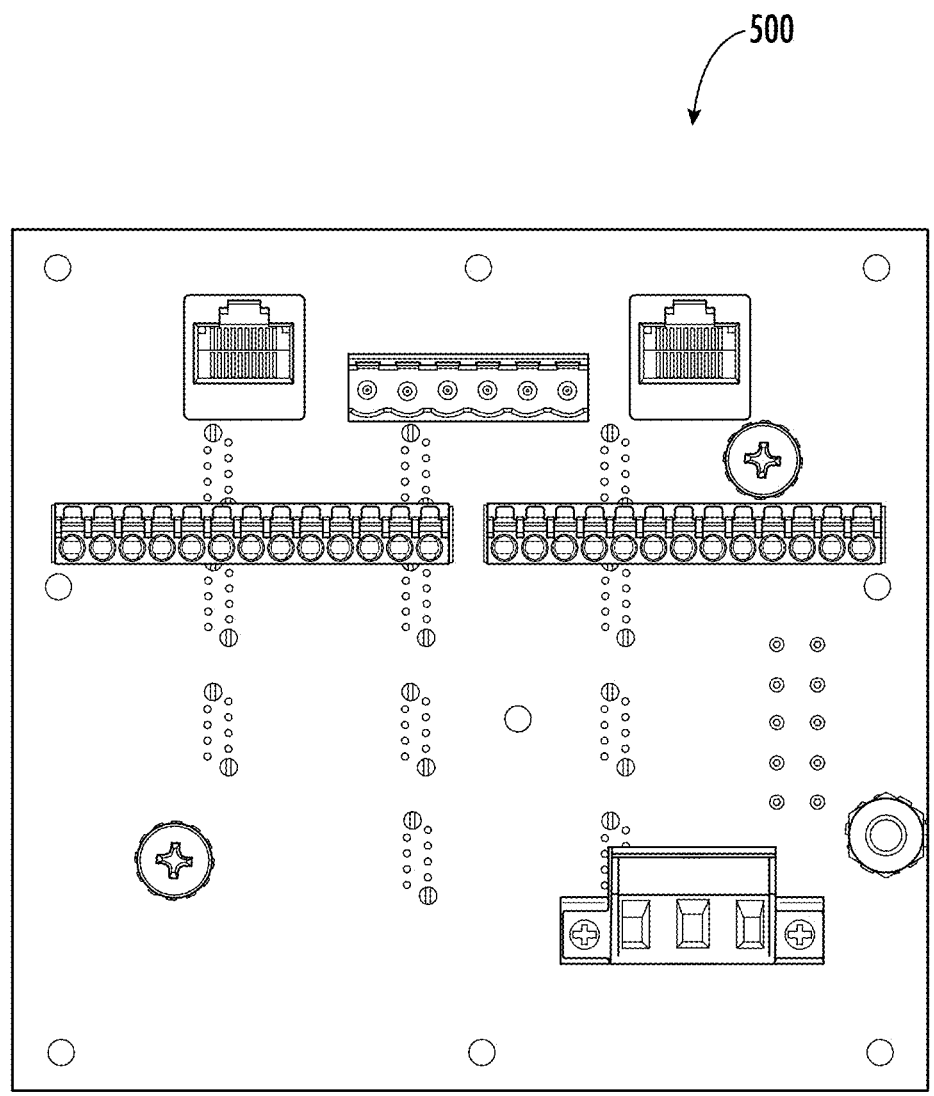
FIG. 10D is a rear plan view of the connector board shown in FIG. 10A
Figure 10E:
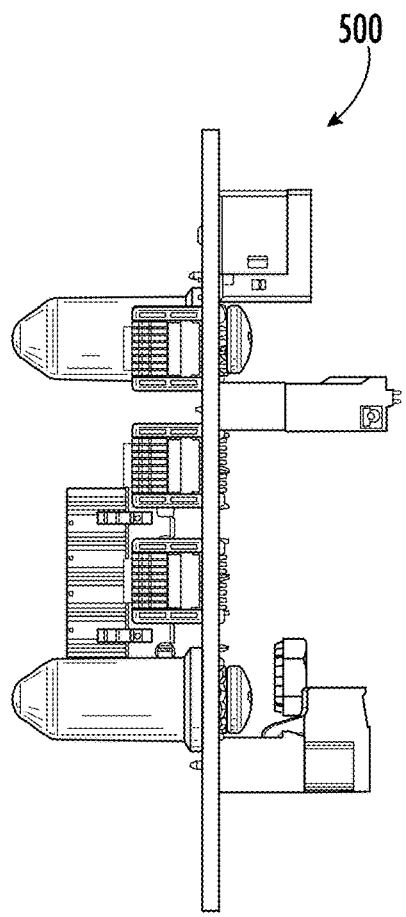
FIG. 10E is a right side view of the connector board shown in FIG. 10A.
Figure 10F:
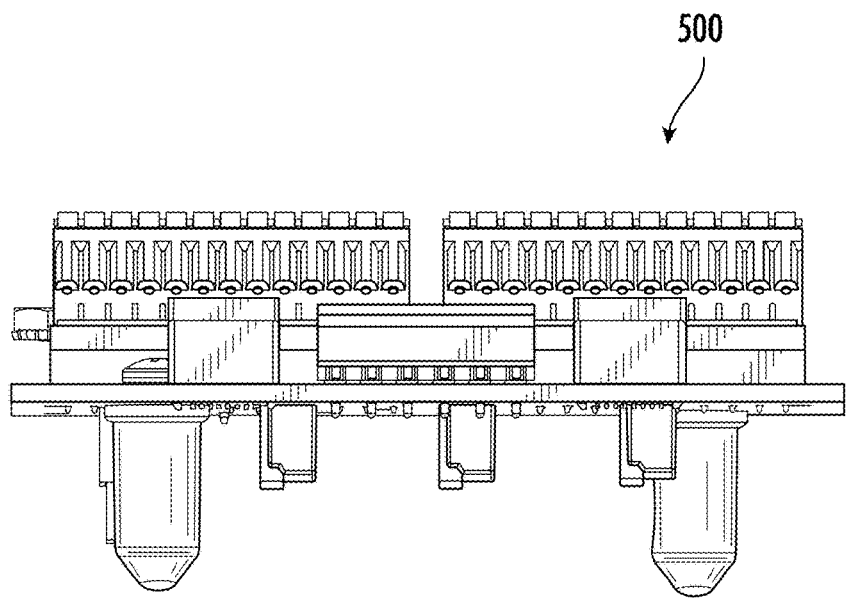
FIG. 10F is a top view of the connector board shown in FIG. 10A.

It is to be appreciated that one side of each connector includes a receptacle that can be accessed via a respective aperture of connection frame 368 and the other side of each connector is configured to be coupled to various modules and/or components disposed in the meter 364 via a cable. Referring to FIGS. 9A and 9B, a cradle 208 with the upper half portion removed is illustrated. FIG. 9A illustrates connectors 372, 374, 376, 378, 380, 382, 384, 386, 388, 390 and 392 that are shown disposed through apertures 369. A patch cable (not shown) may be coupled from the rear side of a connector on one end and the other end may be coupled to a component, function module, communication module, etc. of the meter 364. Exemplary patch cables for coupling a connector and a component, function module, communication module, etc. of meter and/or IED are shown and described in commonly owned U.S. Pat. No. 9,897,461, the contents of which are hereby incorporated by reference.

The functionality of the metering assembly 200 can be expanded by the addition of function modules or cards disposed in the meter 364. Referring to FIG. 9B, function modules or cards may be disposed in the meter 364 via apertures or slots 396, 398 in a back plate 400 of the meter 364. When the function modules or cards (not shown) are fully seated in the meter slots 396, 398, an edge, or other connector of the function modules or cards are received by an appropriate connector of the meter 364, e.g., a connector coupled to DSP 160, 170, CPU 150, FPGA 180 etc., and is thus coupled thereto.

It is to be appreciated that the function modules or cards may add functionality to the IED or meter by including additional processing devices, additional memories or a combination thereof that work in cooperation, or independently, with the processing devices of the DSP, FPGA and/or CPU of the meter. In other embodiments, the function modules or cards may expand the input/output (I/O) and/or the communication capabilities of the meter 364. For example, exemplary I/O modules or cards may include a four channel bi-directional 0-1 mA output card, a four channel 4-20 mA output card, a two relay output/two status input card, a four pulse output/four status input card, etc. or any combination thereof.

Exemplary communication cards or modules may include a 100Base T Ethernet card, an IEC 61850 protocol Ethernet card, a fiber optic communication card, among others. It is to be appreciated that the Ethernet card or module may add at least one of the following capabilities and/or protocols to the IED including, but not limited to, Modbus TCP, DNP 3.0, IEC 61850, 4G LTE cellular, wireless ANSI tables to connect to AMI systems, File Transfer Protocol (FTP), Simple Mail Transfer Protocol (SMTP), SNMP, encryption, IEEE 1588 time sync, etc.

It is further to be appreciated that two communication cards or modules may be employed or disposed in slots 396, 398 to provide dual Ethernet ports. In one embodiment, the dual Ethernet ports may be configured such that each port is independent and communicatively isolated from the other port. Such a configuration is described in commonly owned U.S. Pat. No. 7,747,733, the contents of which are hereby incorporated by reference in its entirety. In this embodiment, each port has a unique identifier, e.g., an IP address, and may be connected to a different network than the other port. In another embodiment, each port connects to the same network. In this embodiment, each port may have the same identifier, e.g., IP address, wherein one of the two ports acts as an Ethernet switch to facilitate network wiring.

In another embodiment, the two Ethernet connections may act as an Ethernet switch. The switch allows users to effectively daisy chain Ethernet connections from one meter to another without having to run cabling back to discrete switches within a facility or substation control house. The second Ethernet port can also be used to run redundant protocols for improved reliability. One such example is PRP protocol or Parallel Redundancy Protocol (standardized by the IEC 62439-3:2016) which is unique in the metering industry because it would allow seamless fallover against failure of any network component with the system. To date, there are no good options for substation IT groups to receive data using a protocol that would allow for a seamless fallover. The benefit of using a PRP style protocol with IEDs, such as revenue meters, is that two separate networks can be maintained and if one fails, it is seamless to an end user. In one exemplary embodiment, the meter 364 has two Ethernet ports attached to two separate local area networks (LANs) of arbitrary, but similar topology. The two LANs have no links connecting them and are assumed to be fail-independent, to avoid common mode failures. The two Ethernet interfaces of the meter 364 use the same MAC address. This is allowed since the two LANs have no connection. Therefore, PRP is a layer 2 redundancy, which allows higher layer network protocols to operate without modification. The meter 364, via a network card, sends simultaneously two copies of a frame, one over each port. The two frames travel through their respective LANs until they reach a destination node (DANP), e.g., another meter, RTU, headend, etc., with a certain time skew. The destination node accepts the first frame of a pair and discards the second (if it arrives). Therefore, as long as one LAN is operational, the destination application always receives one frame. PRP provides zero-time recovery and allows to check the redundancy continuously to detect lurking failures.

It is to be appreciated that the above-mentioned list of cards and/or modules, whether intelligent or passive, is not exhaustive and other types of inputs, outputs and communication protocols are contemplated to be within the scope of the present disclosure. Further exemplary cards and/or modules and techniques for coupling such cards and/or modules to add functionality, capabilities, etc. are disclosed and described in commonly owned U.S. Pat. Nos. 7,184,904 and 7,994,934, the contents of which are hereby incorporated by reference in their entireties.

It is further to be appreciated that the RJ45 connectors are merely exemplary and other types of plugs, receptacles, connectors, etc. are contemplated to be within the scope of the present disclosure.

When the cradle 208 is disposed in the enclosure 204, the connectors in the connection frame 368 mate with corresponding connectors on a connection board 500 mounted on the rear wall 238 of the enclosure 204. Referring to FIGS. 10A through 10F, the connection board 500 includes a first surface 501 and a second surface 503. The first surface 501 of the connection board 500 includes a plurality of connectors 502, 504, 506, 508, 510, 512, 514, 516, 518, 520, 522 and 524. In one embodiment, connectors 502, 504, 506, 508, 510, 512, 514, 516, 518, 520, 522 are configured as RJ-45 plugs. It is to be appreciated that regardless of the type of connector for connectors 502, 504, 506, 508, 510, 512, 514, 516, 518, 520, 522, 524, the connectors disposed in the connection frame 368 will be configured to mate with the connectors of the connection board 500. The first surface 501 further includes an alignment mechanism, e.g., alignment members 526 and 528, the function of which will be described below.

The second surface 503 of connection board 500 includes connectors 550, 552, 554, 556, 558 and 560. The connection board 500 is constructed of a multi-layer printed circuit board that electrically couples connectors 502, 504, 506, 508, 510, 512, 514, 516, 518, 520, 522, 524 disposed on the first surface 501 to connectors 550, 552, 554, 556, 558, 560 disposed on the second surface 503. In one embodiment, connector 518 is coupled to connector 550, connector 510 is coupled to connector 554, connector 502 is coupled to connector 552, connectors 520, 512, 522 are coupled to connector 556, connectors 504, 514, 506 are coupled to connector 558 and connector 524 is coupled to connector 560. It is to be appreciated that other connection schemes between the connectors on the first surface 501 and second surface 503 are contemplated to be within the scope of the present disclosure.

Figure 2A:
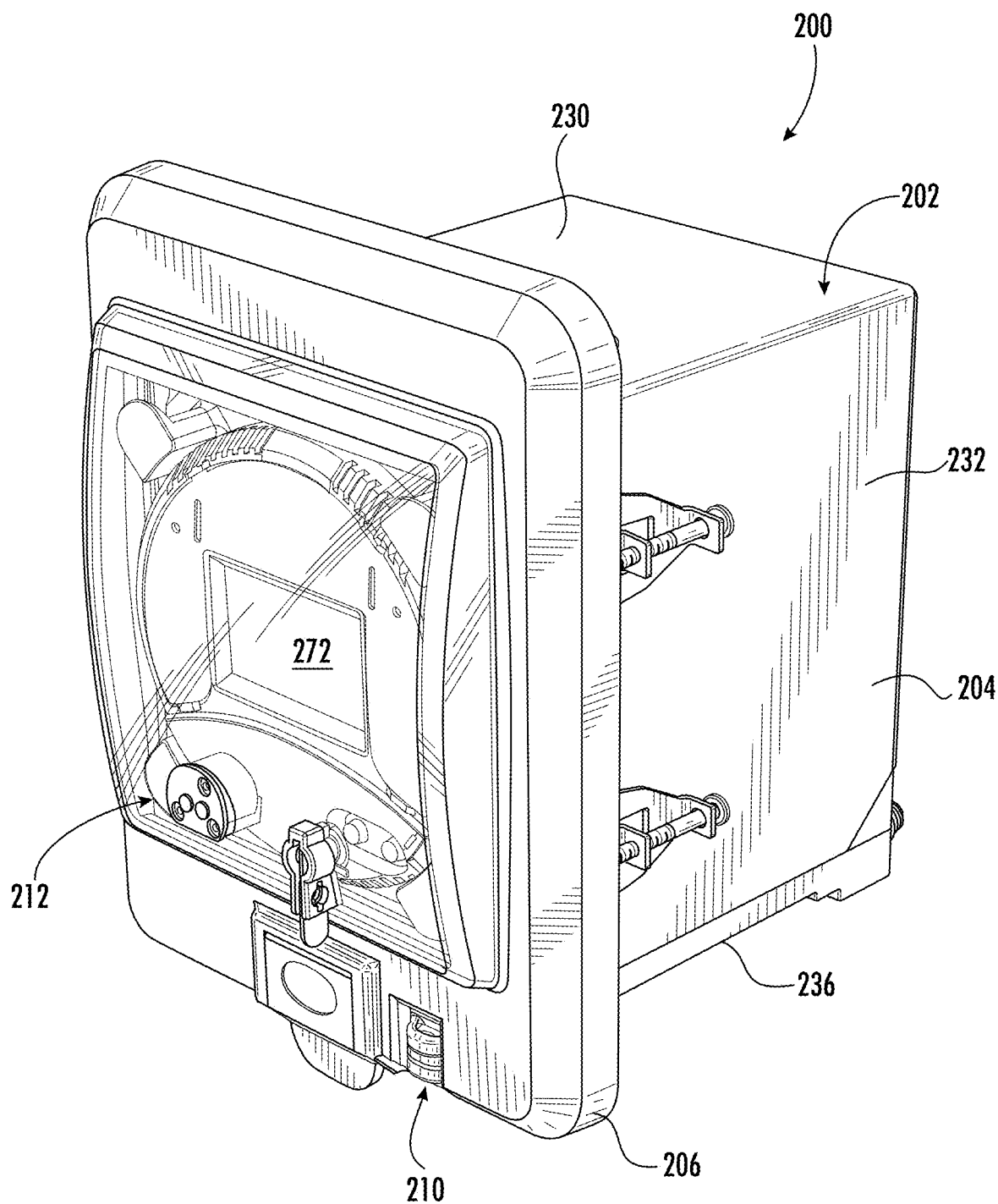
FIG. 2A is a front, perspective view of a metering assembly according to an embodiment of the present disclosure.
Figure 2B:
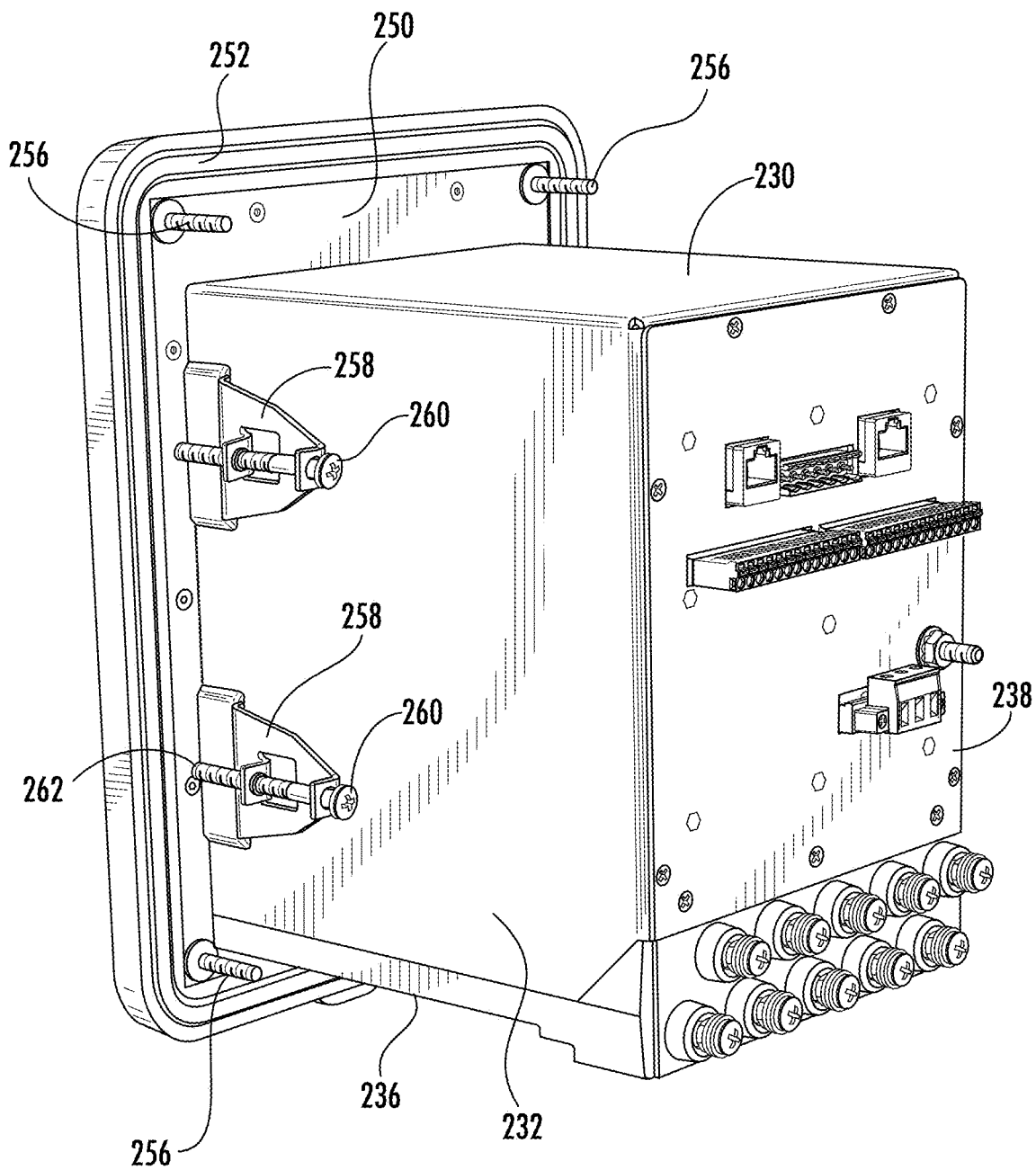
FIG. 2B is a rear, perspective view of the metering assembly shown in FIG. 2A.
Figure 2C:
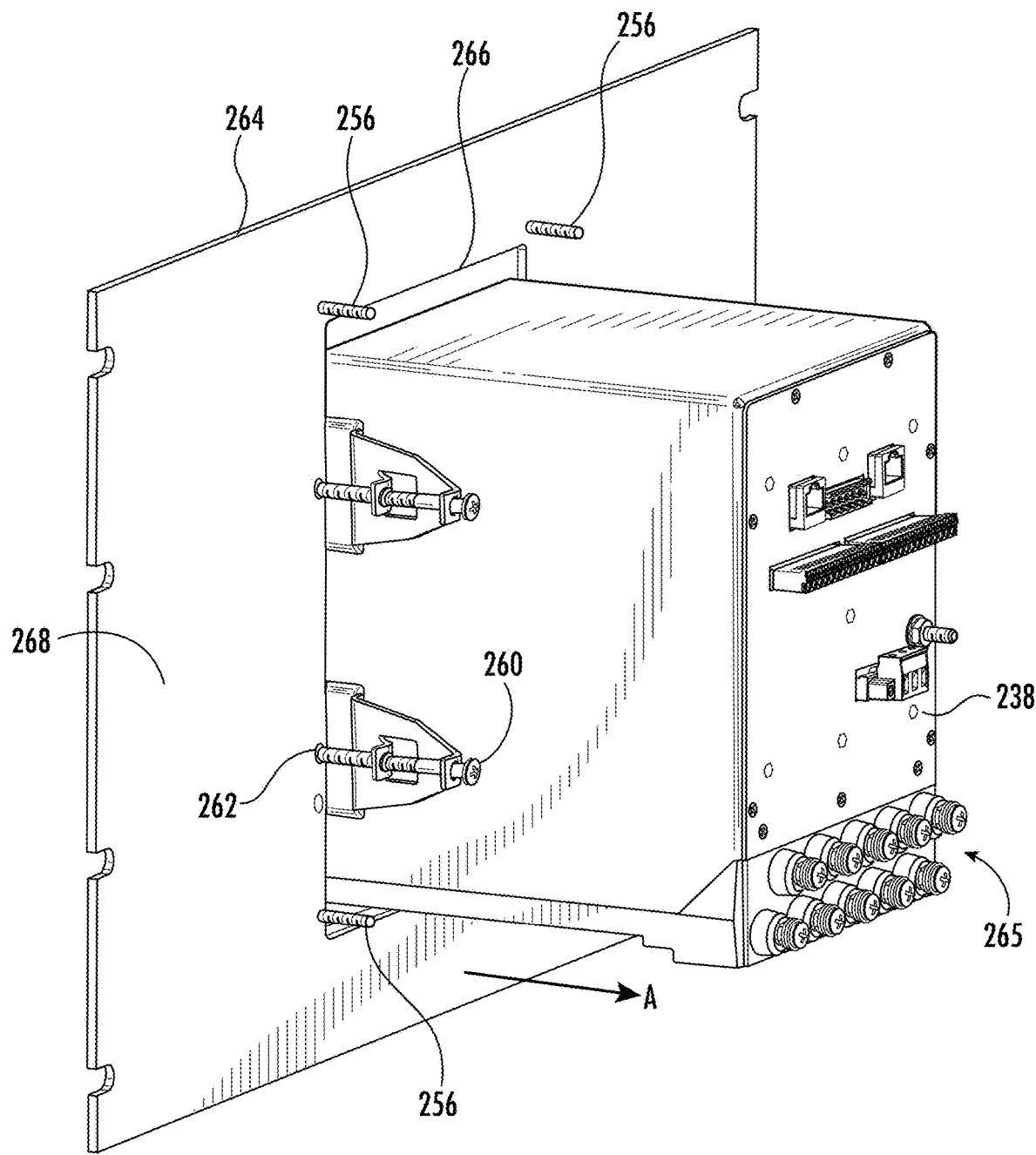
FIG. 2C is a rear, perspective view of the metering assembly shown in FIG. 2A mounted in a switchboard panel.
Figure 2D:
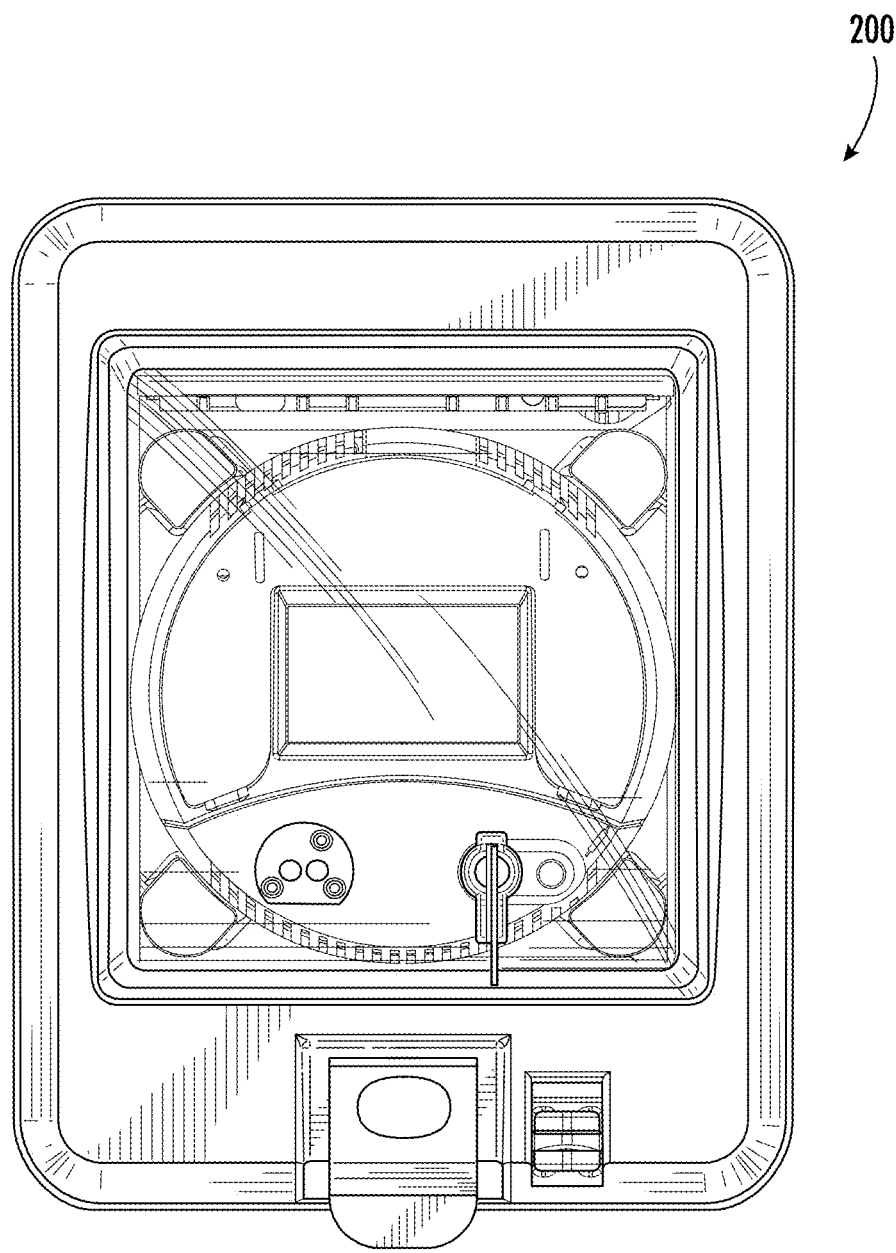
FIG. 2D is a front plan view of the metering assembly shown in FIG. 2A.
Figure 2E:
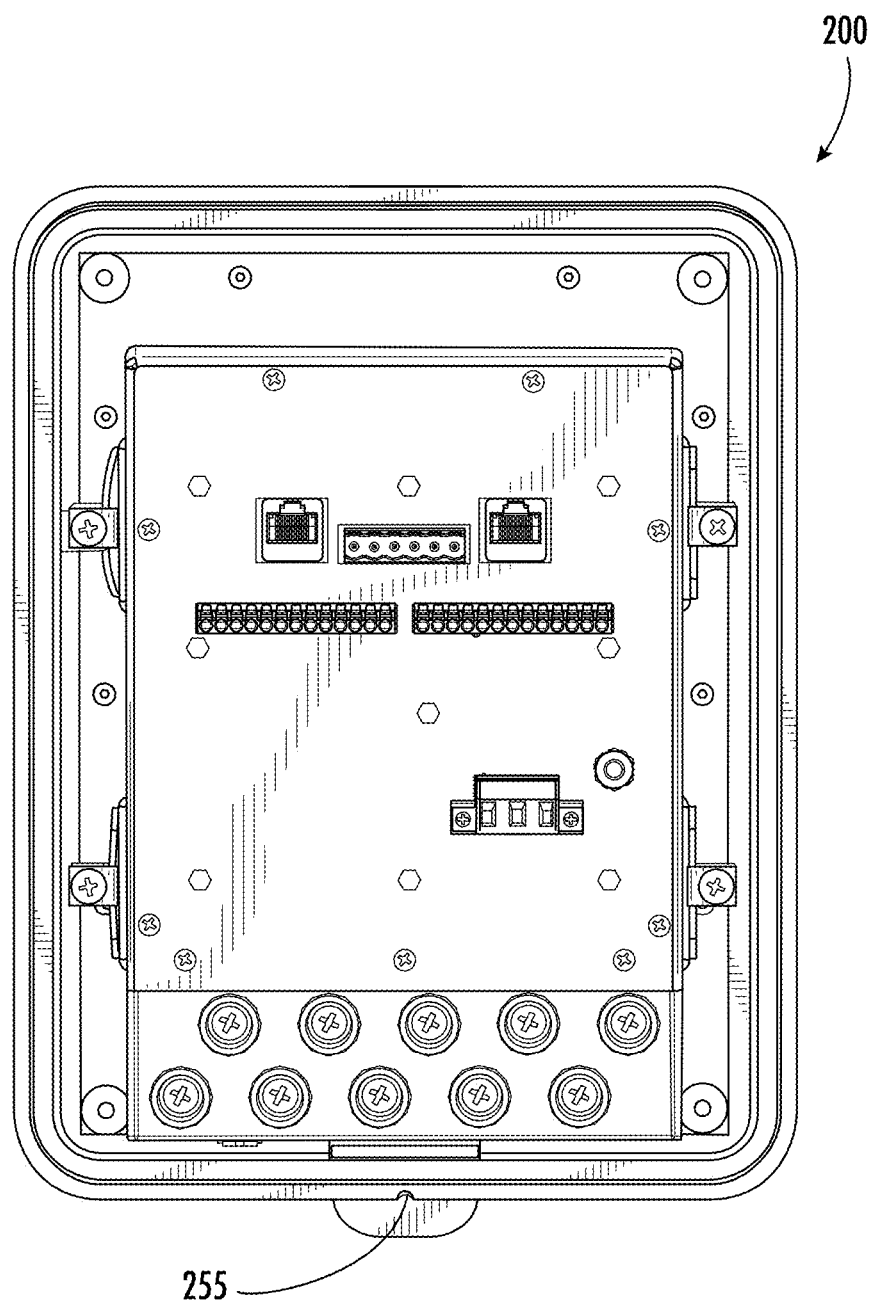
FIG. 2E is a rear plan view of the metering assembly shown in FIG. 2A.
Figure 2F:
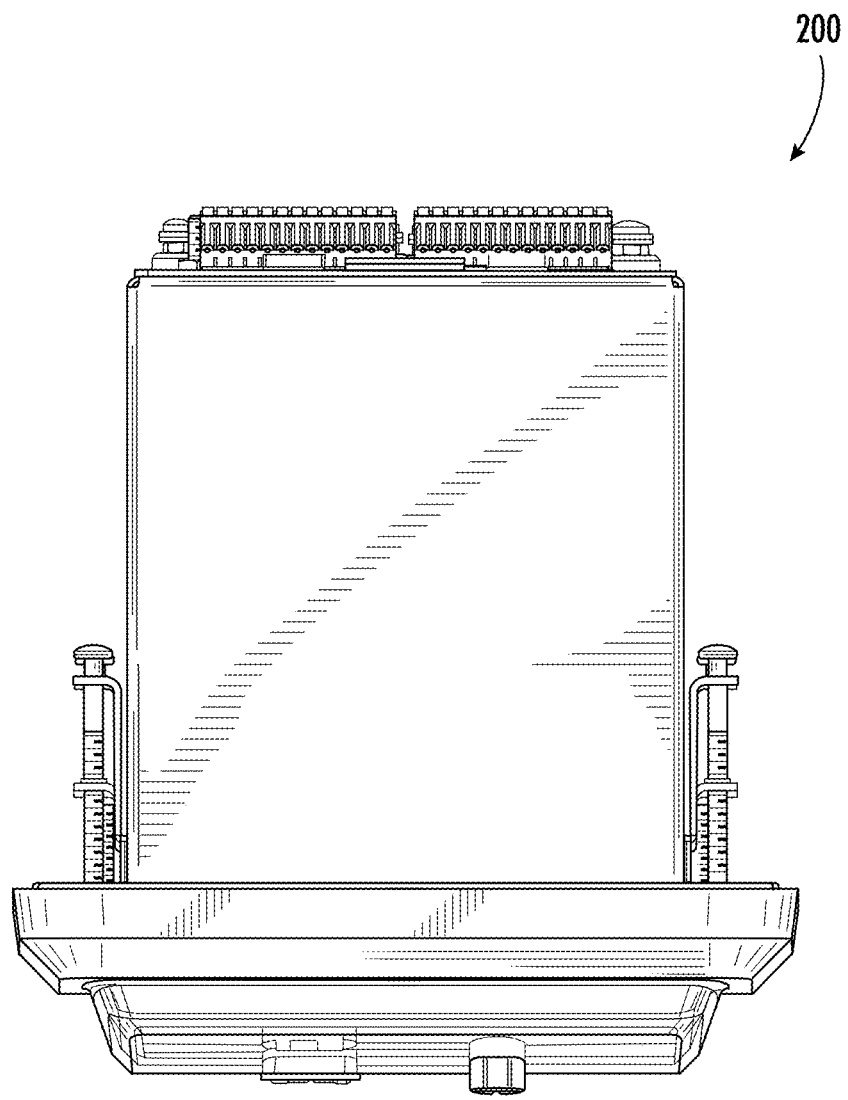
FIG. 2F is a top plan view of the metering assembly shown in FIG. 2A.
Figure 2G:
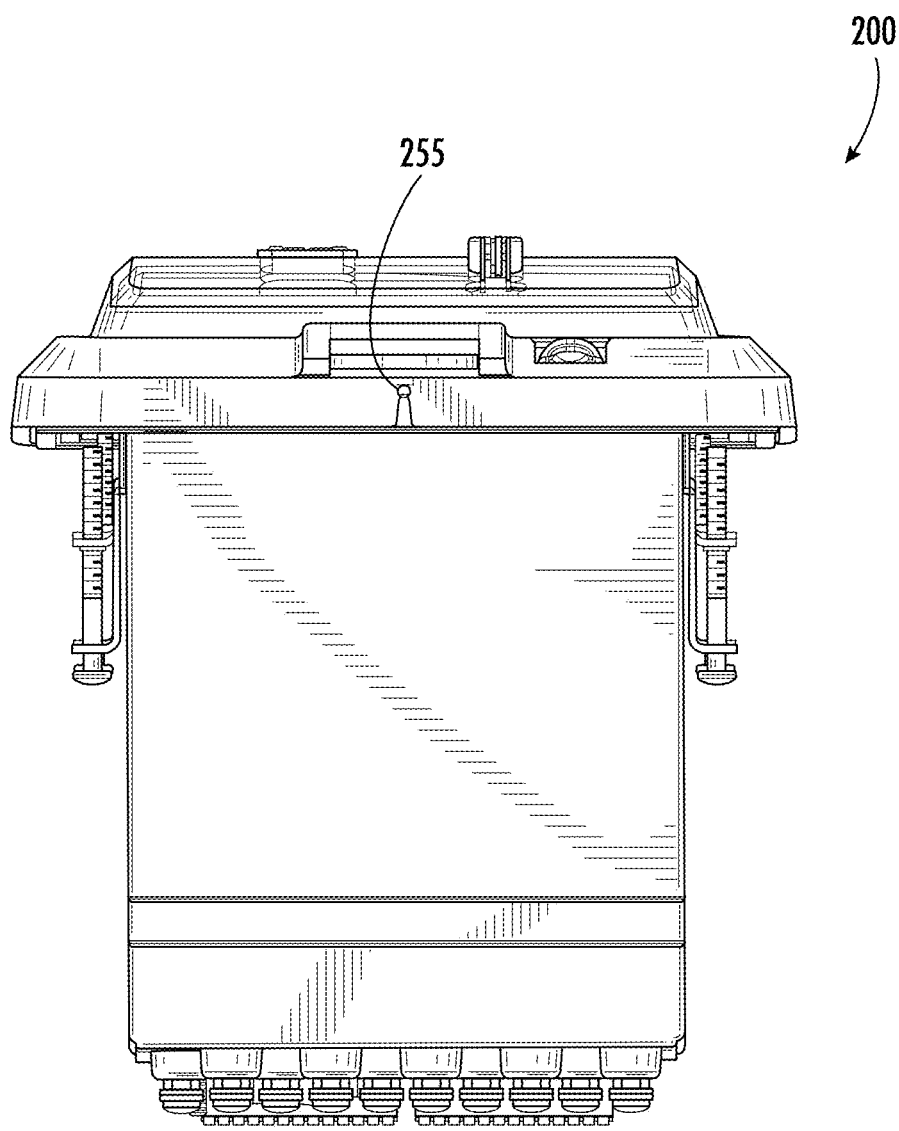
FIG. 2G is a bottom plan view of the metering assembly shown in FIG. 2A.
Figure 2H:
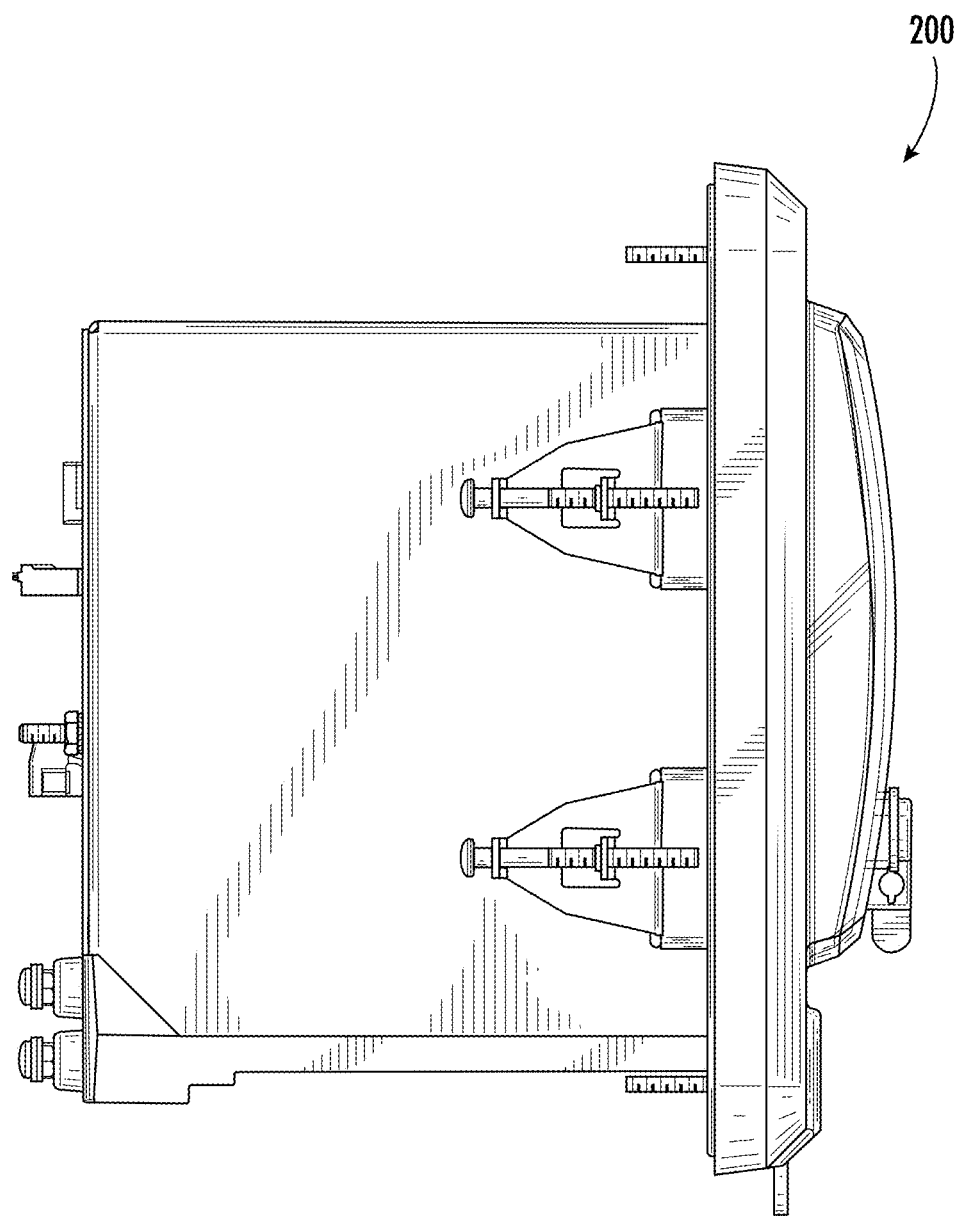
FIG. 2H is a left side view of the metering assembly shown in FIG. 2A.
Figure 2I:
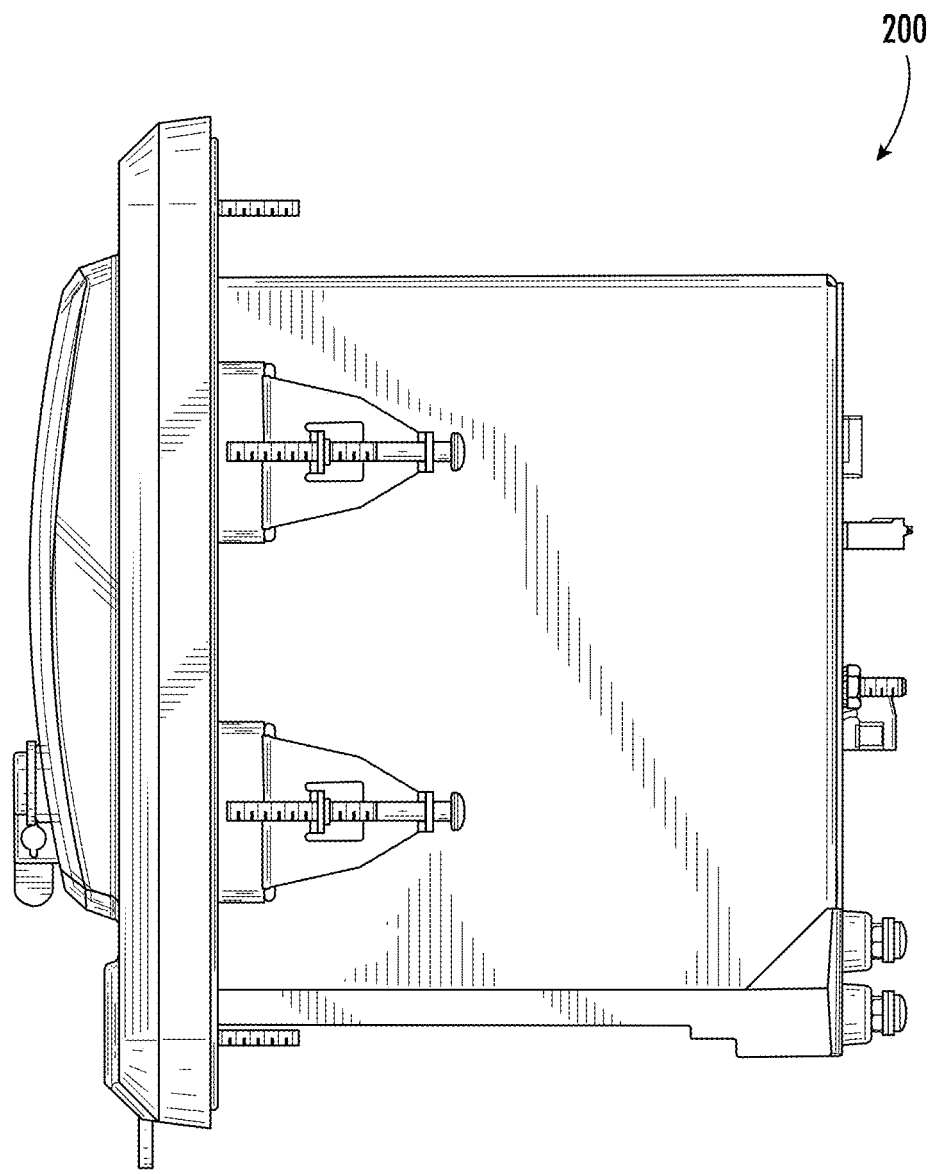
FIG. 2I is a right side view of the metering assembly shown in FIG. 2A.
Figure 4:
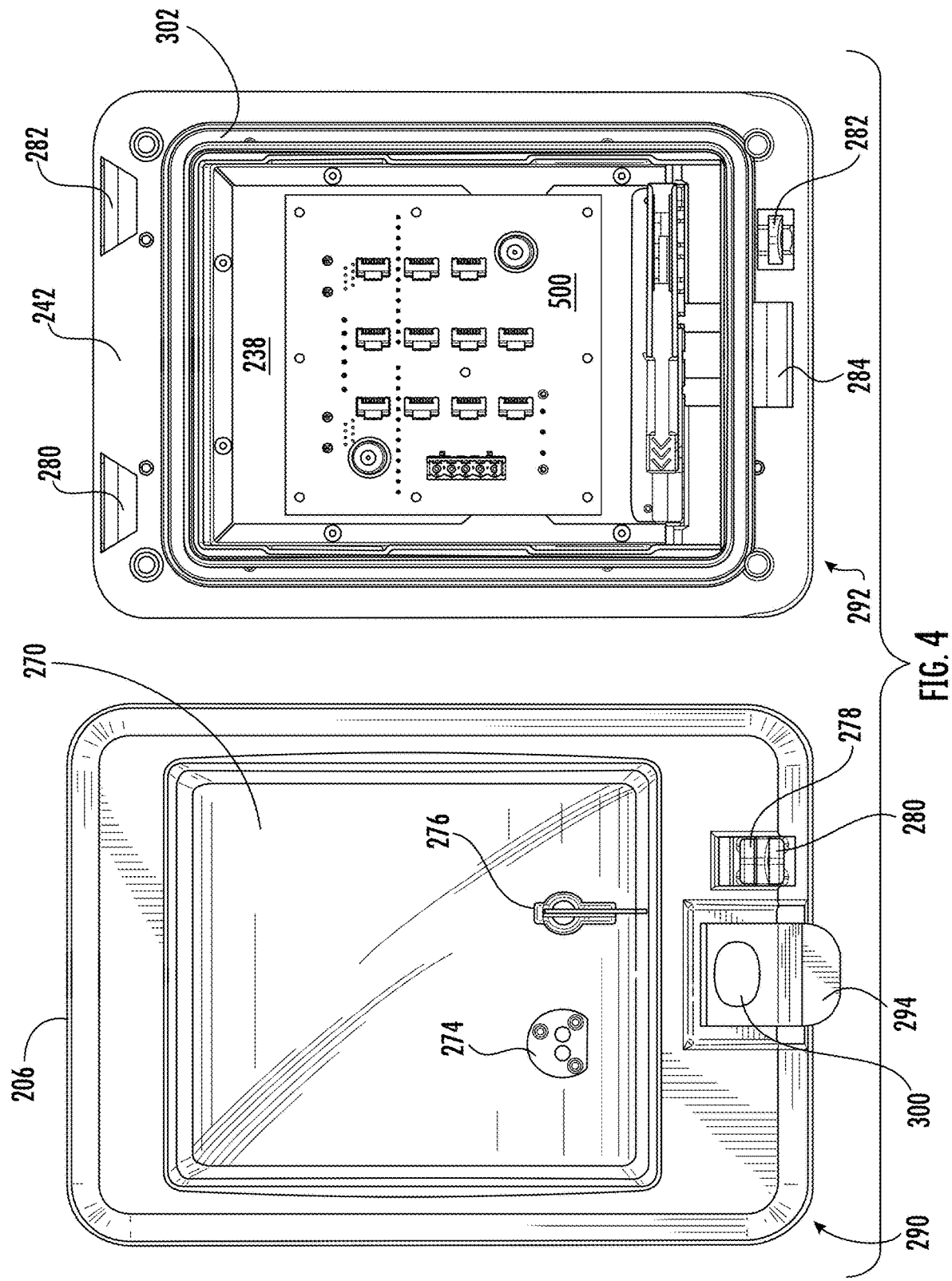
FIG. 4 is a front view of a cover and an enclosure of a switchboard case side-by-side according to an embodiment of the present disclosure.

Referring back to FIG. 3C, the metering assembly 200 is shown in an exploded view. The rear wall 238 is shown separated from the enclosure 204. The rear wall 238 includes a plurality of cutouts 239 that allow the connectors 550, 552, 554, 556, 558 and 560 on the second surface 503 of the connection board 500 to extend therethrough. The rear wall 238 is coupled to the enclosure 204 by any one of various methods including, but not limited to, bolting, riveting, welding, etc., and the connection board 500 is coupled to the rear wall 238. FIGS. 4, 6A and 6B provide internal views of the 240 cavity of the enclosure 204 that illustrate the connection board 500 coupled to the rear wall 238. FIGS. 2B, 2C and 3B provide views of the rear of the enclosure 204 to illustrate the rear wall 238 and connectors 550, 552, 554, 556, 558 and 560 extending therethrough.

It is to be appreciated that rear wall 238 and connection board 500 may be customized or reconfigured for a particular application and/or location without having to reconfigured or modify other parts or components described herein. For example, a type and/or location of connectors 550, 552, 554, 556, 558 and 560 may be changed or modified on connection board 500, where the cutouts of rear wall 238 are configured to accommodate the new type and/or location of connectors 550, 552, 554, 556, 558 and 560 without modifying other components of the assembly.

As described above, when the cradle 208 is disposed in the enclosure 204, the connectors in the connection frame 368 mate with corresponding connectors on a connection board 500 mounted on the rear wall 238 of the enclosure 204. However, due to manufacturing tolerances, the connectors in the connection frame 368 may not precisely align with the corresponding connectors on the connection board 500. Therefore, the connection frame 368 is configured to float within the upper half portion 360 and lower half portion 362 of the cradle 208 to compensate and allow for manufacturing tolerances.

As shown in FIGS. 9C-9H, the connection frame 368 includes at least one spring arm 371 coupled to a peripheral edge of the frame 368. In one embodiment, the frame 368 is generally rectangular and includes at least one spring arm on each of the four edges of the frame 368. As best shown in FIG. 9B, the lower half portion 362 of cradle 208 includes a channel 373 in which the connection frame 368 is disposed. Although not shown, the upper half portion 360 of the cradle 208 includes a channel similar to channel 373 such that when the upper half portion 360 is coupled to the lower half portion 362, the connection frame 368 is completely surrounded by a channel. It is to be appreciated that the spring arms 371 of the connection frame 368 enables the connection frame to move (or float) in any direction within the plane of the channel of the cradle when the spring arms 371 flex. When the cradle 208 is disposed in the enclosure 204, the alignment members 526, 528 of the connection board 500 enter the alignment apertures 402, 404 of the connection frame 368 and adjust the connection frame 368 so complementary connectors 372, 374, 376, 378, 380, 382, 384, 386, 388, 390, 392, 406 on the connection frame 368 align with the connectors 502, 504, 506, 508, 510, 512, 514, 516, 518, 520, 522, 524 disposed on the first surface 501 of the connection board 500. It is to be appreciated that the alignment apertures 402, 404 are dimensioned slightly larger than the alignment members 526, 528 to receive the alignment member 526, 528 and any force applied to an inner surface of the alignment apertures 402, 404 by the alignment mechanism or members 526, 528 will cause the connection frame 368 to move into alignment via the flexing of the spring arms 371. Once aligned and the cradle 208 is further urged into the enclosure 204, the complementary connectors 372, 374, 376, 378, 380, 382, 384, 386, 388, 390, 392, 406 on the connection frame 368 will mate with the connectors 502, 504, 506, 508, 510, 512, 514, 516, 518, 520, 522, 524 disposed on the first surface 501 of the connection board 500. Once the cradle 208 is fully seated in the enclosure 204, connectors 550, 552, 554, 556, 558 and 560 may be coupled to the meter 364 (depending on the function modules or cards disposed in the meter 364) enabling access, e.g., communications, input/output functionally, etc., to the meter 364 without opening the cover 206 of the case 202.

Figure 8F:
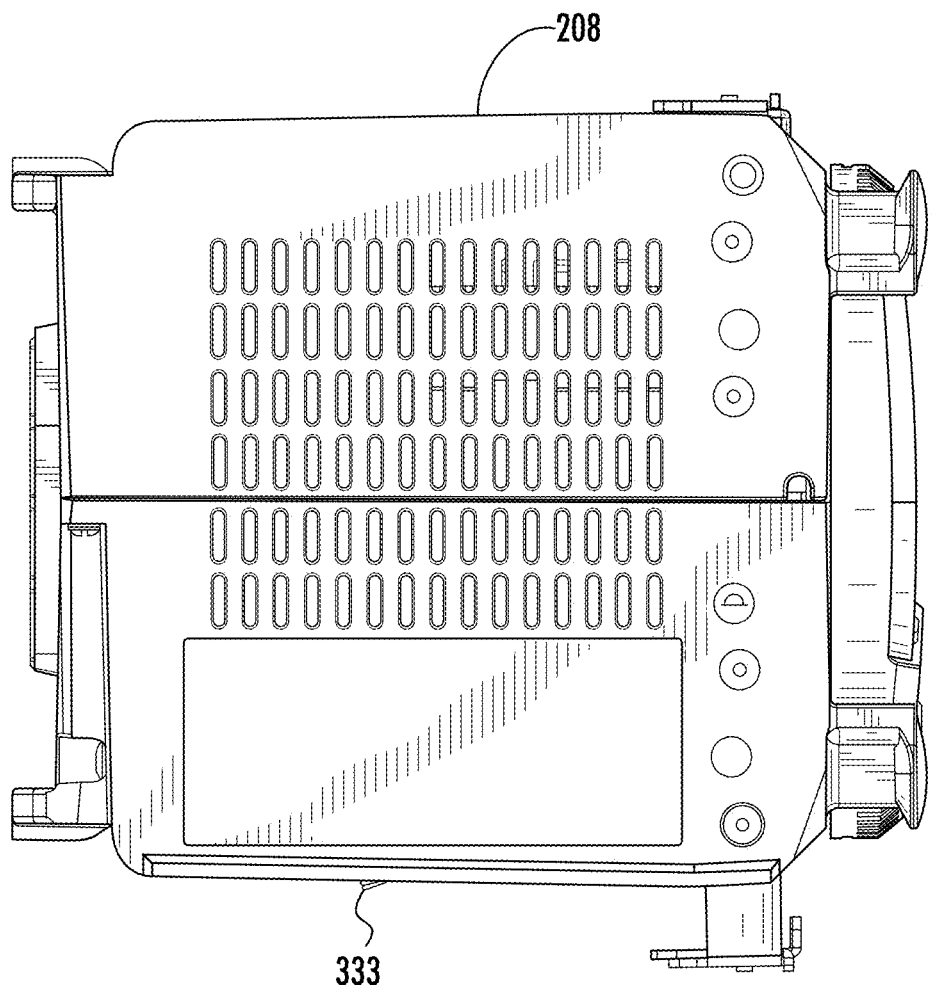
FIG. 8F is left side view of the cradle shown in FIG. 8A.
Figure 8G:
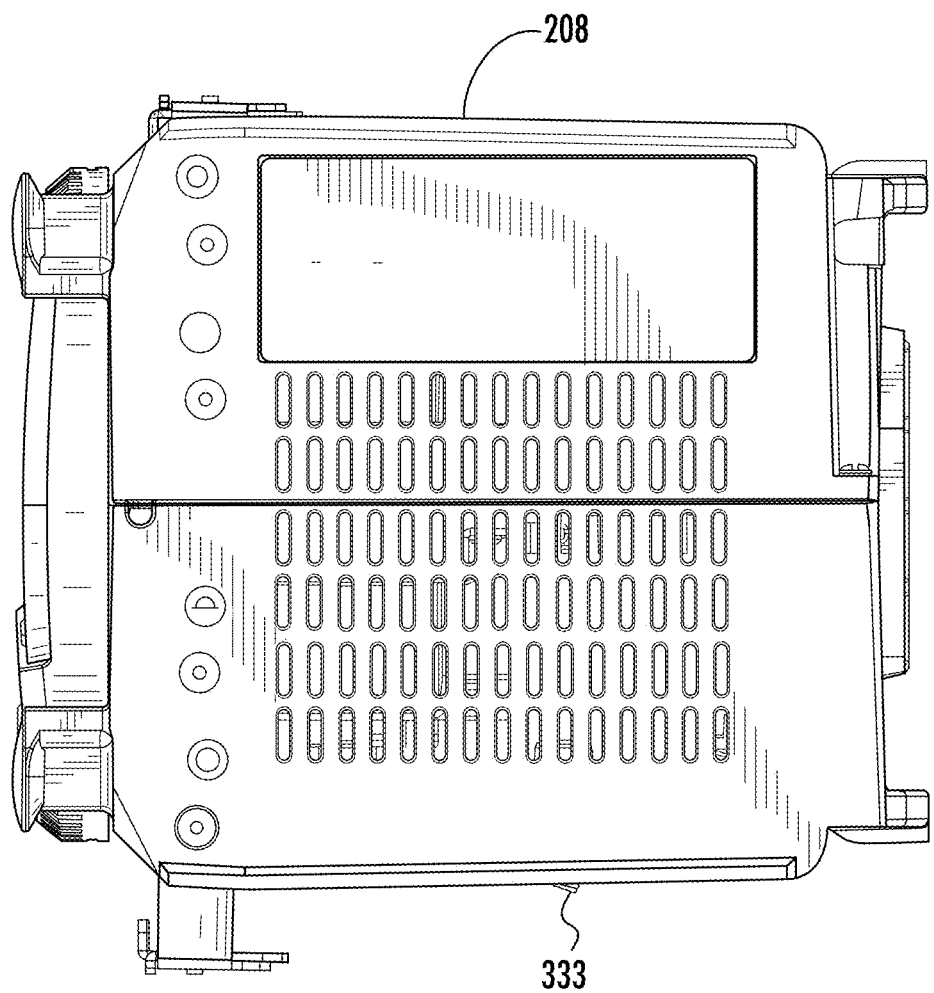
FIG. 8G is right side view of the cradle shown in FIG. 8A.
Figure 8H:
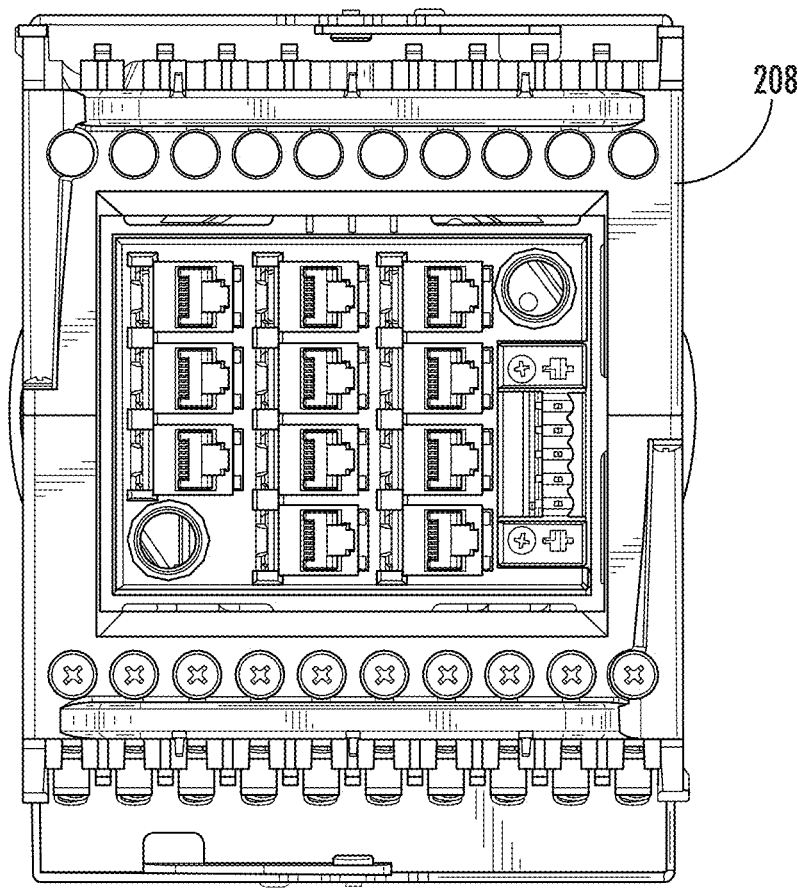
FIG. 8H is rear plan view of the cradle shown in FIG. 8A.

In certain embodiments, a retaining member is provided to maintain connections 332 of cradle 208 at an appropriate position. As shown in FIGS. 8C, 8F and 8G, a free end 333 of each connection 332 disposed on the bottom of the cradle 208 extends beyond the bottom plane of the cradle 208. The ends 333 are positioned so that when the cradle 208 is disposed in the enclosure 204 the connections 332 of cradle 208 do not make contact with connections 330 of the enclosure 204 until an appropriate paddle is disposed therebetween. Potentially, the ends 333 may extend beyond the bottom plane of the cradle 208 at such a distance that the ends 333 may make contact with the connections 330 causing a potential hazard. To avoid this potential hazard, a retaining member 602 may be provided, as shown in FIGS. 11A-11J.

Retaining member 602 includes a plurality of tabs 604 configured to retain ends 333 at an appropriate position, as will be described in more detail below. The retaining member further includes a plurality of alignment members 606 for aligning the retaining member 602 to the lower half portion 362 of the cradle 208 and a plurality of retaining arms 608 for securing the retaining member 602 to the cradle 208.

Figure 11A:
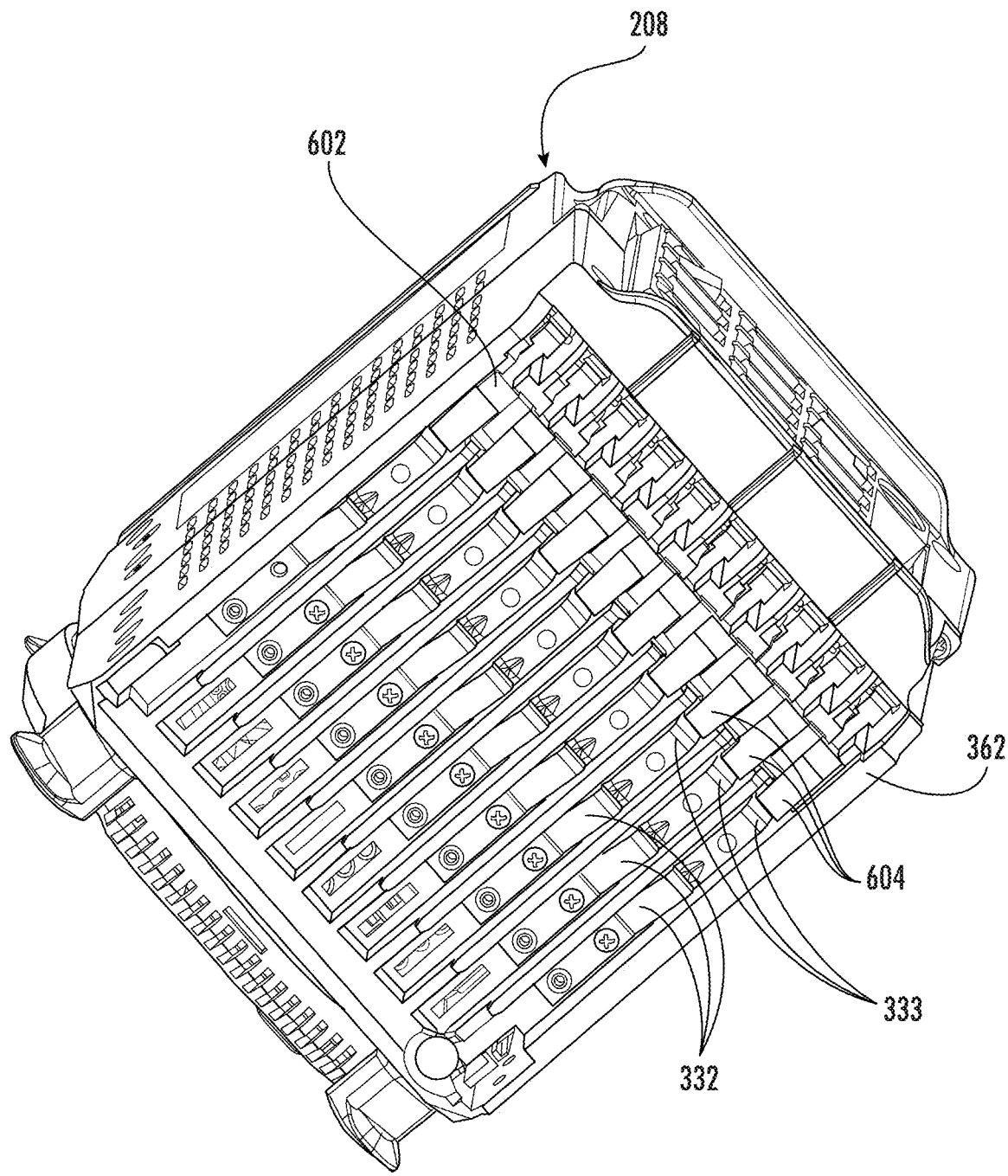
FIG. 11A is bottom view of the cradle shown in FIG. 8A in accordance with another embodiment of the present disclosure illustrating a retaining member.
Figure 11B:
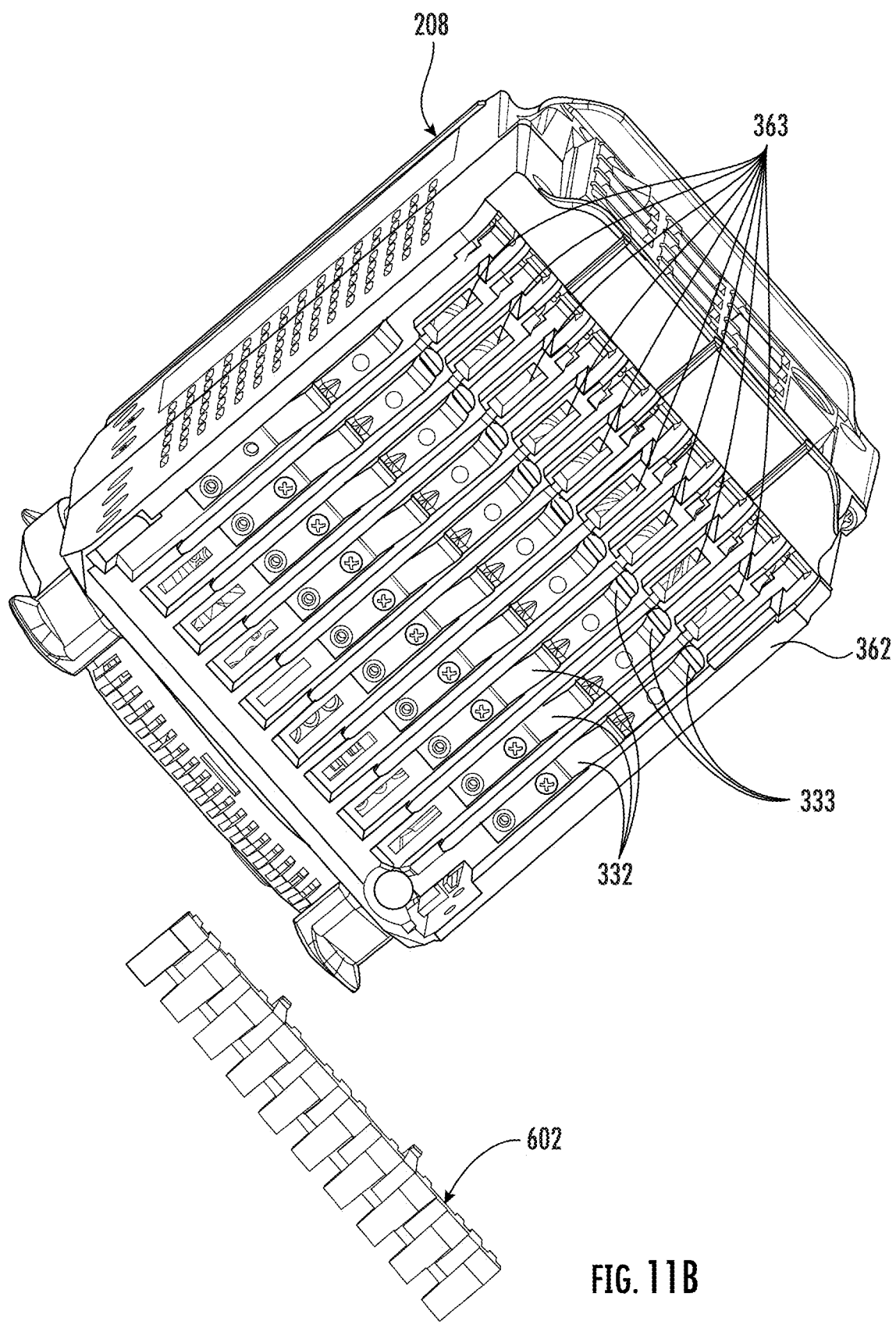
FIG. 11B illustrates the cradle shown in FIG. 11A with the retaining member removed.
Figure 11C:
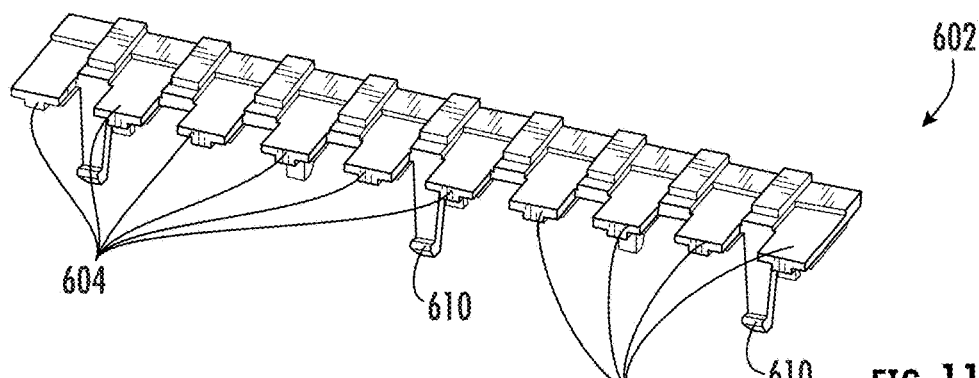
FIG. 11C is a top perspective view of the retaining member shown in FIG. 11A.
Figure 11D:
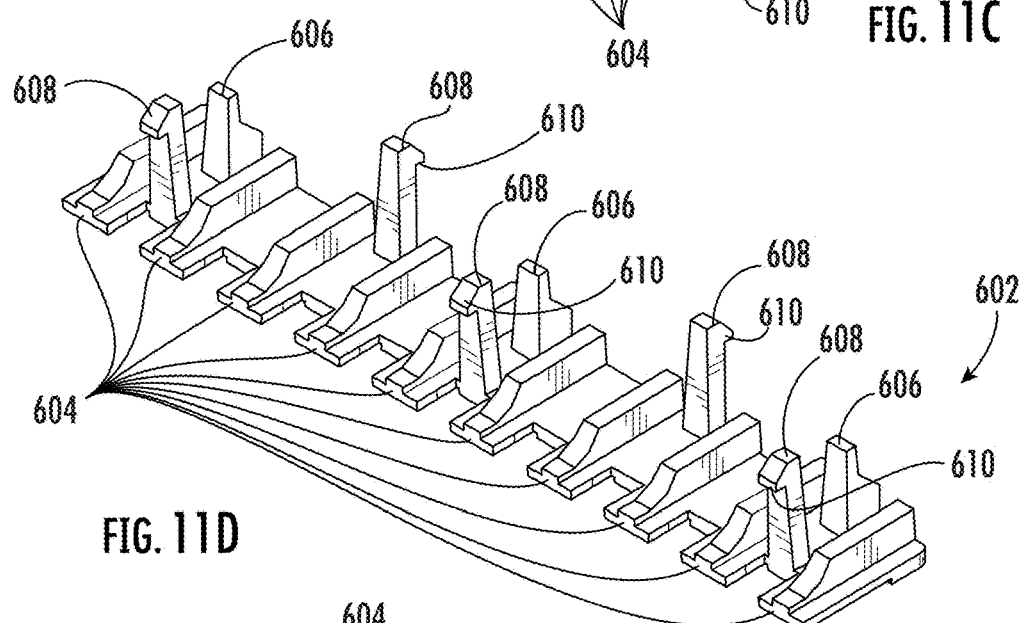
FIG. 11D is a bottom perspective view of the retaining member.
Figure 11E:
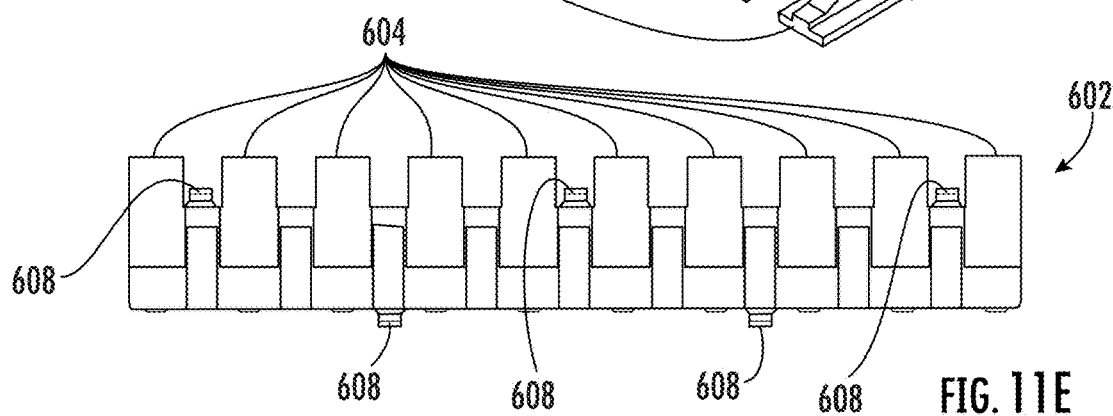
FIG. 11E is a top view of the retaining member.
Figure 11F:
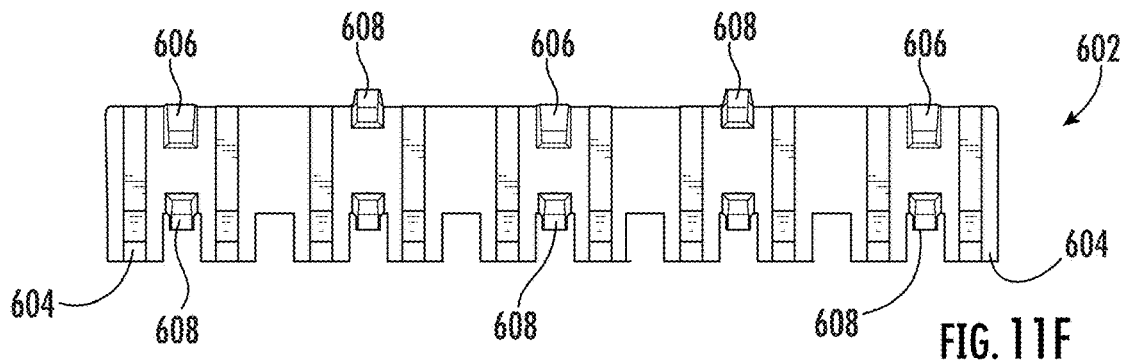
FIG. 11F is a bottom view of the retaining member.
Figure 11G:
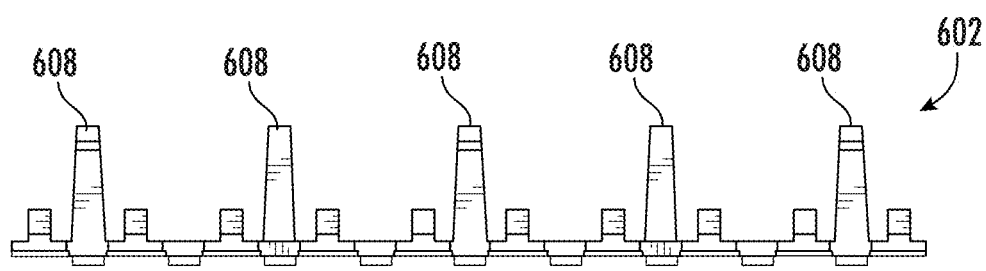
FIG. 11G is a front plan view of the retaining member.
Figure 11H:
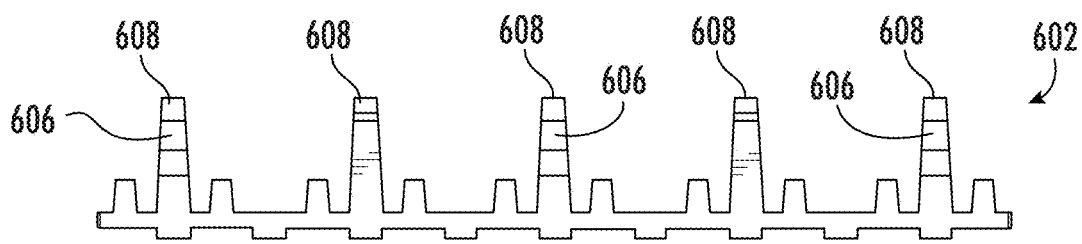
FIG. 11H is a rear plan view of the retaining member.
Figure 11I:
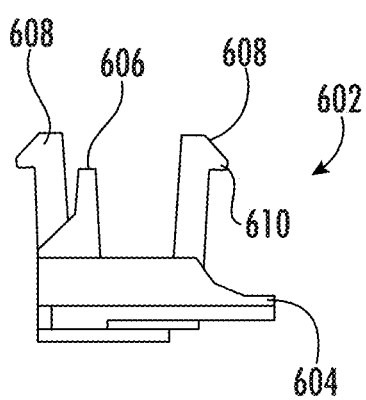
FIG. 11I is a left side view of the retaining member.
Figure 11J:
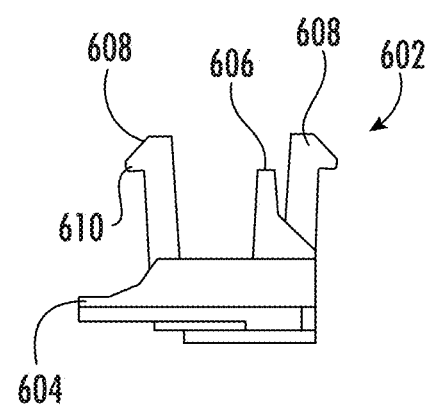
FIG. 11J is a right side view of the retaining member.

Referring to FIG. 11A, retaining member 602 is disposed on the bottom surface of lower half portion 362 of cradle 208. Referring to FIG. 11B, the retaining member 602 is shown removed from the cradle 208. As shown in FIG. 11B, the lower half portion 362 of cradle 208 includes a plurality of slots 363. When the retaining member 602 is positioned on the lower half portion 362, the alignment members 606 and retaining arms 608 are disposed in the slots 363 until a detent 610 of each retaining arm 608 reaches an end of the slot (not shown) to lock the retaining member 602 in place. When the retaining member 602 is fully seated on the lower half portion 362, the tabs 604 interact with ends 333 of connections 332, as shown in FIG. 11A. In this manner, the retaining member 602 ensures that ends 333 are maintained at their appropriate position as shown in FIGS. 8C, 8F and 8G so that when the cradle 208 is disposed in the enclosure 204 the electrical connections 332 of cradle 208 do not make contact with the electrical connections 330 of the enclosure 204.

It is to be appreciated that the switchboard case of the present disclosure may be used for mounting devices including, but not limited to, Programmable Logic Controllers ("PLC's"), Remote Terminal Units ("RTU's"), electric power meters, panel meters, protective relays, fault recorders, phase measurement units, serial switches, smart input/output devices and other devices which are coupled with power distribution networks to manage and control the distribution and consumption of electrical power, in switchboard panels. As will be understood by those skilled in the art, the switchboard case 202 is mounted on the switchboard panel (not shown), and it is wired to the service located behind the switchboard panel. A device, such as a switchboard meter or power relay, is mounted in the switchboard cradle 208, and then the switchboard cradle 208 is slid into the switchboard enclosure 204. A device may be disposed in the cradle 208 and wired to the series of contact strips 332 on the bottom of the cradle 208 to sense and measure parameters of the electrical distribution system. Furthermore, the device may be electrical coupled to the various connectors in the connection frame 368 as described above. In this manner, the cradle 208 acts as an adapter for enabling at least the afore-mentioned devices to be mounted in a switchboard case 202.

It is to be appreciated that the various features shown and described are interchangeable, that is a feature shown in one embodiment may be incorporated into another embodiment.

While non-limiting embodiments are disclosed herein, many variations are possible which remain within the concept and scope of the present disclosure. Such variations would become clear to one of ordinary skill in the art after inspection of the specification, drawings and claims herein. The present disclosure therefore is not to be restricted except within the spirit and scope of the appended claims.

Furthermore, although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term ' ' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. § 112, sixth paragraph.

What is claimed is:
1. A metering assembly comprising:
an enclosure having at least one first electrical connection disposed on an inner surface thereof, the at least one electrical connection coupled to at least one second electrical connection disposed on an outer surface of the enclosure, the at least one second electrical connection configured to be coupled to an electrical power distribution service;
a cradle configured for housing an intelligent electronic device (IED) and for being disposed in the enclosure, the cradle including at least one third electrical connection for coupling to the at least one first electrical connection, the at least one third electrical connection being coupled to at least one component of the IED; and
a cover configured to couple to an open end of the enclosure to enclose the IED in the enclosure,
wherein the enclosure further comprises a plate extending from the periphery of an open end of the enclosure in a perpendicular manner, the plate including a first surface and a second surface, the first surface of the plate includes a channel that surrounds the opening to the enclosure and the cover further comprises a corresponding lip configured on an inner surface of the cover so when the cover is placed on the plate the lip is disposed in the channel, wherein a gasket is disposed in the channel so when the cover is mounted on the plate, the gasket is compressed between the channel and the corresponding lip forming a water-tight seal preventing water or any other substance from entering the enclosure.

2. The metering assembly of claim 1, wherein the IED is at least one of a Programmable Logic Controller (PLC), a Remote Terminal Units (RTU), an electric power meter, a panel meter, a protective relay, a fault recorder, a phase measurement unit, a serial switch, and a smart input/output device.

3. The metering assembly of claim 1, further comprising a connection paddle configured to be disposed between the enclosure and the cradle for electrically coupling the at least one first electrical connection to the at least one third electrical connection.

4. The metering assembly of claim 3, wherein the connection paddle includes a pivoting handle, wherein the pivoting handle is configured to extend beyond a plane of the enclosure when disposed in the enclosure to facilitate removal.

5. The metering assembly of claim 3, wherein the connection paddle includes at least one grasping aperture configured to receive at least one member to grasp the connection paddle to facilitate removal of the connection paddle when disposed in the enclosure.

6. The metering assembly of claim 1, wherein the cradle further comprises at least one gripping member to facilitate removal of the cradle from the enclosure.

7. The metering assembly of claim 1, wherein the second surface of the plate is configured to make contact and secure the enclosure to a panel after the enclosure is disposed in a cutout of the panel, the second surface includes a channel configured to receive a gasket that prevents water from reaching the enclosure when secured to the panel.

8. The metering assembly of claim 1, wherein the cover further includes a one-button release mechanism to facilitate removing the cover from the enclosure.

9. The metering assembly of claim 8, wherein the cover further comprising a sealing mechanism to prevent access to the IED disposed in the enclosure and to indicate tampering.

10. The metering assembly of claim 1, further comprising a retaining member disposed on the cradle and configured to maintain the at least one third electrical connection of the cradle at an appropriate position so that when the cradle is disposed in the enclosure the at least one third electrical connection of cradle does not make contact with the at least one first electrical connection of the enclosure.

11. A metering assembly comprising:
an enclosure having at least one first electrical connection disposed on an inner surface thereof, the at least one electrical connection coupled to at least one second electrical connection disposed on an outer surface of the enclosure, the at least one second electrical connection configured to be coupled to an electrical power distribution service;
a cradle configured for housing an intelligent electronic device (IED) and for being disposed in the enclosure, the cradle including at least one third electrical connection for coupling to the at least one first electrical connection, the at least one third electrical connection being coupled to at least one component of the IED; and
a cover configured to couple to an open end of the enclosure to enclose the IED in the enclosure,
wherein the cover further includes a one-button release mechanism to facilitate removing the cover from the enclosure.

12. The metering assembly of claim 11, wherein the enclosure further comprises a plate extending from the periphery of an open end of the enclosure including a first surface and a second surface, the second surface of the plate configured to make contact and secure the enclosure to a panel after the enclosure is disposed in a cutout of the panel, the first surface including a retaining member configured to receive a latch of the one-button release mechanism to secure the cover to the enclosure.

13. The metering assembly of claim 12, wherein the one-button release mechanism is coupled to the cover such that, upon actuating of a button portion of the one-button release mechanism, the latch pivots away from the retaining member to enable removal of the cover from the enclosure.

14. The metering assembly of claim 11, further comprising a sealing mechanism to prevent access to the IED disposed in the enclosure and to indicate tampering.

15. The metering assembly of claim 14, wherein the enclosure further comprises a plate extending from the periphery of an open end of the enclosure including a first surface and a second surface, the sealing mechanism includes at least one semi-circular member extending from the first surface and at least two semi-circular members extending from an outer surface of the cover, each semi-circular member including an aperture, when the cover is disposed over the plate, the at least one semi-circular member aligns with the at least two semi-circular members enabling a wire seal to be disposed through the apertures of the semi-circular members thereby sealing the cover to the enclosure.

16. The metering assembly of claim 11, wherein the IED is at least one of a Programmable Logic Controller (PLC), a Remote Terminal Units (RTU), an electric power meter, a panel meter, a protective relay, a fault recorder, a phase measurement unit, a serial switch, and a smart input/output device.

17. A metering assembly comprising:
an enclosure having at least one first electrical connection disposed on an inner surface thereof, the at least one electrical connection coupled to at least one second electrical connection disposed on an outer surface of the enclosure, the at least one second electrical connection configured to be coupled to an electrical power distribution service;
a cradle configured for housing an intelligent electronic device (IED) and for being disposed in the enclosure, the cradle including at least one third electrical connection for coupling to the at least one first electrical connection, the at least one third electrical connection being coupled to at least one component of the IED; and
a cover configured to couple to an open end of the enclosure to enclose the IED in the enclosure,
wherein the enclosure further comprises a plate extending from the periphery of an open end of the enclosure in a perpendicular manner, the plate including a first surface and a second surface, the first surface of the plate includes a channel that surrounds the opening to the enclosure and the cover further comprises a corresponding lip configured on an inner surface of the cover so when the cover is placed on the plate the lip is disposed in the channel,
wherein the enclosure further comprises at least one mounting bracket coupled to a side wall of the enclosure, the at least one mounting bracket configured to receive a screw that makes contact with a rear surface of a panel after the enclosure is disposed in a cutout of the panel causing the at least one mounting bracket and the enclosure to move away from the rear surface of the panel securing the plate to the opposite surface of the panel.

18. The metering assembly of claim 17, wherein the second surface of the plate is configured to make contact and secure the enclosure to the panel after the enclosure is disposed in the cutout of the panel, the second surface includes a channel configured to receive a gasket that prevents water from reaching the enclosure when secured to the panel.

19. A metering assembly comprising:
an enclosure having at least one first electrical connection disposed on an inner surface thereof, the at least one electrical connection coupled to at least one second electrical connection disposed on an outer surface of the enclosure, the at least one second electrical connection configured to be coupled to an electrical power distribution service;
a cradle configured for housing an intelligent electronic device (IED) and for being disposed in the enclosure, the cradle including at least one third electrical connection for coupling to the at least one first electrical connection, the at least one third electrical connection being coupled to at least one component of the IED;
a cover configured to couple to an open end of the enclosure to enclose the IED in the enclosure; and
a plate extending from the periphery of an open end of the enclosure including a first surface and a second surface, the first surface of the plate includes a channel that surrounds the opening to the enclosure and the cover further comprises a corresponding lip configured on an inner surface of the cover so when the cover is placed on the plate the lip is disposed in the channel, wherein a gasket is disposed in the channel so when the cover is mounted on the plate, the gasket is compressed between the channel and the corresponding lip forming a water-tight seal preventing water or any other substance from entering the enclosure,
wherein the cover includes a first draining channel disposed on a lower portion of the cover and the plate includes a second draining channel disposed on a lower portion of the plate, the first draining channel aligns with the second draining channel such that any condensation formed on an inner surface of the cover collects at the lower portion of the cover and drains through the first and second draining channels.

\* \* \* \* \*